(12) United States Patent
Park et al.

(10) Patent No.: US 9,722,186 B2
(45) Date of Patent: Aug. 1, 2017

(54) COMPOUND FOR ORGANIC OPTOELECTRONIC DEVICE, ORGANIC LIGHT EMITTING DIODE COMPRISING SAME, AND DISPLAY COMPRISING ORGANIC LIGHT EMITTING DIODE

(71) Applicant: SAMSUNG SDI CO., LTD., Yongin-si, Gyeonggi-do (KR)

(72) Inventors: Moo-Jin Park, Suwon-si (KR);
Eun-Sun Yu, Suwon-si (KR);
Mi-Young Chae, Suwon-si (KR);
Chang-Woo Kim, Suwon-si (KR);
Hyung-Sun Kim, Suwon-si (KR);
Ho-Jae Lee, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 307 days.

(21) Appl. No.: 14/669,511

(22) Filed: Mar. 26, 2015

(65) Prior Publication Data

US 2015/0200372 A1   Jul. 16, 2015

Related U.S. Application Data

(63) Continuation of application No. PCT/KR2013/004653, filed on May 28, 2013.

(30) Foreign Application Priority Data

Oct. 8, 2012 (KR) .................. 10-2012-0111344

(51) Int. Cl.
*H01L 51/00* (2006.01)
*C09K 11/06* (2006.01)
(Continued)

(52) U.S. Cl.
CPC .......... *H01L 51/0067* (2013.01); *C09K 11/06* (2013.01); *H01L 51/0052* (2013.01);
(Continued)

(58) Field of Classification Search
CPC ............ C09K 11/06; C09K 2211/1007; C09K 2211/1011; C09K 2211/1029;
(Continued)

(56) References Cited

U.S. PATENT DOCUMENTS 7,014,925 B2    3/2006  Thoms
7,838,129 B2 *  11/2010 Cho .................... C07D 221/20
                                                    252/301.16
2010/0219406 A1  9/2010 Kahle et al.

FOREIGN PATENT DOCUMENTS

JP   2011-501787 A   1/2011
JP     4642849 B2    3/2011
(Continued)

*Primary Examiner* — Satya Sastri
(74) *Attorney, Agent, or Firm* — Lee & Morse, P.C.

(57) ABSTRACT

A compound for an organic optoelectronic device, an organic light emitting diode including the compound, and a display device including the organic light emitting diode are provided and the compound in which moieties represented by Chemical Formulae I and II that are sequentially linked is provided and thus, the organic light emitting diode has excellent life-span characteristics due to excellent electrochemical and thermal stability and high luminous efficiency at a low driving voltage.

14 Claims, 1 Drawing Sheet

(51) Int. Cl.
*H05B 33/10* (2006.01)
*H01L 51/50* (2006.01)

(52) U.S. Cl.
CPC ...... *H01L 51/0072* (2013.01); *H01L 51/0073* (2013.01); *H01L 51/0074* (2013.01); *H01L 51/0094* (2013.01); *H05B 33/10* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(58) Field of Classification Search
CPC .... C09K 2211/1044; C09K 2211/1059; C09K 2211/1088; C09K 2211/1092; H01L 51/0052; H01L 51/0067; H01L 51/0072; H01L 51/0073; H01L 51/0074; H01L 51/0094; H01L 51/5012; H01L 51/5016; H01L 51/5056; H01L 51/5072; H01L 51/5088; H01L 51/5092; H01L 51/5096; H05B 33/10

See application file for complete search history.

(56) References Cited

FOREIGN PATENT DOCUMENTS

| | | | |
|---|---|---|---|
| KR | 10-2006-0051620 A | 5/2006 | |
| KR | 10-0642995 B1 | 11/2006 | |
| KR | 10-2011-0049244 A | 5/2011 | |
| KR | 10-2011-0053114 A | 5/2011 | |
| KR | 10-2011-0102055 A | 9/2011 | |
| KR | 20110102055 A * | 9/2011 | |
| KR | 10-2011-0107682 A | 10/2011 | |
| KR | 10-2011-0110508 A | 10/2011 | |
| KR | 10-2011-0111093 A | 10/2011 | |
| KR | 20110107682 A * | 10/2011 | |
| KR | 20110110508 A * | 10/2011 | ............ C09K 11/06 |
| KR | 10-2012-0015883 A | 2/2012 | |
| KR | 10-1120892 B1 | 2/2012 | |
| KR | 10-2012-0021215 A | 3/2012 | |
| KR | 10-2012-0038032 A | 4/2012 | |
| WO | WO 2008/123189 A1 | 10/2008 | |
| WO | WO 2009/047147 A1 | 4/2009 | |
| WO | WO 2011/059271 A2 | 5/2011 | |

\* cited by examiner

COMPOUND FOR ORGANIC OPTOELECTRONIC DEVICE, ORGANIC LIGHT EMITTING DIODE COMPRISING SAME, AND DISPLAY COMPRISING ORGANIC LIGHT EMITTING DIODE

CROSS-REFERENCE TO RELATED APPLICATIONS

This application is a continuation of pending International Application No. PCT/KR2013/004653, entitled "Compound for Organic Optoelectronic Device, Organic Light Emitting Diode Comprising Same, and Display Comprising Organic Light Emitting Diode," which was filed on May 28, 2013, the entire contents of which are hereby incorporated by reference.

Korean Patent Application No. 10-2012-0111344, filed on Oct. 8, 2012, in the Korean Intellectual Property Office, and Korean Patent Application No. 10-2013-0060518 filed on May 28, 2013, in the Korean Intellectual Property Office, and entitled: "Compound for Organic Optoelectronic Device, Organic Light Emitting Diode Comprising Same, and Display Comprising Organic Light Emitting Diode," are incorporated by reference herein in their entirety.

BACKGROUND

1. Field

A compound for an organic optoelectronic device having excellent life-span, efficiency, electrochemical stability, and thermal stability, an organic light emitting diode including the compound, and a display device including the organic light emitting diode are disclosed.

2. Description of the Related Art

An organic optoelectronic device is a device requiring a charge exchange between an electrode and an organic material by using holes or electrons.

An organic optoelectronic device may be classified as follows in accordance with its driving principles. A first organic optoelectronic device is an electronic device driven as follows: excitons are generated in an organic material layer by photons from an external light source; the excitons are separated into electrons and holes; and the electrons and holes are transferred to different electrodes as a current source (voltage source).

A second organic optoelectronic device is an electronic device driven as follows: a voltage or a current is applied to at least two electrodes to inject holes and/or electrons into an organic material semiconductor positioned at an interface of the electrodes, and the device is driven by the injected electrons and holes.

Examples of an organic optoelectronic device include an organic photoelectric device, an organic light emitting diode, an organic solar cell, an organic photo conductor drum, an organic transistor, and the like, which require a hole injecting or transport material, an electron injecting or transport material, or a light emitting material.

Particularly, an organic light emitting diode (OLED) has recently drawn attention due to an increase in demand for flat panel displays. In general, organic light emission refers to conversion of electrical energy into photo-energy.

Such an organic light emitting diode converts electrical energy into light by applying current to an organic light emitting material. It has a structure in which a functional organic material layer is interposed between an anode and a cathode. The organic material layer includes a multi-layer including different materials, for example a hole injection layer (HIL), a hole transport layer (HTL), an emission layer, an electron transport layer (ETL), and an electron injection layer (EIL), in order to improve efficiency and stability of an organic light emitting diode.

In such an organic light emitting diode, when a voltage is applied between an anode and a cathode, holes from the anode and electrons from the cathode are injected to an organic material layer and recombined to generate excitons having high energy. The generated excitons generate light having certain wavelengths while shifting to a ground state.

Recently, it has become known that a phosphorescent light emitting material may be used for a light emitting material of an organic light emitting diode in addition to the fluorescent light emitting material. Such a phosphorescent material emits lights by transporting the electrons from a ground state to an exited state, non-radiance transiting of a single exciton to a triplet exciton through intersystem crossing, and transiting a triplet exciton to a ground state to emit light.

As described above, in an organic light emitting diode, an organic material layer includes a light emitting material and a charge transport material, for example a hole injection material, a hole transport material, an electron transport material, an electron injection material, and the like.

The light emitting material is classified as blue, green, and red light emitting materials according to emitted colors, and yellow and orange light emitting materials to emit colors approaching natural colors.

When one material is used as a light emitting material, a maximum light emitting wavelength is shifted to a long wavelength or color purity decreases because of interactions between molecules, or device efficiency decreases because of a light emitting quenching effect. Therefore, a host/dopant system is included as a light emitting material in order to improve color purity and increase luminous efficiency and stability through energy transfer.

In order to implement excellent performance of an organic light emitting diode, a material constituting an organic material layer, for example a hole injection material, a hole transport material, a light emitting material, an electron transport material, an electron injection material, and a light emitting material such as a host and/or a dopant, should be stable and have good efficiency. However, development of an organic material layer forming material for an organic light emitting diode has thus far not been satisfactory and thus there is a need for a novel material. This material development is also required for other organic optoelectronic devices.

The low molecular organic light emitting diode is manufactured as a thin film in a vacuum deposition method and can have good efficiency and life-span performance. A polymer organic light emitting diode is manufactured in an inkjet or spin coating method has an advantage of low initial cost and being large-sized.

Both low molecular organic light emitting and polymer organic light emitting diodes have an advantage of self-light emitting, high speed response, wide viewing angle, ultra-thin, high image quality, durability, large driving temperature range, and the like. In particular, they have good visibility due to self-light emitting characteristics compared with a conventional LCD (liquid crystal display) and have an advantage of decreasing thickness and weight of LCD up to a third, because they do not need a backlight.

In addition, since they have a response speed 1000 time faster microsecond unit than LCD, they can realize a perfect motion picture without after-image. Based on these advantages, they have been remarkably developed to have 80 times efficiency and more than 100 times life-span since they come out for the first time in the late 1980s. Recently, they keep being rapidly larger such as a 40-inch organic light emitting diode panel.

They are simultaneously required to have improved luminous efficiency and life-span in order to be larger. Herein, their luminous efficiency need smooth combination between holes and electrons in an emission layer. However, since an organic material in general has slower electron mobility than hole mobility, it has a drawback of inefficient combination between holes and electrons. Accordingly, while increasing electron injection and mobility from a cathode and simultaneously preventing movement of holes is required.

In order to improve life-span, a material crystallization caused by Joule heats generated during device operating is required to be prevented. Accordingly, there has been a strong need for an organic compound having excellent electron injection and mobility, and high electrochemical stability.

SUMMARY

A compound for an organic optoelectronic device that may act as hole injection and transport or electron injection and transport material, and also act as a light emitting host along with an appropriate dopant is provided.

An organic light emitting diode having excellent life-span, efficiency, driving voltage, electrochemical stability and thermal stability and a display device including the same are provided.

In one embodiment of the present invention, a compound for an organic optoelectronic device including moieties represented by the following Chemical Formula I and Chemical Formula II that are sequentially linked is provided.

[Chemical Formula I]

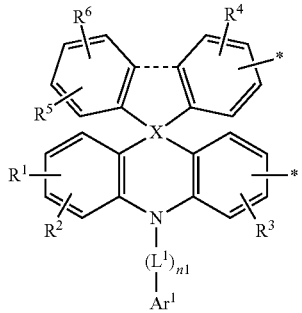

[Chemical Formula II]

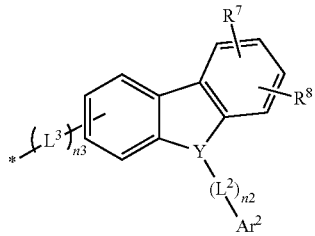

In the Chemical Formula I and Chemical Formula II,
--- indicates a single bond or no bond,
* indicates a binding point of the Chemical Formula I and the Chemical Formula II wherein the Chemical Formula I is linked to the Chemical Formula II at one point of the two binding points, X is C or Si,
Y is N, O or S,
$R^1$ to $R^8$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof, $L^1$ to $L^3$ are independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are independently integers of 0 to 3, $Ar^1$ and $Ar^2$ are independently a substituted or unsubstituted C6 to C30 aryl group or a substituted or unsubstituted C2 to C30 heteroaryl group, and at least one of $Ar^1$, $Ar^2$ and $R^8$ is a substituted or unsubstituted C2 to C30 heteroaryl group having electron characteristics.

According to another embodiment of the present invention, an organic light emitting diode includes an anode, and at least one or more organic thin layer between the anode and the cathode, wherein at least one of the organic thin layers includes the compound for an organic optoelectronic device.

According to yet another embodiment of the present invention, a display device including the organic light emitting diode is provided.

An organic optoelectronic device having high efficiency long life-span may be realized.

BRIEF DESCRIPTION OF THE DRAWINGS

Features will be apparent to those of skill in the art by describing in detail exemplary embodiments with reference to the attached drawings in which.

Figure 1:
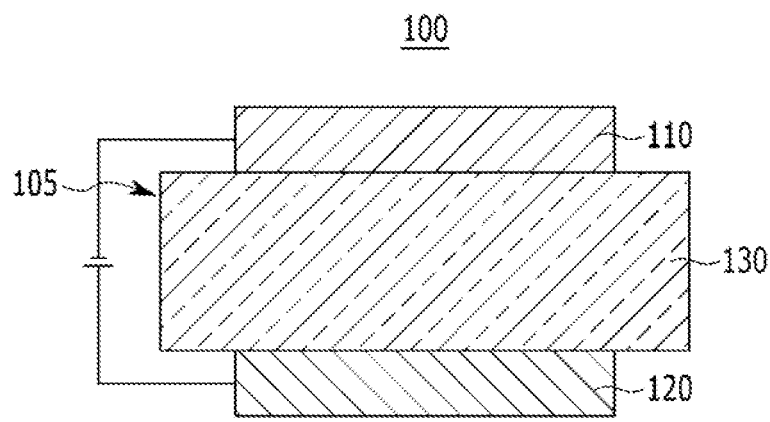
FIGS. 1 and 2 illustrate cross-sectional views showing organic light emitting diodes according to one embodiment.

<Description of Reference Numerals Indicating Primary Elements in the Drawings>

100: organic light emitting diode    110: cathode
120: anode    105: organic thin layer
130: emission layer    140: hole transport layer (HTL)
230: emission layer + electron transport layer (ETL)

DETAILED DESCRIPTION

Hereinafter, embodiments of the present invention are described in detail. However, these embodiments are exemplary, and do not limit the present invention, and the present invention is defined by the scope of the claims which will be described later.

In the present specification, when specific definition is not otherwise provided, "substituted" refers to one substituted with deuterium, a halogen, a hydroxy group, an amino group, a substituted or unsubstituted C1 to C30 amine group, a nitro group, a substituted or unsubstituted C3 to C40 silyl group, C1 to C30 alkyl group, C1 to C10 alkylsilyl group, C3 to C30 cycloalkyl group, C6 to C30 aryl group, C1 to C20 alkoxy group, a fluoro group, a C1 to C10 trifluoroalkyl group such as trifluoromethyl group and the like, or a cyano group, instead of at least one hydrogen of a substituent or a compound.

Two substitutents of the substituted halogen, hydroxy group, amino group, substituted or unsubstituted C1 to C20 amine group, nitro group, substituted or unsubstituted C3 to C40 silyl group, C1 to C30 alkyl group, C1 to C10 alkylsilyl group, C3 to C30 cycloalkyl group, C6 to C30 aryl group, C1 to C20 alkoxy group, fluoro group, C1 to C10 trifluoroalkyl group such as trifluoromethyl group and the like or cyano group may be fused with each other to form a ring. Specifically, the substituted C6 to C30 aryl group may be fused with another adjacent substituted C6 to C30 aryl group to form a substituted or unsubstituted fluorene ring.

In the present specification, when specific definition is not otherwise provided, "hetero" refers to one including 1 to 3 hetero atoms selected from the group consisting of N, O, S, and P, and remaining carbons in one compound or substituent.

In the present specification, when a definition is not otherwise provided, "alkyl group" refers to an aliphatic hydrocarbon group. The alkyl group may be "a saturated alkyl group" without a double bond or a triple bond.

The alkyl group may be a branched, linear, or cyclic alkyl group.

The "alkenyl group" refers to a functional group consisting of at least one carbon-carbon double bond of at least two carbons, and the "alkynylene group" refers to a functional group consisting of at least one carbon-carbon triple bond of at least two carbons.

The alkyl group may be a C1 to C20 alkyl group. More specifically, the alkyl group may be a C1 to C10 alkyl group or a C1 to C6 alkyl group.

For example, a C1 to C4 alkyl group may have 1 to 4 carbon atoms and may be selected from the group consisting of methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

"Aromatic group" refers to a cyclic functional group where all elements have p-orbitals, and these p-orbitals forms conjugation. Specific examples are aryl group and a heteroaryl group.

"Aryl group" refers to a substituent including all element of the cycle having p-orbitals which form conjugation, and may be monocyclic, polycyclic or fused ring polycyclic (i.e., rings sharing adjacent pairs of carbon atoms) functional group.

"Heteroaryl group" refers to an aryl group including 1 to 3 hetero atoms selected from the group consisting of N, O, S, P, and Si and remaining carbons. The heteroaryl group may be a fused ring where each ring may include the 1 to 3 heteroatoms.

In the present specification, the carbazole-based derivative may refer to a substituted structure where a nitrogen atom of a substituted or unsubstituted carbazolyl group is substituted with a hetero atom except nitrogen, or carbon. Specific examples may be dibenzofuran (dibenzofuranyl group), dibenzothiophene (dibenzothiophenyl group), fluorene (fluorenyl group), and the like. For specific examples, the heteroatom may include —O—, —S—, —S(O)$_2$— or —NR'—.

In the present specification, hole characteristics refer to characteristics that holes formed in the anode is easily injected into the emission layer and transported in the emission layer due to conductive characteristics according to HOMO level. More specifically, it is similar to electron-repelling characteristics.

Electron characteristics refer to characteristics that electron formed in the cathode is easily injected into the emission layer and transported in the emission layer due to conductive characteristics according to LUMO level. More specifically, it is similar to electron-withdrawing characteristics.

A compound for an organic optoelectronic device according to one embodiment of the present invention has a structure including a fused ring core and optionally various substituents.

The core structure may be used as a light emitting material, a hole injection material or a hole transport material of an organic optoelectronic device. Particularly, it may be suitable as a hole injection material or a hole transport material.

The compound for an organic optoelectronic device includes a core part and various substituents for a substitutent for substituting the core part and thus may have various energy bandgaps.

The compound may have an appropriate energy level depending on the substituents and thus, may fortify hole transport capability or electron transport capability of an organic optoelectronic device and bring about excellent effects on efficiency and driving voltage and also, have excellent electrochemical and thermal stability and thus, improve life-span characteristics during the operation of the organic optoelectronic device.

According to one embodiment of the present invention, the compound for an organic optoelectronic device includes moieties represented by the following Chemical Formula I and Chemical Formula II that are sequentially linked.

[Chemical Formula I]

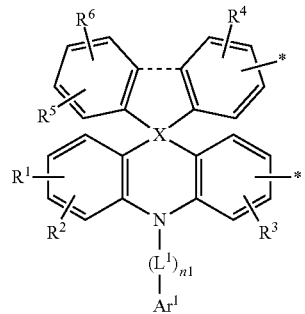

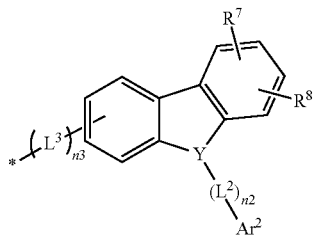

[Chemical Formula II]

In the Chemical Formula I and Chemical Formula II,
--- indicates a single bond or no bond,
* indicates a binding point of the Chemical Formula I and the Chemical Formula II wherein the Chemical Formula I is linked to the Chemical Formula II at one point of the two binding points X is C or Si,
Y is N, O or S,
$R^1$ to $R^8$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof, $L^1$ to $L^3$ are independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are independently integers of 0 to 3,
$Ar^1$ and $Ar^2$ are independently a substituted or unsubstituted C6 to C30 aryl group or a substituted or unsubstituted C2 to C30 heteroaryl group, and
at least one of $Ar^1$, $Ar^2$ and $R^8$ is a substituted or unsubstituted C2 to C30 heteroaryl group having electron characteristics.

The moieties represented by the Chemical Formula I and Chemical Formula II are linked to each other increases solubility of the compound, and easily control energy level according to a binding position of a substituent.

Specifically, the compound for an organic photoelectric device wherein the moieties represented by the Chemical Formula I and Chemical Formula II are sequentially linked may be represented by one of the following Chemical Formulae 1 to 4.

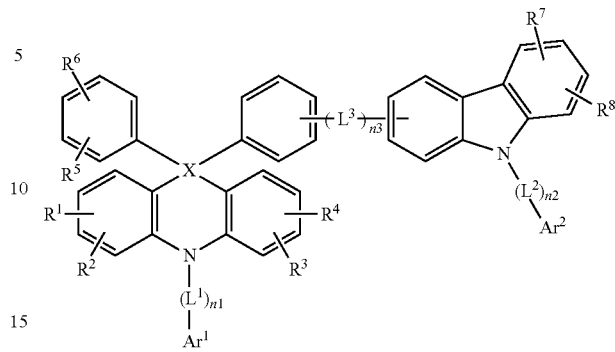

[Chemical Formula 1]

[Chemical Formula 2]

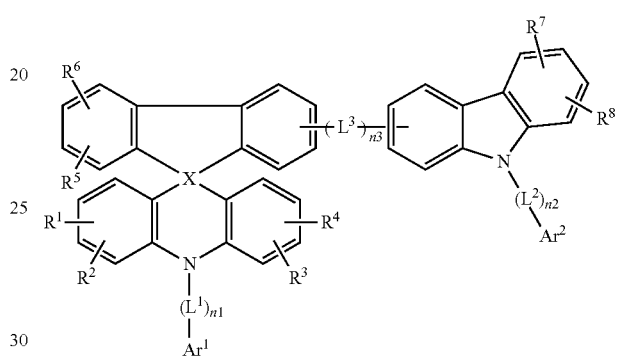

[Chemical Formula 3]

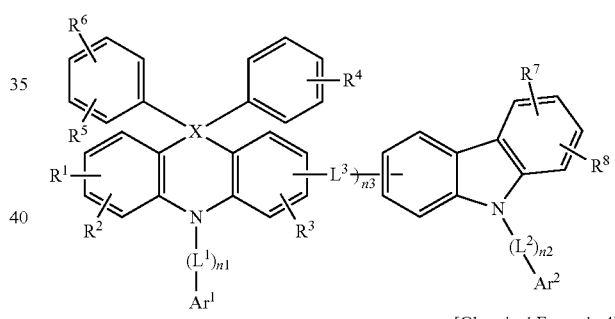

[Chemical Formula 4]

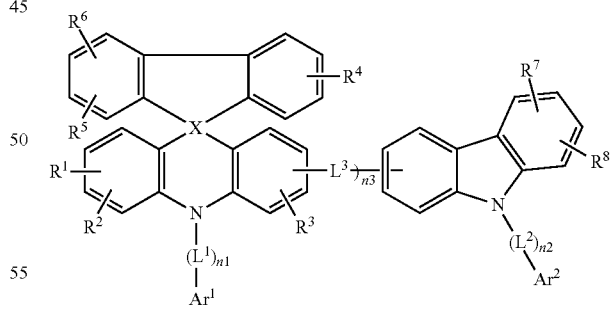

In the Chemical Formula 1 to Chemical Formula 4,
X is C or Si,
Y is N, O or S,
$R^1$ to $R^8$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof, $L^1$ to $L^3$ are independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are independently integers of 0 to 3, $Ar^1$ and $Ar^2$ are independently a substituted or unsubstituted C6 to C30 aryl group or a substituted or unsubstituted C2 to C30 heteroaryl group, and at least one of $Ar^1$, $Ar^2$ and $R^8$ is a substituted or unsubstituted C2 to C30 heteroaryl group having electron characteristics.

The compound represented by the Chemical Formula 2 has high solubility and simultaneously an appropriate energy level compared with the compound represented by Chemical Formula 1 according to one embodiment of the present invention.

The compound represented by the Chemical Formula 3 has high solubility and simultaneously an appropriate energy level compared with the compound represented by Chemical Formula 1 according to one embodiment of the present invention.

The compound represented by the Chemical Formula 4 has a similar bicarbazole-like structure and thus an appropriate energy level compared with the compound represented by Chemical Formula 1 according to one embodiment of the present invention.

More specifically, the compound for an organic photoelectric device wherein the moieties represented by the Chemical Formula I and Chemical Formula II are sequentially linked may be represented by one of the following Chemical Formula 1-1 to Chemical Formula 4-3.

[Chemical Formula 1-1]

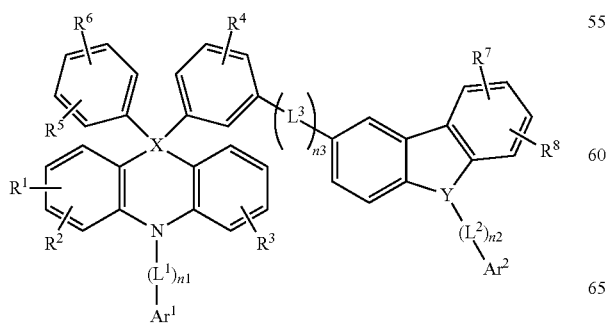

[Chemical Formula 1-2]

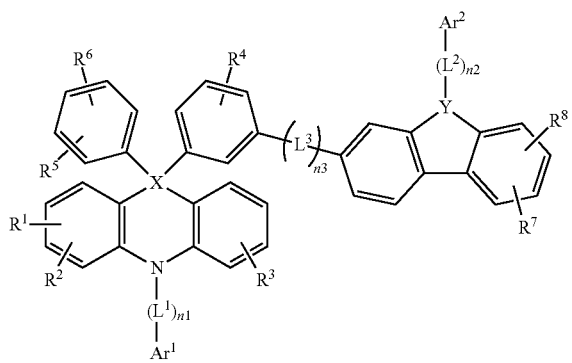

[Chemical Formula 1-3]

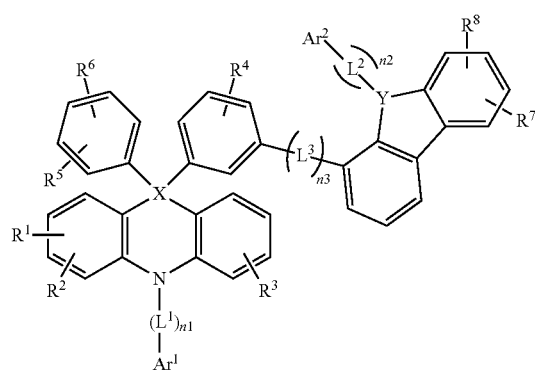

[Chemical Formula 1-4]

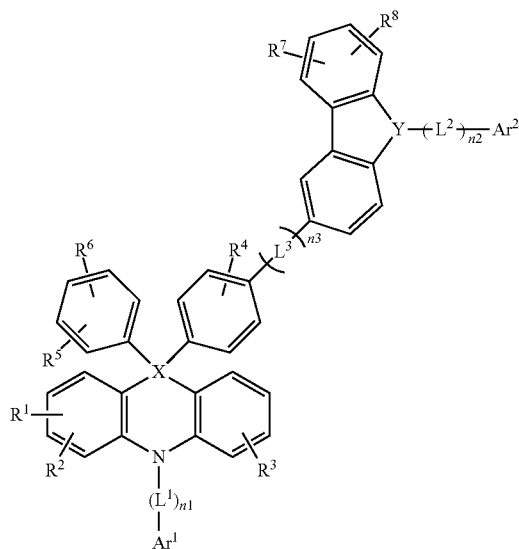

[Chemical Formula 1-5]
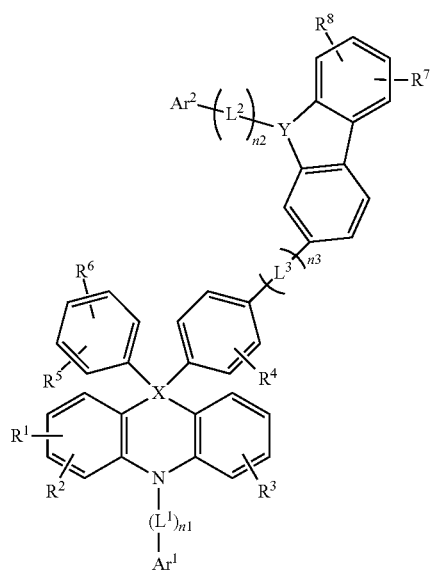
[Chemical Formula 1-6]
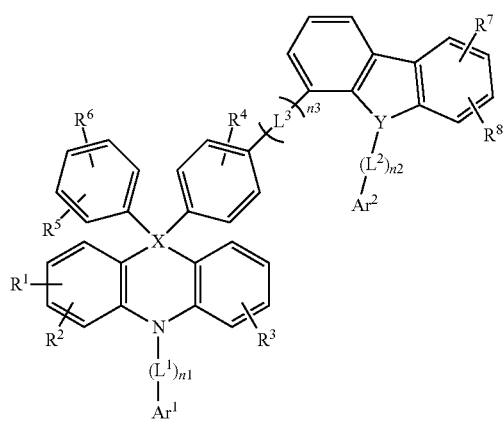
[Chemical Formula 2-1]
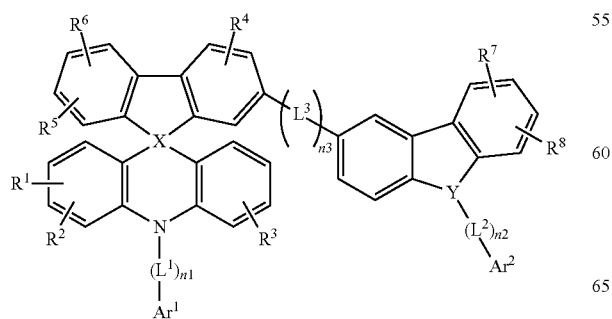
[Chemical Formula 2-2]
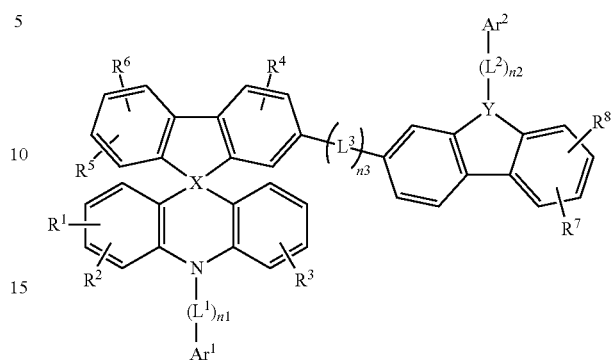
[Chemical Formula 2-3]
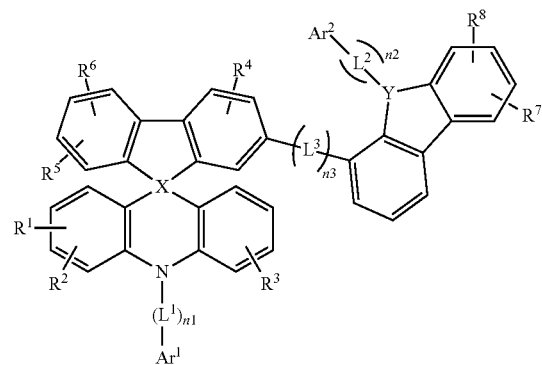
[Chemical Formula 2-4]
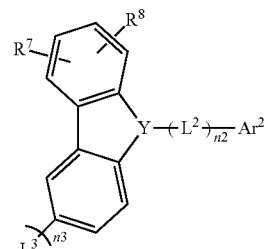

[Chemical Formula 2-5]
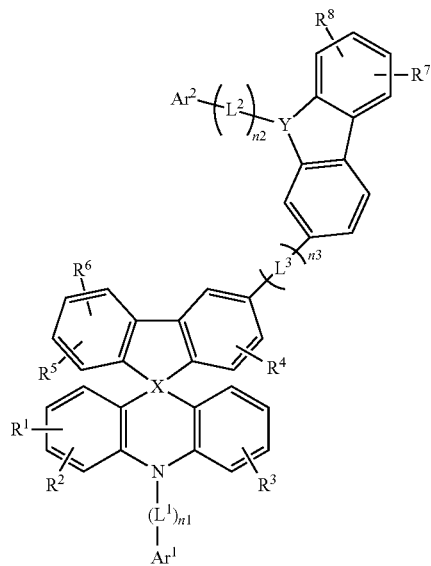
[Chemical Formula 2-6]
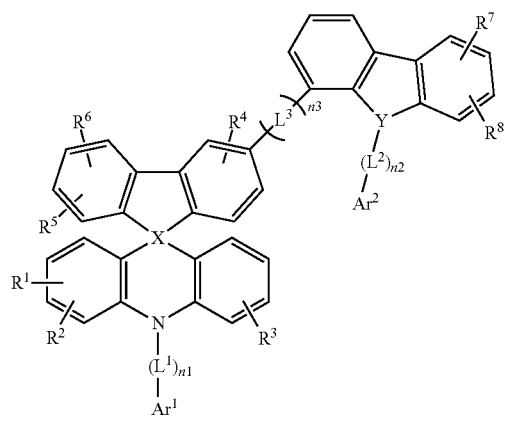
[Chemical Formula 3-1]
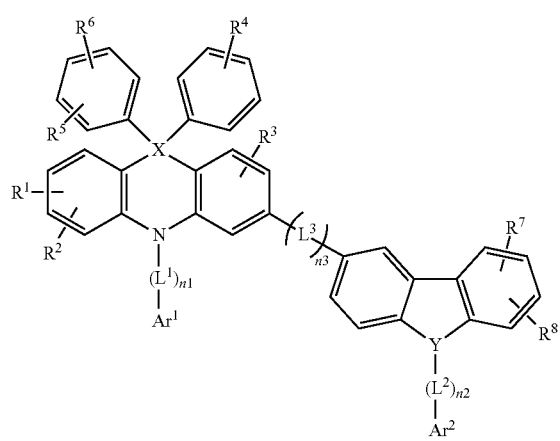
[Chemical Formula 3-2]
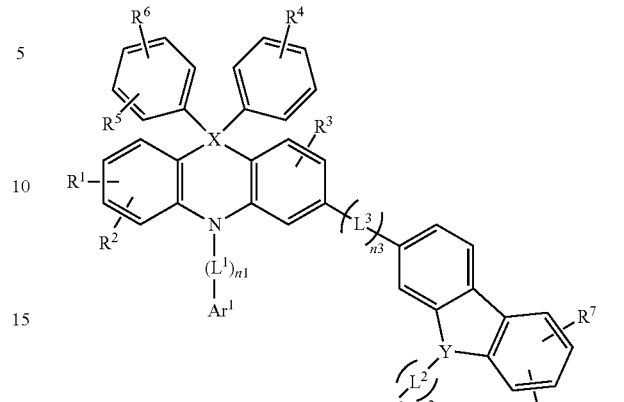
[Chemical Formula 3-3]
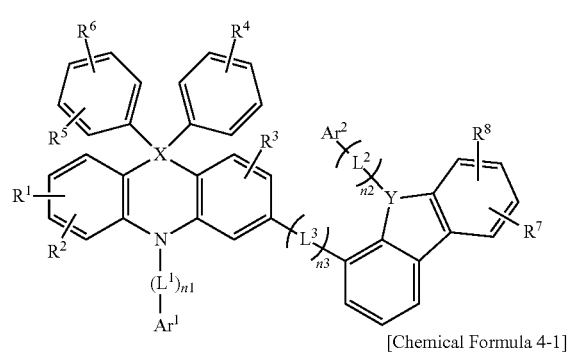
[Chemical Formula 4-1]
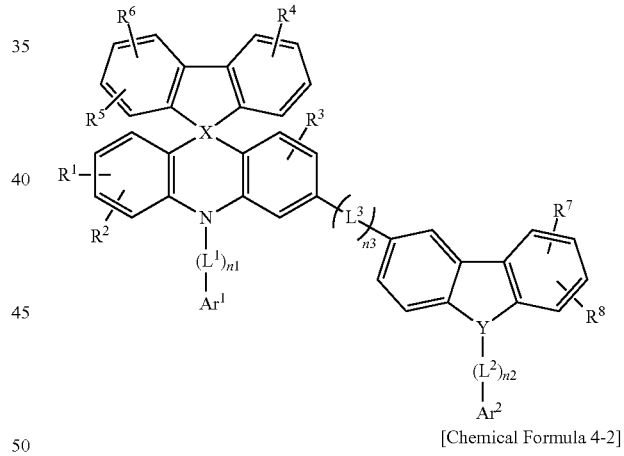
[Chemical Formula 4-2]
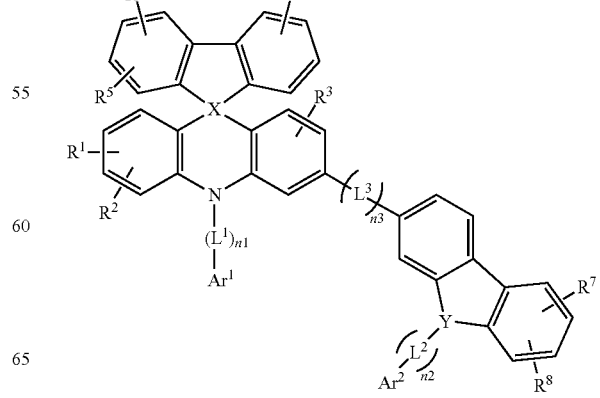

-continued

[Chemical Formula 4-3]

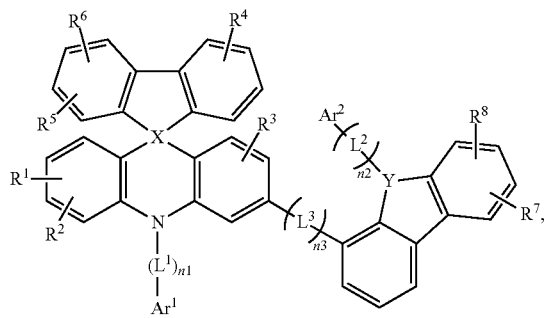

In the above Chemical Formulae 1-1 to 4-3,

X is C or Si,

Y is N, O or S, $R^1$ to $R^8$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof, $L^1$ to $L^3$ are independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are independently integers of 0 to 3, $Ar^1$ and $Ar^2$ are independently a substituted or unsubstituted C6 to C30 aryl group or a substituted or unsubstituted C2 to C30 heteroaryl group, and at least one of $Ar^1$, $Ar^2$ and $R^8$ is a substituted or unsubstituted C2 to C30 heteroaryl group having electron characteristics.

More specifically, in the various embodiments of the present invention (e.g., a compound represented by one of Chemical Formulae 1 to 4), the $Ar^1$ is a substituted or unsubstituted C2 to C30 heteroaryl group having electron characteristics, and the $Ar^2$ is a substituted or unsubstituted C6 to C30 aryl group. In this case, bipolar characteristics having separated electrons and holes characteristics, and thereby mobility of electrons and holes may be improved.

More specifically, in the various embodiments of the present invention (e.g., a compound represented by one of Chemical Formulae 1 to 4), the $Ar^2$ is a substituted or unsubstituted C2 to C30 heteroaryl group having electron characteristics, and the $Ar^1$ is a substituted or unsubstituted C6 to C30 aryl group. In this case, bipolar characteristics having separated electrons and holes characteristics, and thereby mobility of electrons and holes may be improved.

More specifically, the various embodiments of the present invention (e.g., a compound represented by one of Chemical Formulae 1 to 4), the substituted or unsubstituted C2 to C30 heteroaryl group having electron characteristics may be represented by one of the following Chemical Formulae 5 to 9, but is not limited thereto.

[Chemical Formula 5]

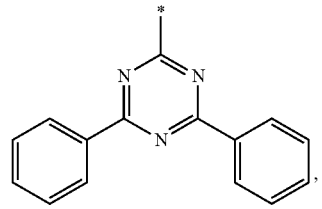

[Chemical Formula 6]

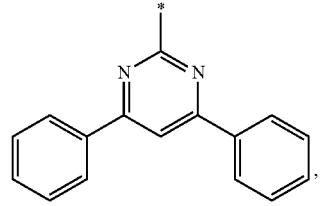

[Chemical Formula 7]

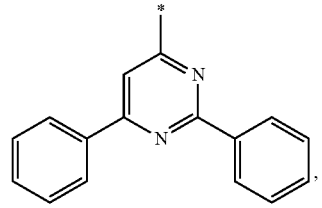

[Chemical Formula 8]

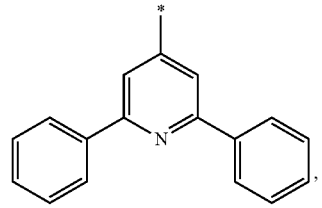

[Chemical Formula 9]

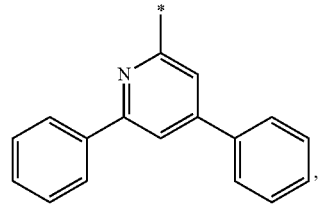

The compound has a relatively large molecular weight and thus, may be suppressed from decomposition during the deposition.

The $L^1$ to $L^3$ may be selectively adjusted to determine an entire conjugation length of the compound, and a triplet energy bandgap of the compound may be adjusted therefrom. Accordingly, characteristics of a material required of an organic photoelectric device may be realized. In addition, the triplet energy bandgap may also be adjusted by changing a bonding position of ortho, para, and meta.

Specific examples of the $L^1$ to $L^3$ may be a substituted or unsubstituted phenylene group, a substituted or unsubstituted biphenylene group, a substituted or unsubstituted terphenylene group, a substituted or unsubstituted naphthylene group, a substituted or unsubstituted anthracenylene group, a substituted or unsubstituted phenanthrylene group, a substituted or unsubstituted pyrenylene group, a substituted or unsubstituted fluorenylene group, a substituted or unsubstituted naphthacenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group. substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group and a substituted or unsubstituted phenoxazinyl group.

In addition, the compound has steric hindrance and thus, small interaction among molecules and resultantly, may be suppressed from crystallization. Thereby, a yield of manufacturing a device may be improved. In addition, life-span characteristics of the device may be improved.

Furthermore, the compound has a relatively large molecular weight and thus, may be suppressed from decomposition during the deposition.

The $Ar^1$ and $Ar^2$ are independently, a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof, but are not limited thereto.

More specifically, at least one of the $Ar^1$ and $Ar^2$ may be a substituted or unsubstituted biphenyl group.

In addition, at least one of the $Ar^1$ and $Ar^2$ may be a substituted or unsubstituted fluorenyl group.

More specifically, the substituted or unsubstituted phenyl group may be, for example, Chemical Formula S-57, and the like.

[Chemical Formula S-57]

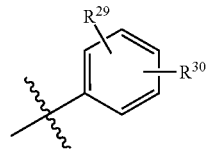

More specifically, the substituted or unsubstituted biphenyl group may be, for example, Chemical Formulae S-58, S-59 and S-60.

[Chemical Formula S-58]

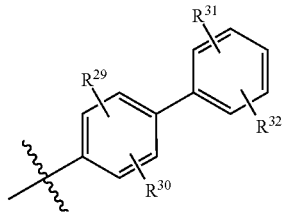

[Chemical Formula S-59]

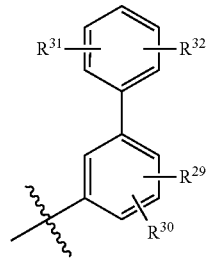

[Chemical Formula S-60]

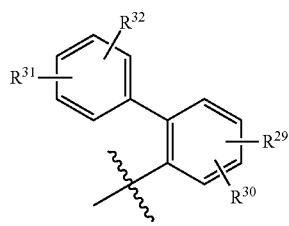

More specifically, the substituted or unsubstituted naphthyl group may be, for example, Chemical Formulae S-61 and S-62.

[Chemical Formula S-61]

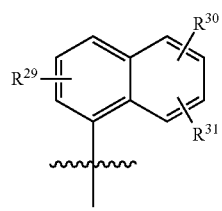

[Chemical Formula S-62]

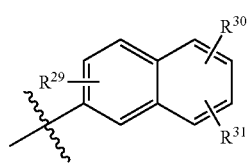

More specifically, the substituted or unsubstituted anthracenyl group may be, for example, Chemical Formulae S-63 and S-64.

[Chemical Formula S-63]

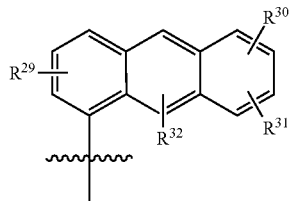

[Chemical Formula S-64]

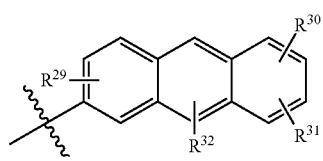

More specifically, the substituted or unsubstituted phenanthrenyl group may be, for example, Chemical Formulae S-65, S-66, S-67, S-68 and S-69.

[Chemical Formula S-65]

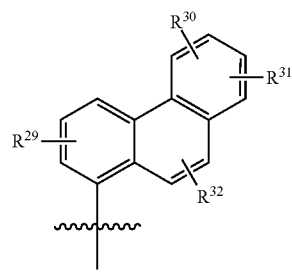

[Chemical Formula S-66]

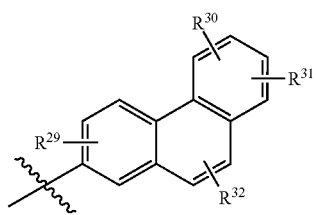

[Chemical Formula S-67]

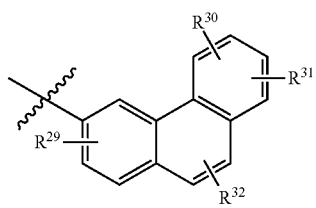

[Chemical Formula S-68]

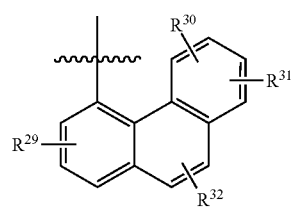

[Chemical Formula S-69]

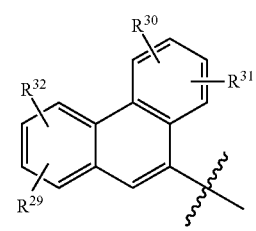

More specifically, the substituted or unsubstituted triphenyl group may be, for example, Chemical Formulae S-70 and S-71.

[Chemical Formula S-70]

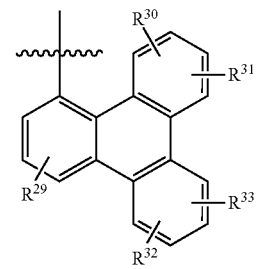

[Chemical Formula S-71]

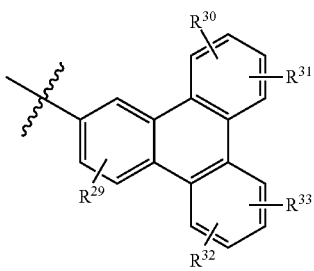

More specifically, the substituted or unsubstituted fluorenyl group may be, for example, Chemical Formulae S-72, S-73, S-74 and S-75.

[Chemical Formula S-72]

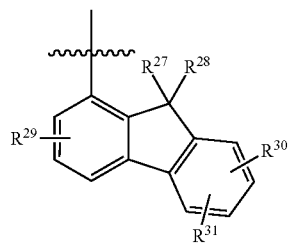

[Chemical Formula S-73]

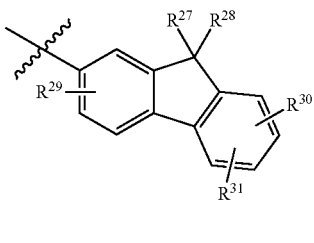

[Chemical Formula S-74]

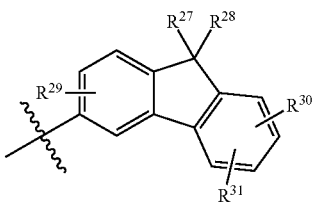

[Chemical Formula S-75]

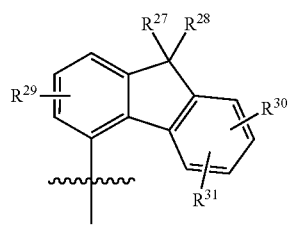

At least one of the $R^1$ to $R^8$ may be a substituted or unsubstituted C3 to C40 silyl group.

The silyl group may lower a deposit temperature during manufacture of an organic optoelectronic device and increase solubility in a solvent and thus, convert a process of manufacturing a device into a solution process.

More specifically, at least one of the $R^1$ to $R^8$ may be a substituted C3 to C40 silyl group, and the substituted silyl group may be substituted with a C1 to C10 alkyl group or C6 to C15 aryl group, instead of at least one hydrogen of the silyl group.

Specific examples of the substituted silyl group may be a trimethylsilyl group, a triphenylsilyl group, and the like.

Specific examples of the compound for an organic optoelectronic device are the same as follows, but are not limited thereto.

[A-1]

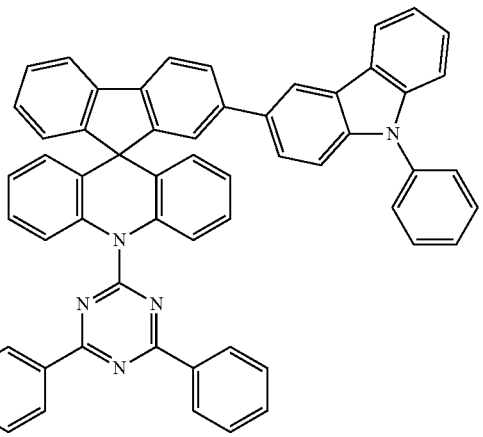

[A-2]

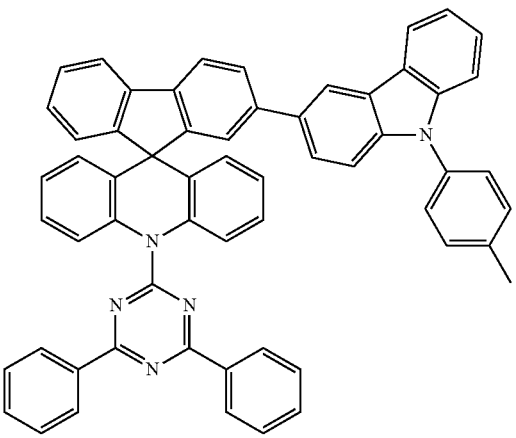

[A-3]

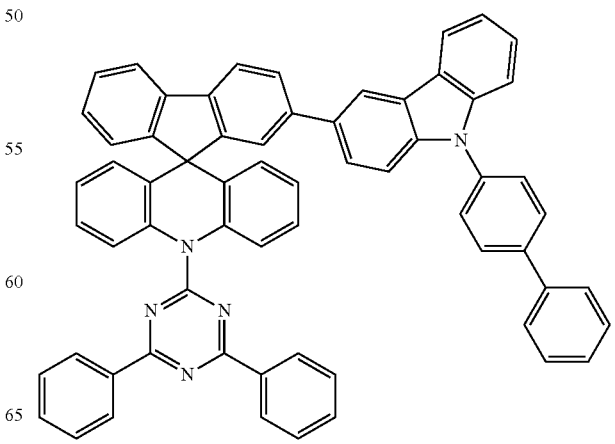

[A-4]
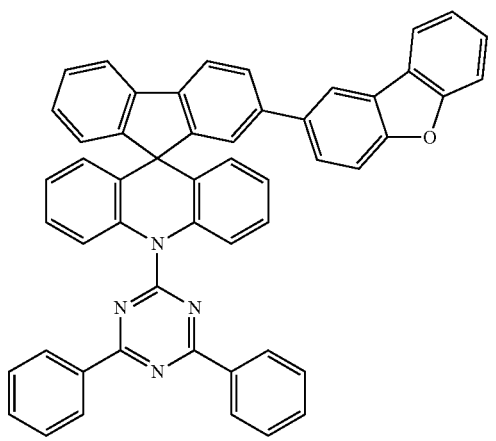
[A-5]
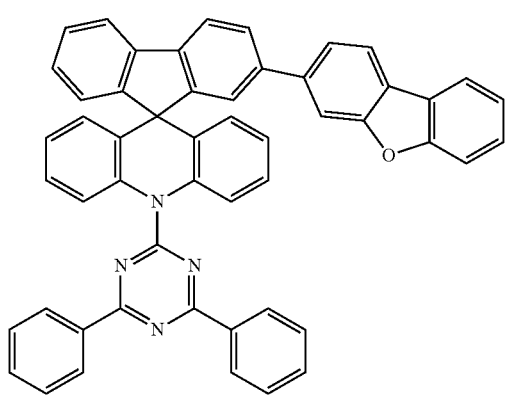
[A-6]
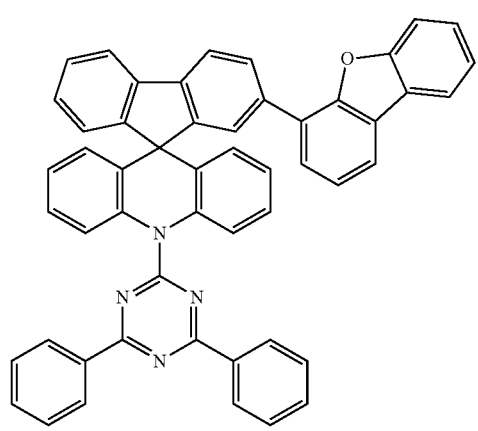
[A-7]
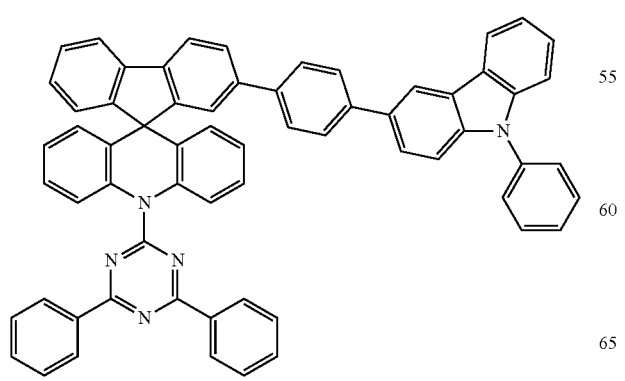
[A-8]
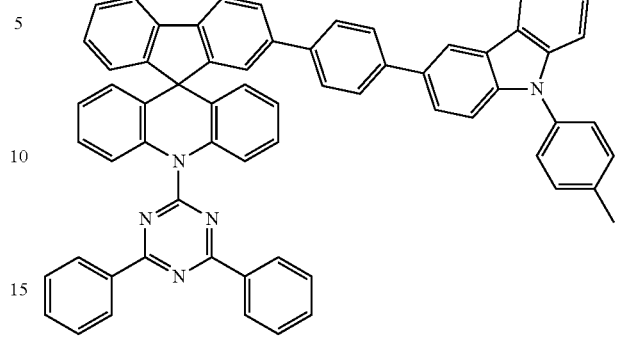
[A-9]
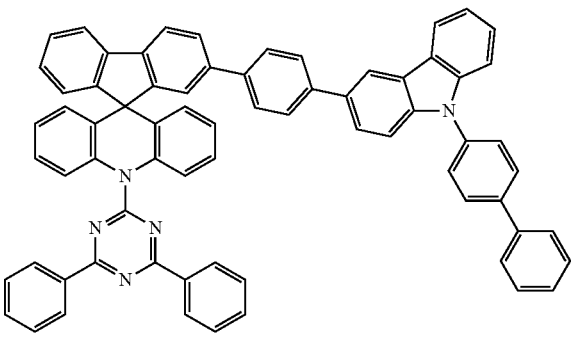
[A-10]
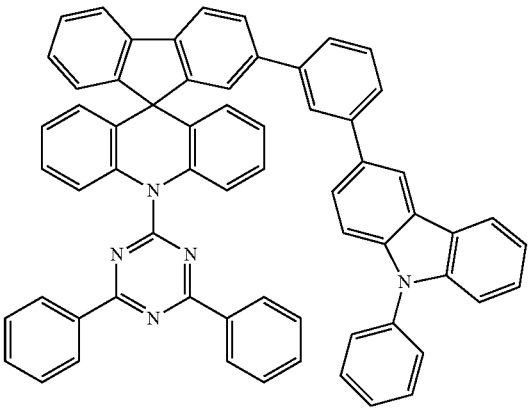
[A-11]
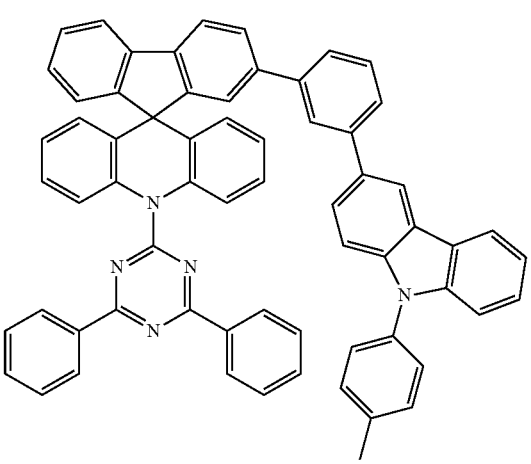

-continued
[A-12]
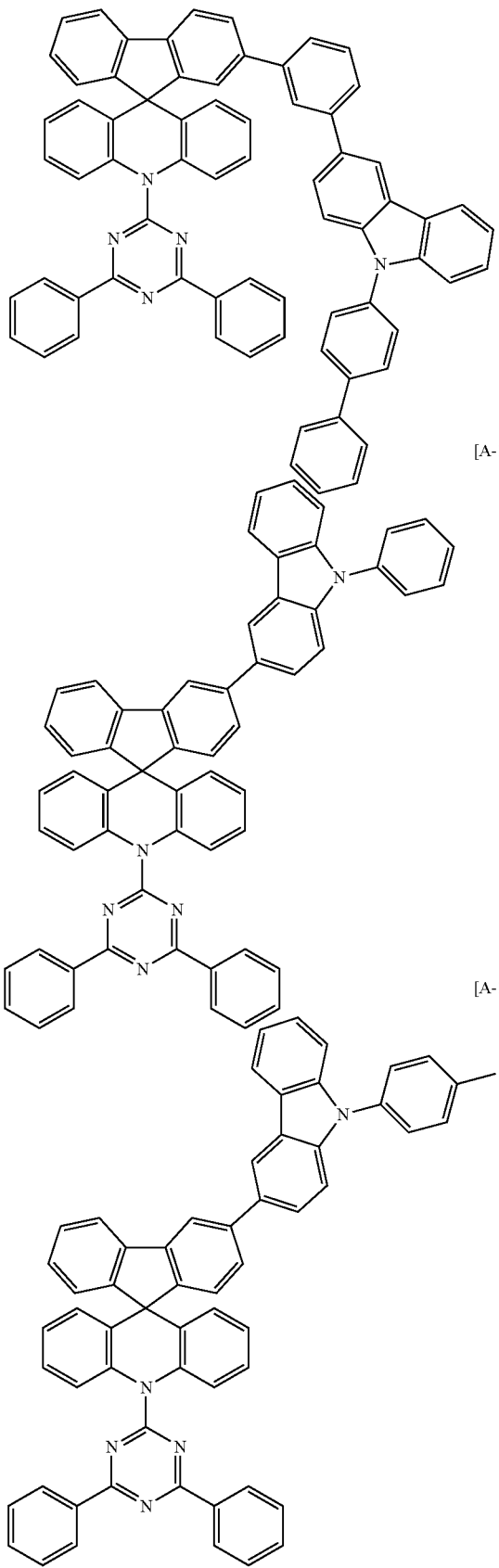
[A-13]
[A-14]
[A-15]
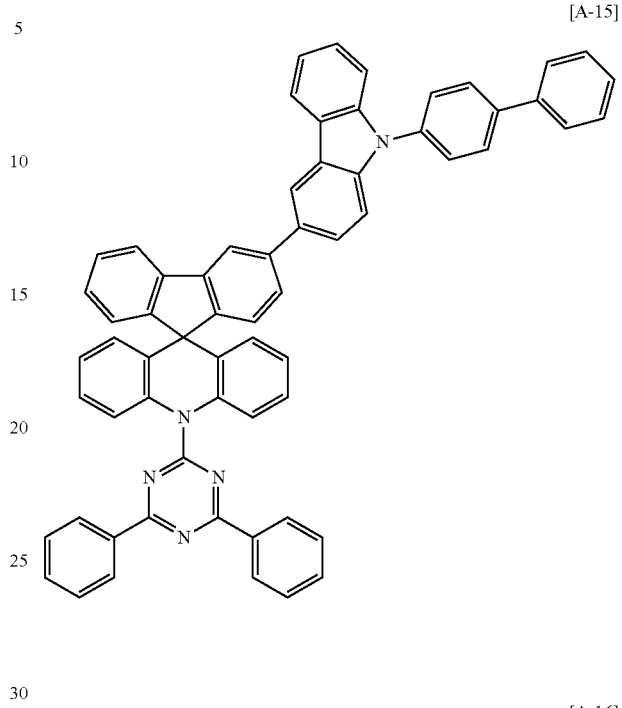
[A-16]
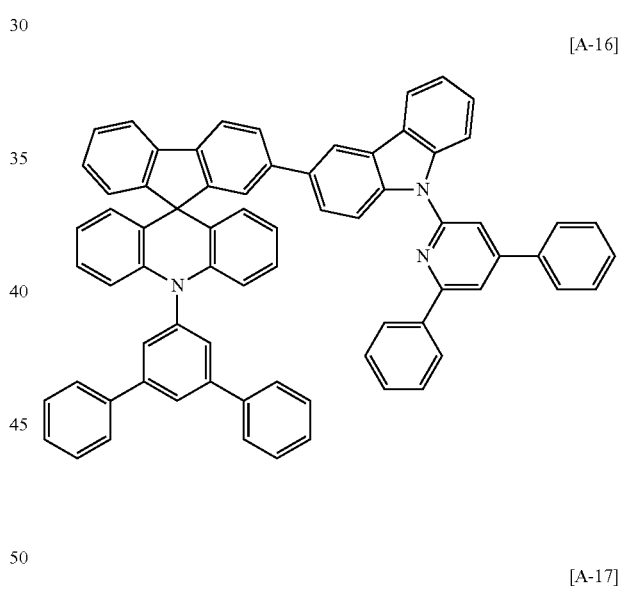
[A-17]
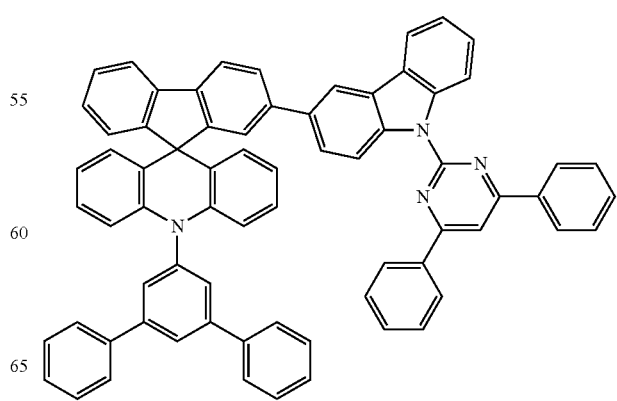

[A-18]
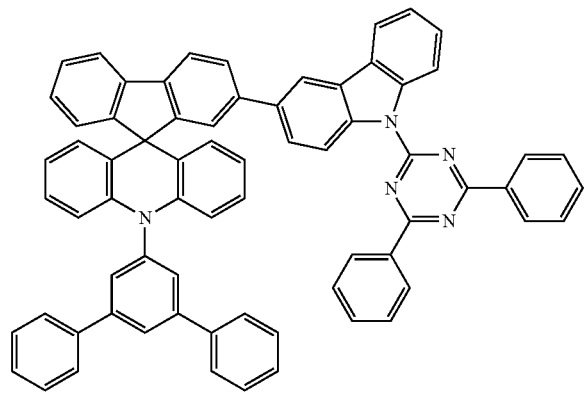
[A-21]
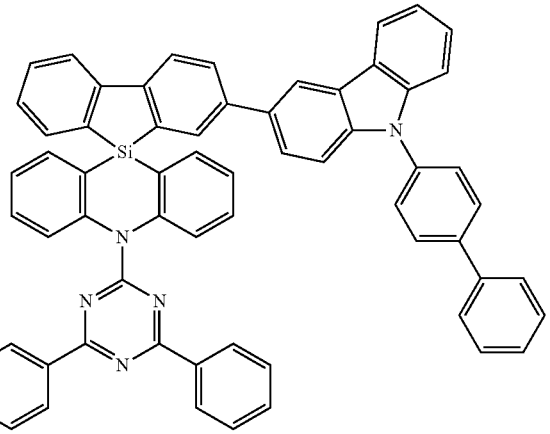
[A-19]
[A-22]
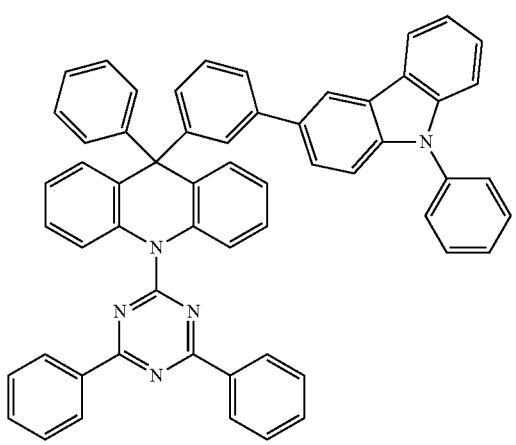
[A-20]
[A-23]
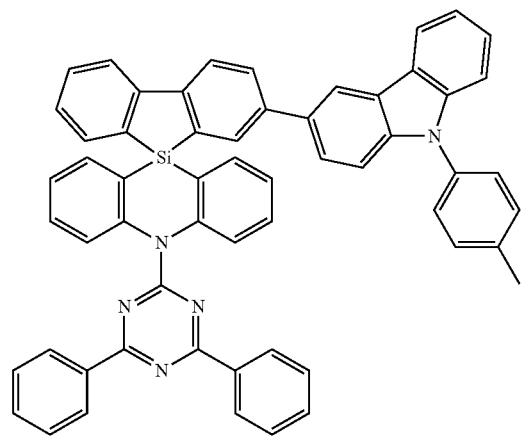
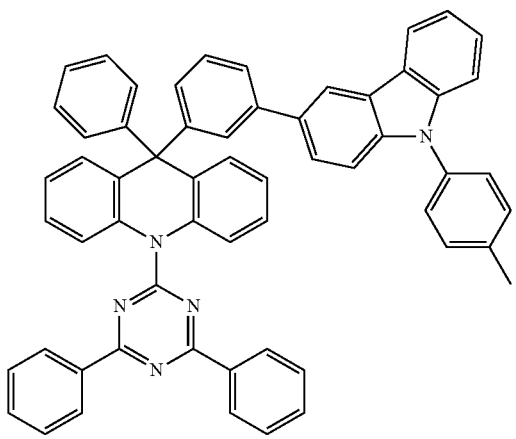

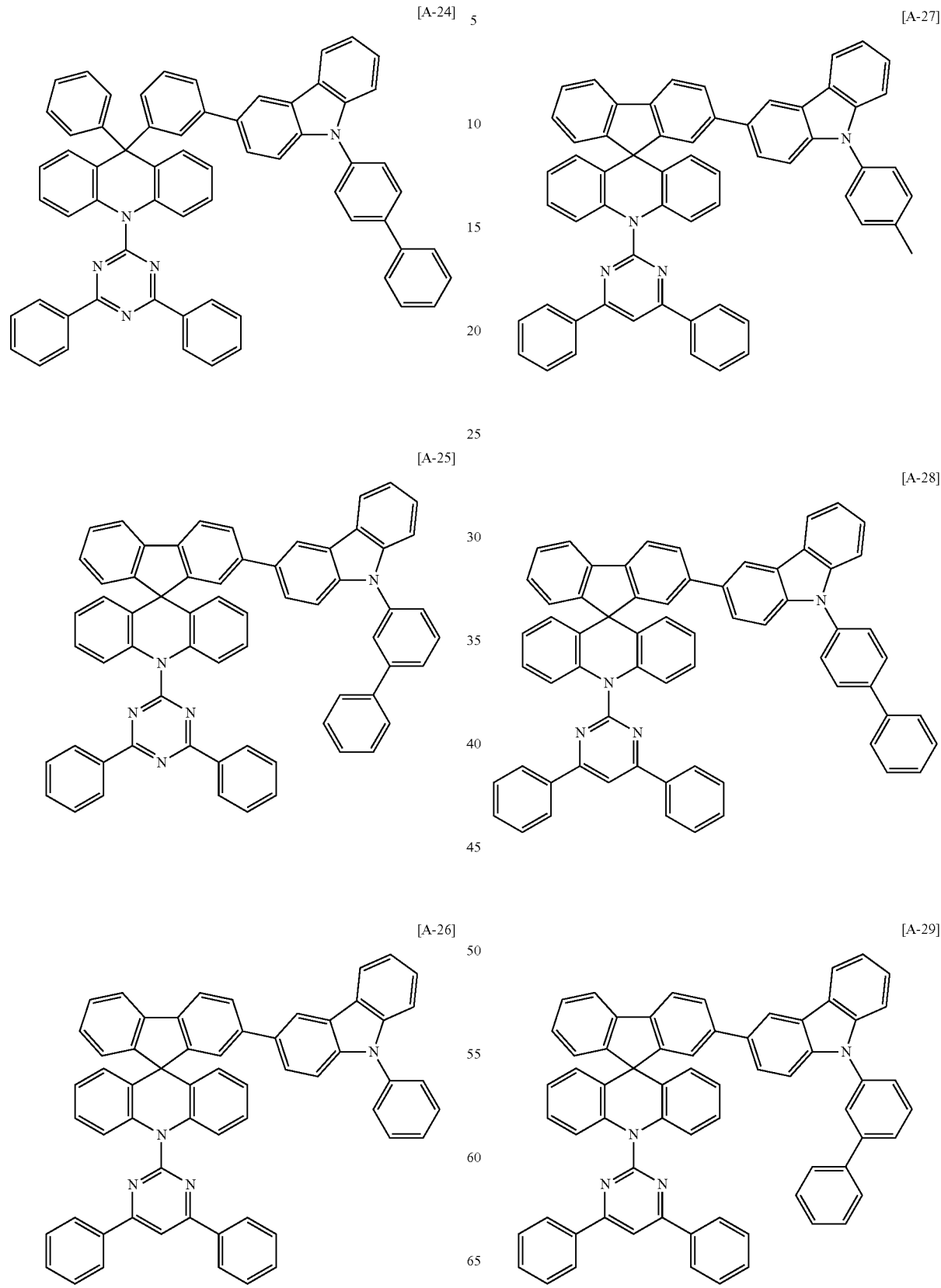

-continued
[A-30]
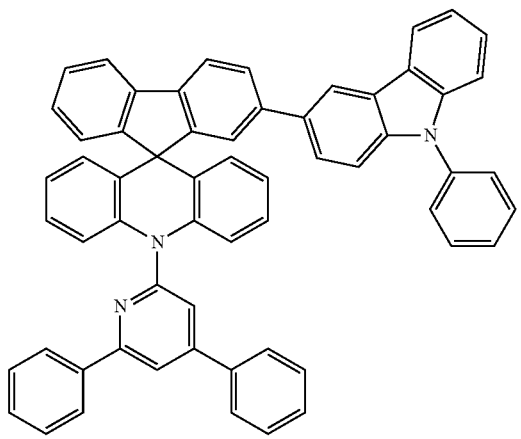
[A-31]
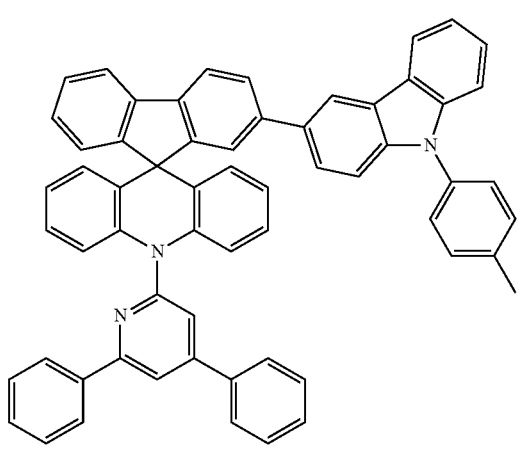
[A-32]
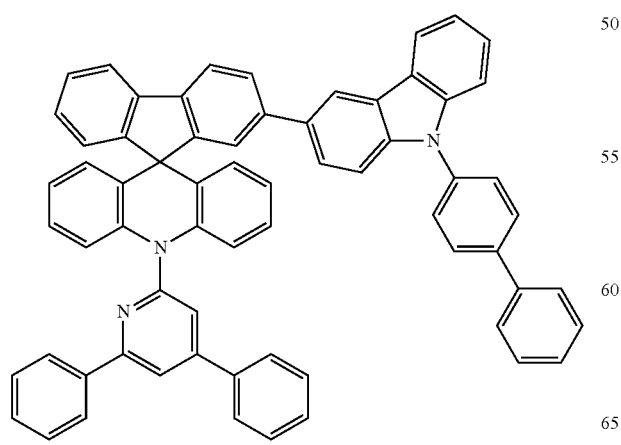
-continued
[A-33]
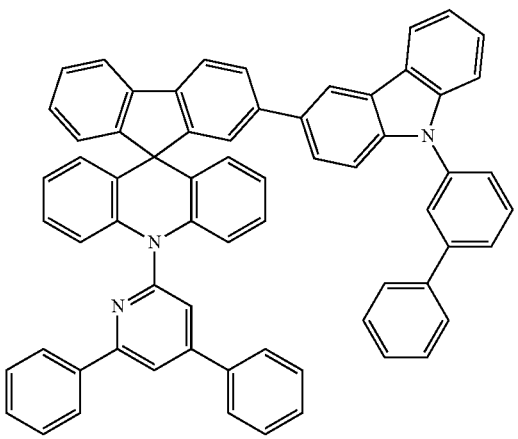
[A-34]
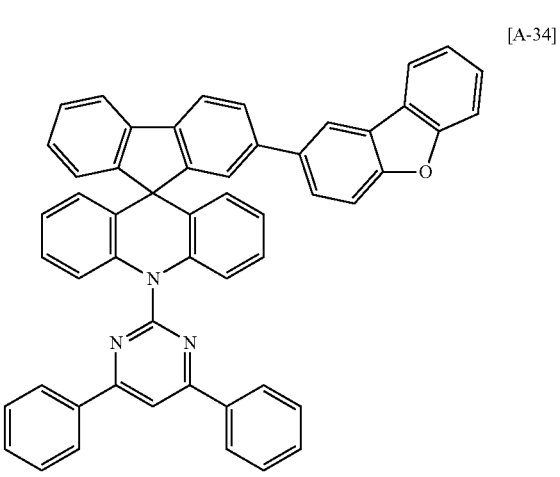
[A-35]
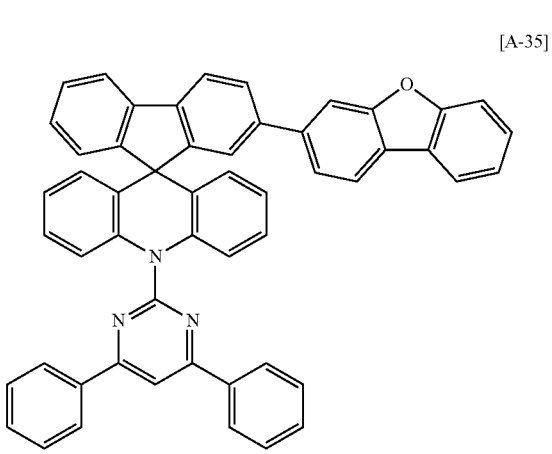

[A-36]
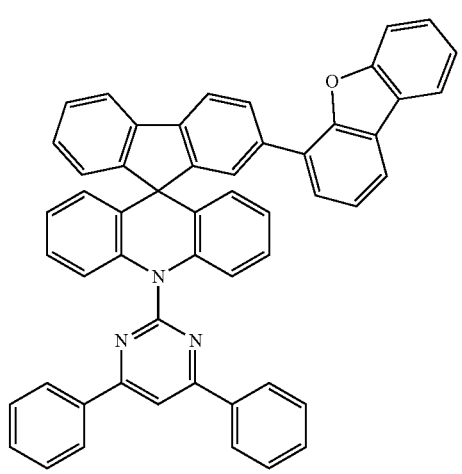
[A-39]
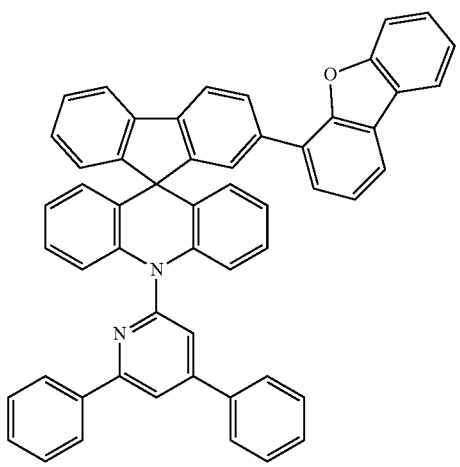
[A-37]
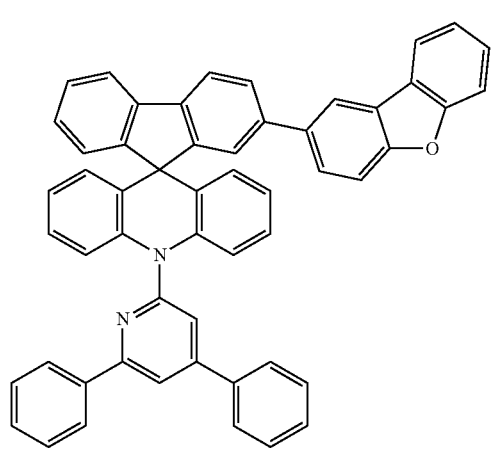
[A-40]
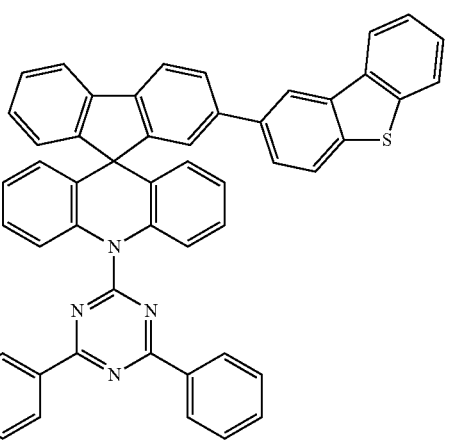
[A-38]
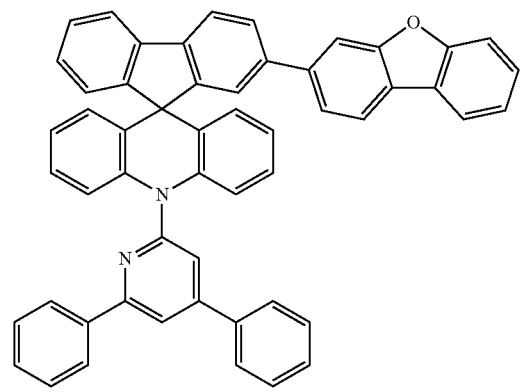
[A-41]
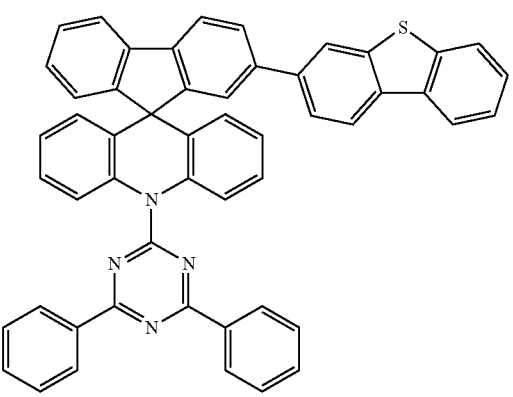

-continued
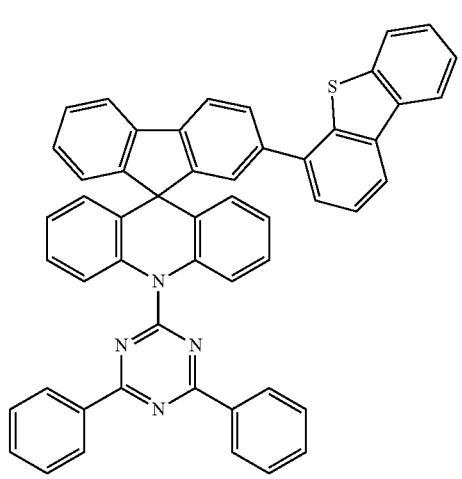
[A-42]
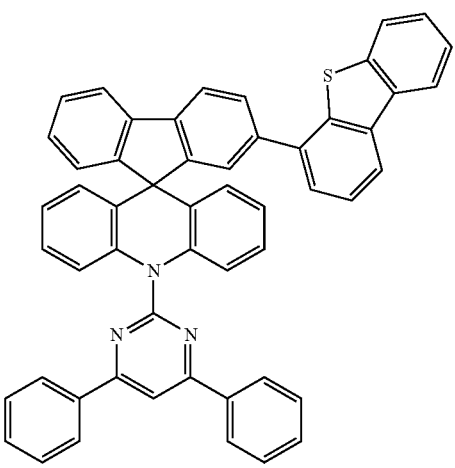
[A-45]
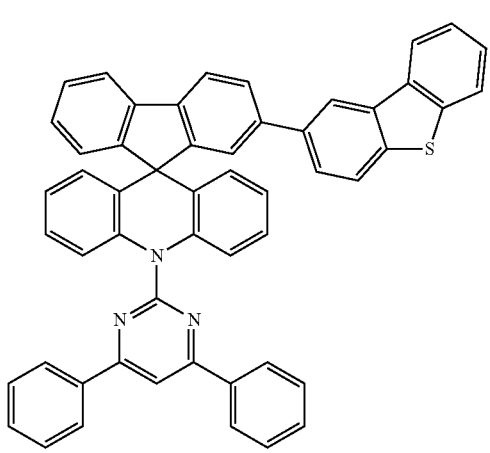
[A-43]
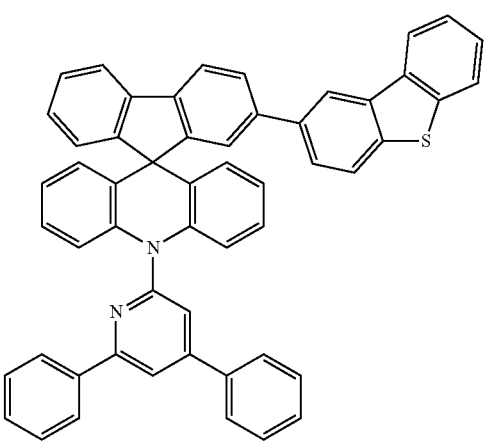
[A-46]
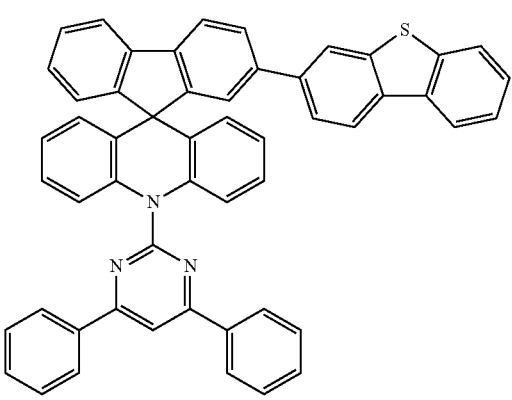
[A-44]
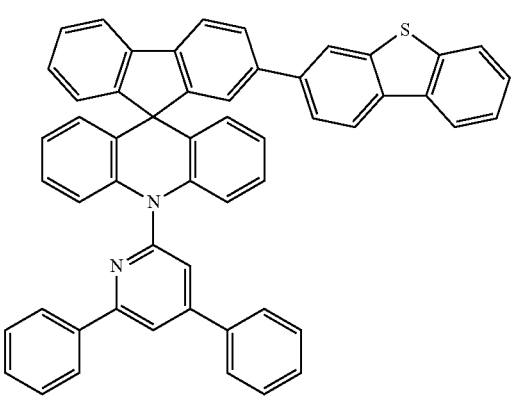
[A-47]

[A-48]
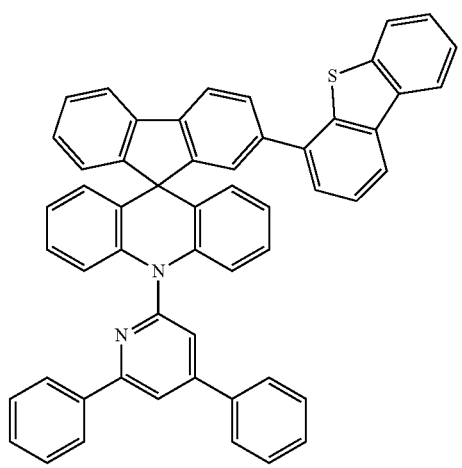
[A-52]
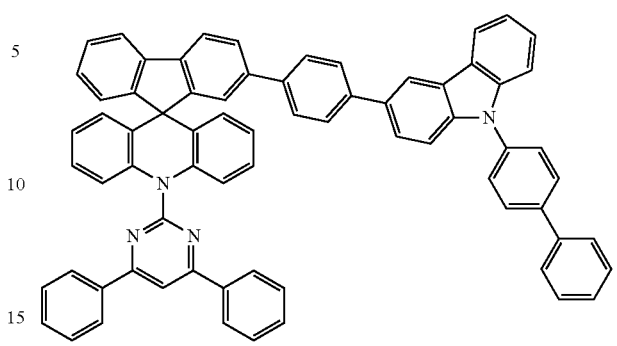
[A-49]
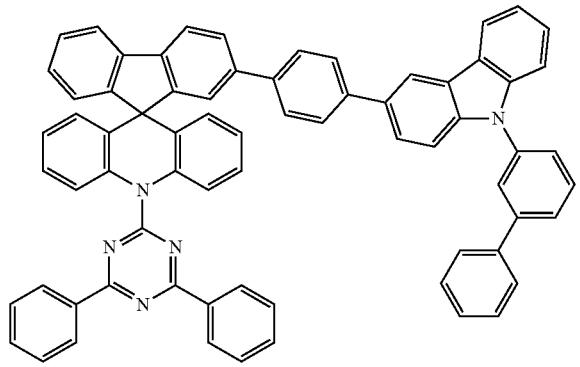
[A-53]
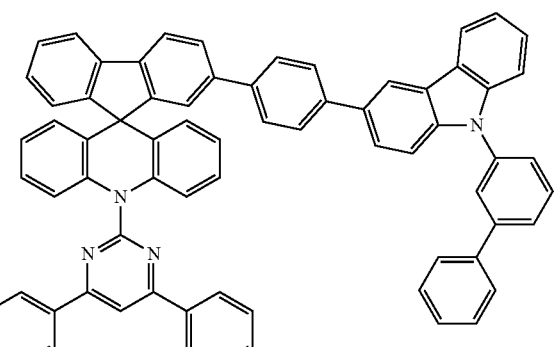
[A-50]
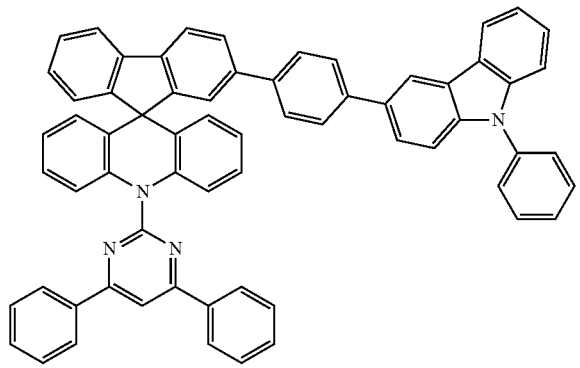
[A-54]
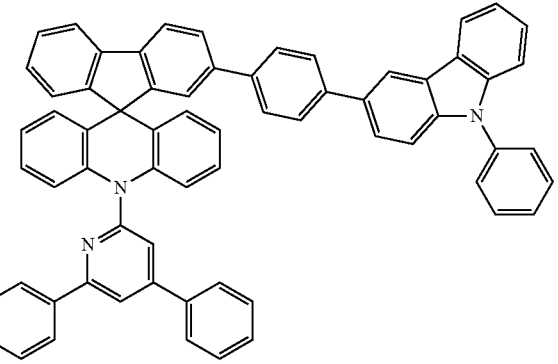
[A-51]
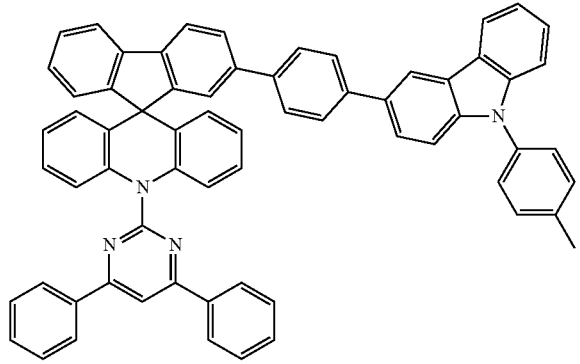
[A-55]
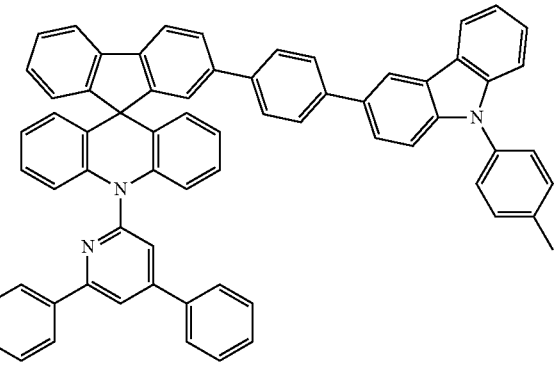

[A-56]
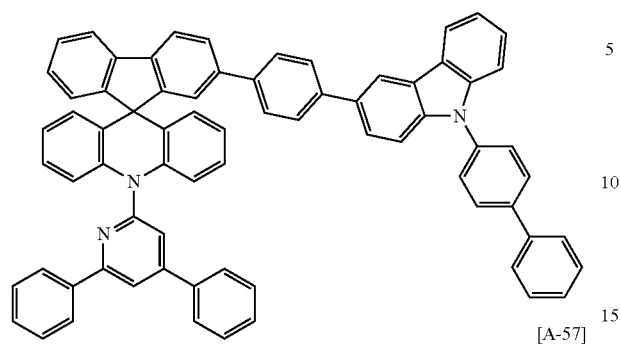
[A-60]
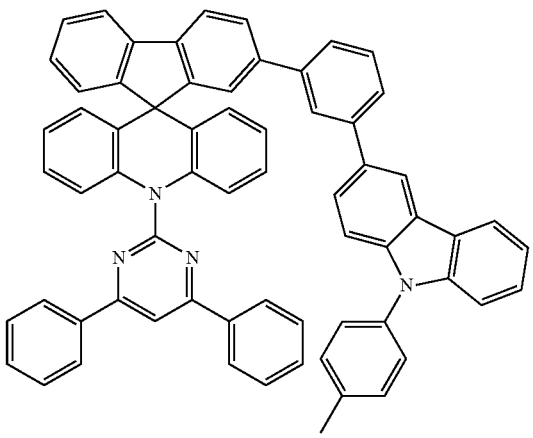
[A-57]
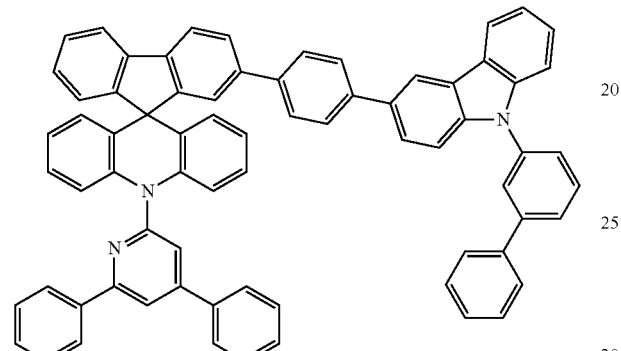
[A-61]
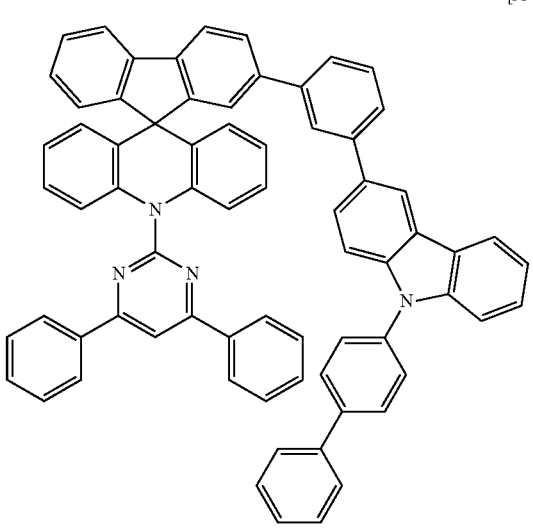
[A-58]
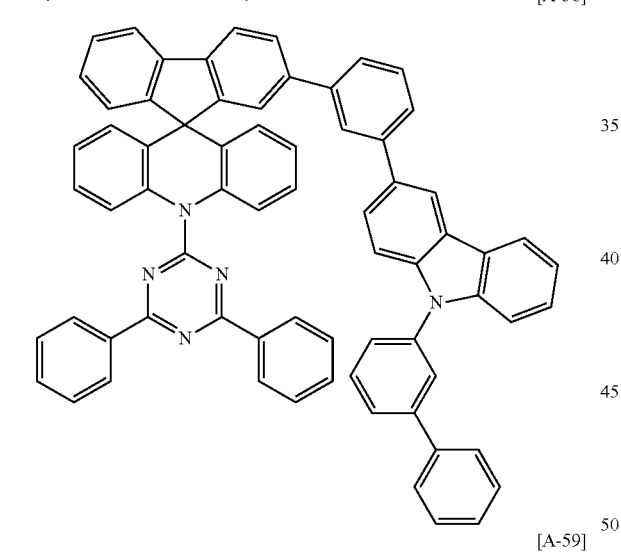
[A-62]
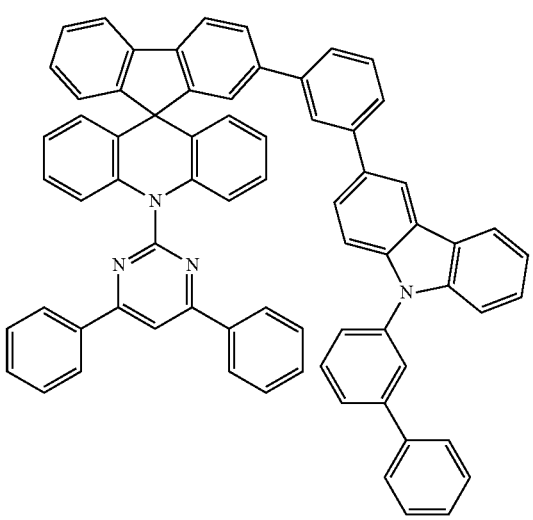
[A-59]

[A-63]
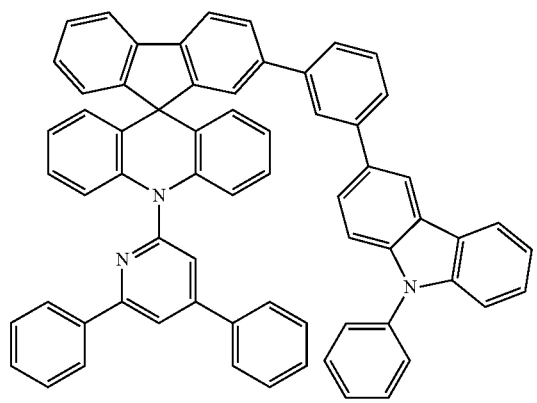
[A-66]
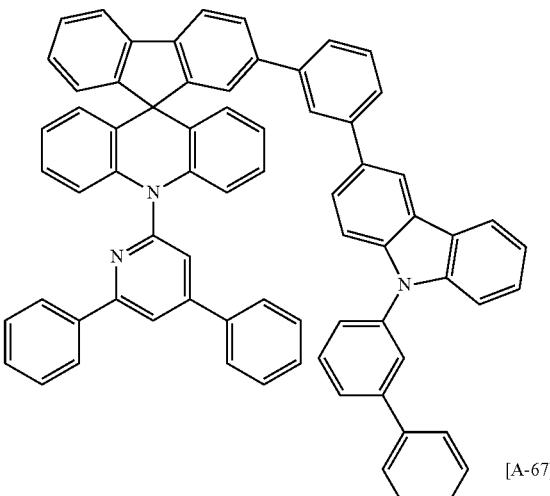
[A-64]
[A-67]
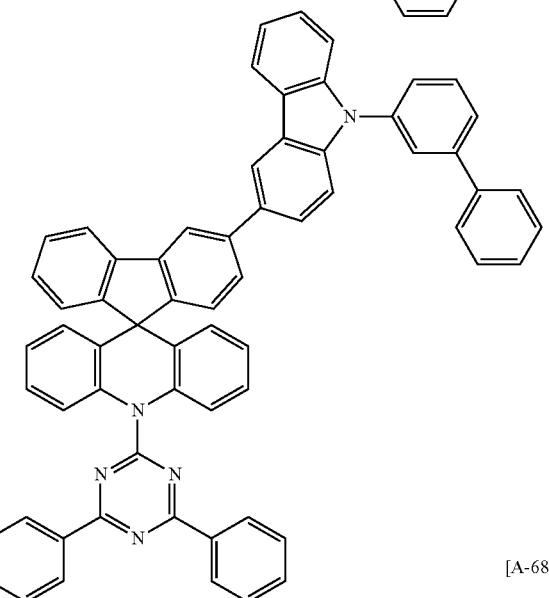
[A-65]
[A-68]
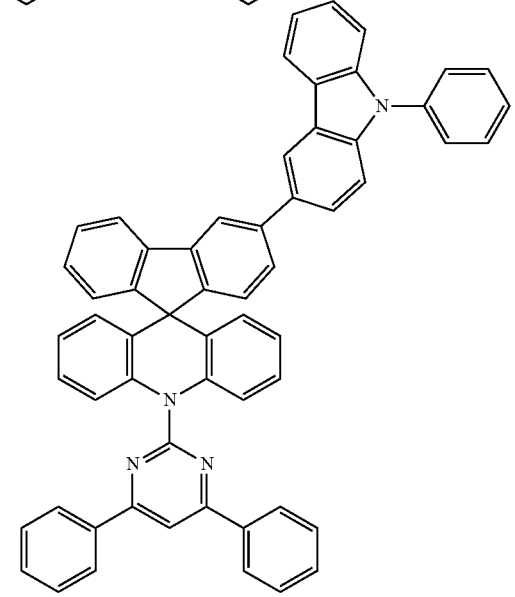

[A-69]
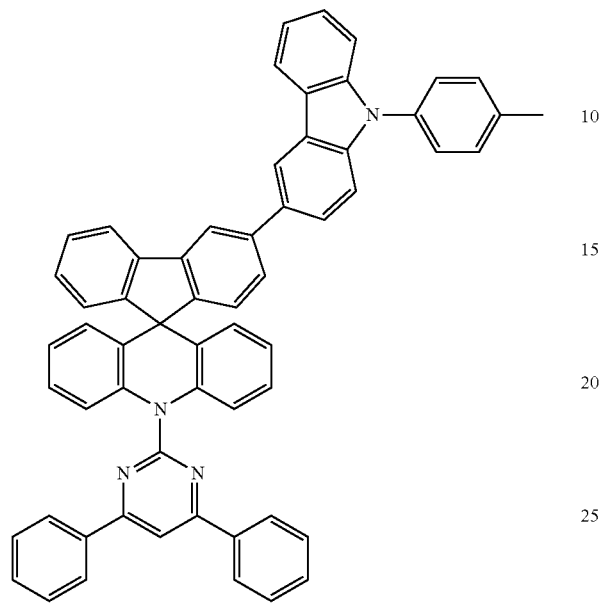
[A-71]
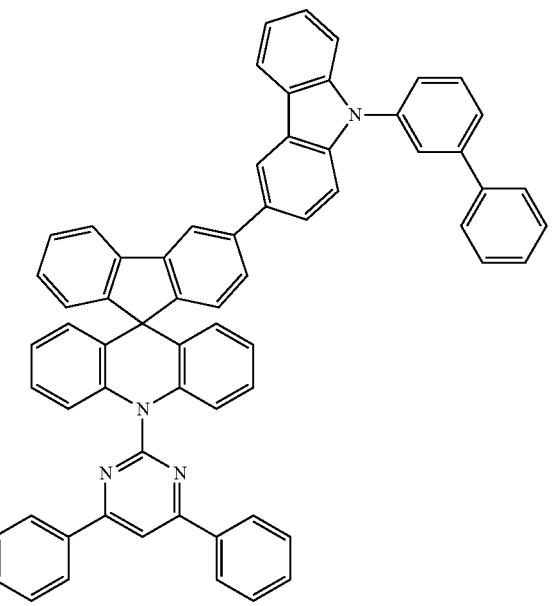
[A-70]
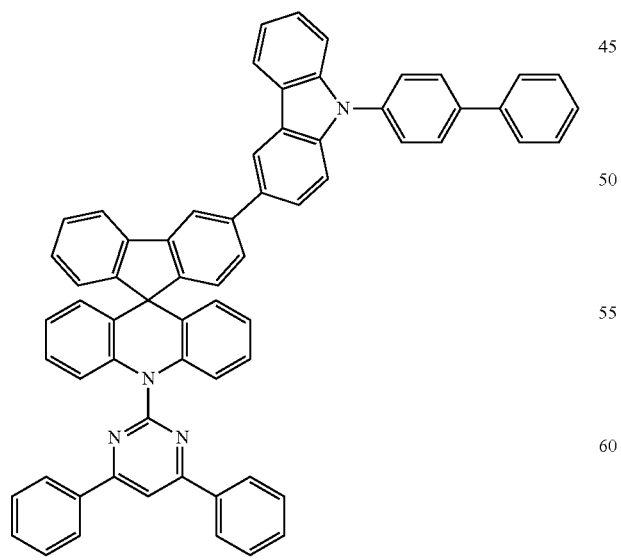
[A-72]
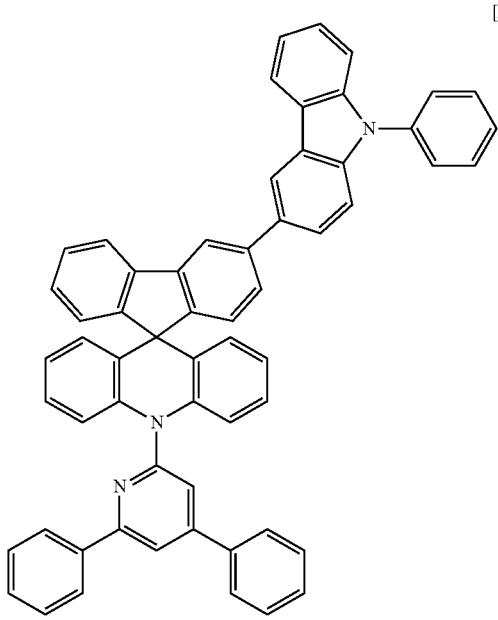

[A-73]
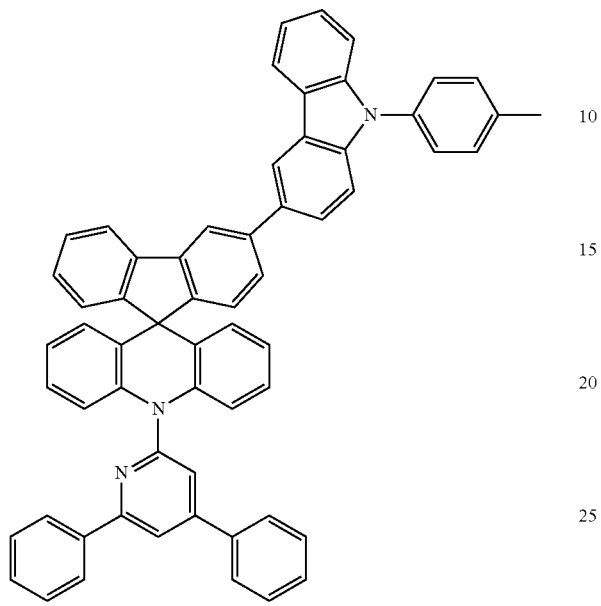
[A-74]
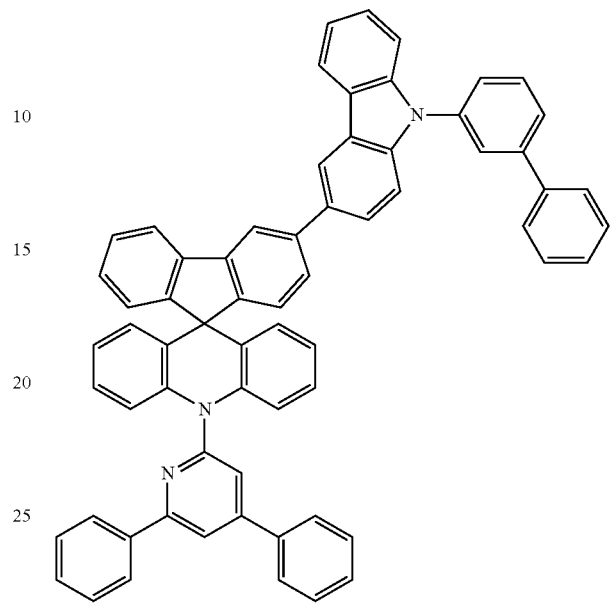
[A-75]
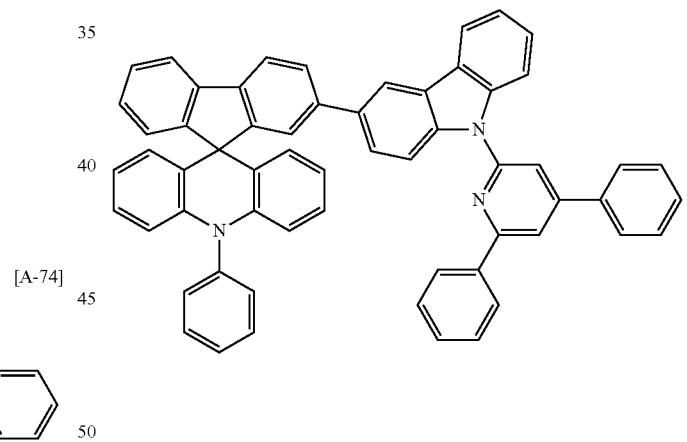
[A-76]
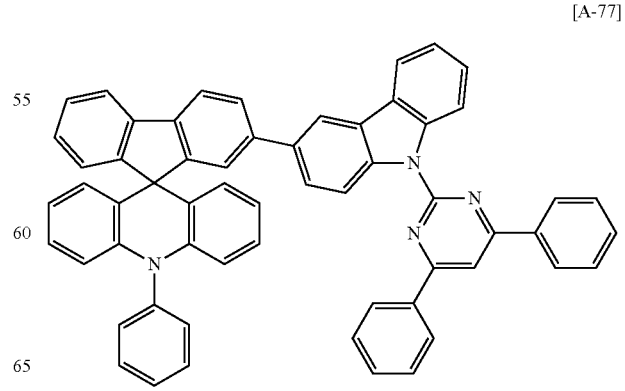
[A-77]

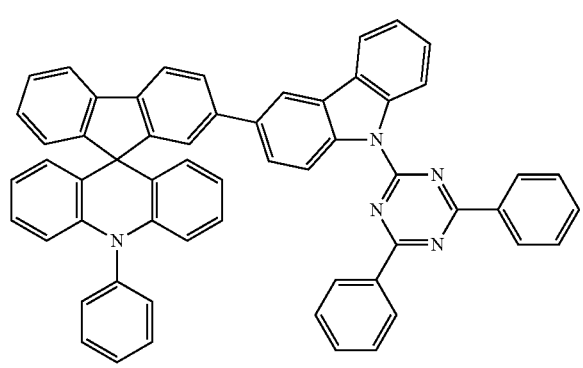 [A-78]
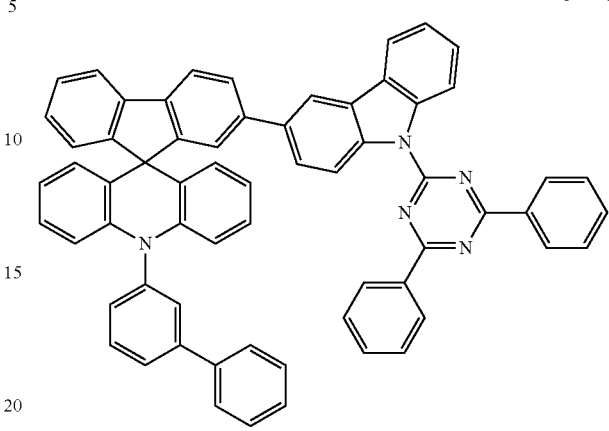 [A-81]
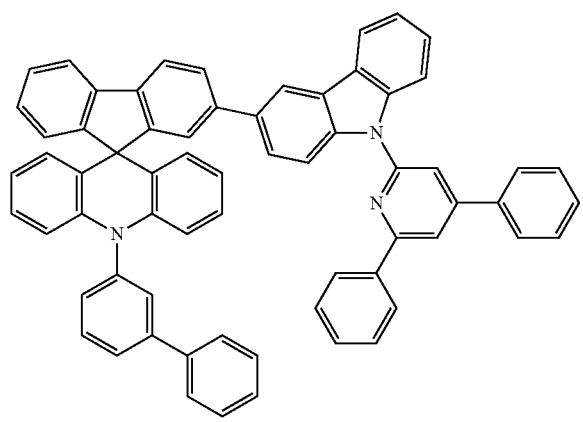 [A-79]
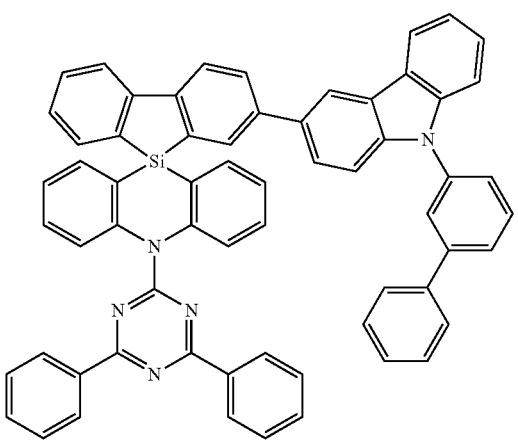 [A-82]
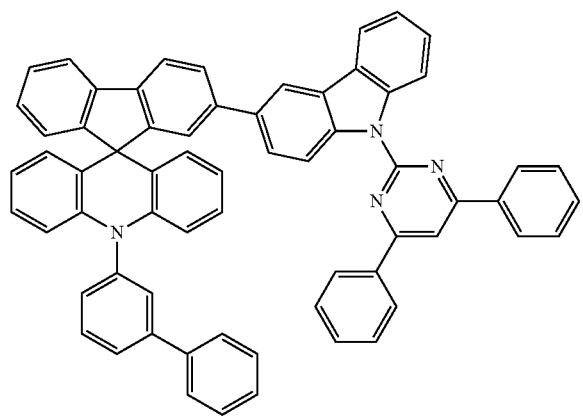 [A-80]
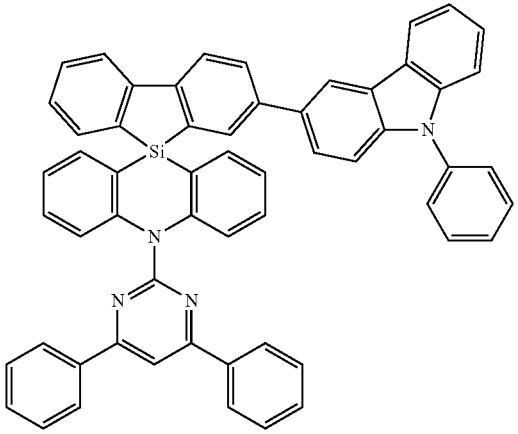 [A-83]

-continued
[A-84]
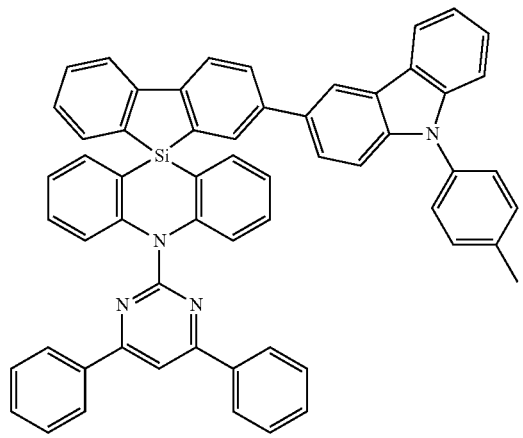
[A-85]
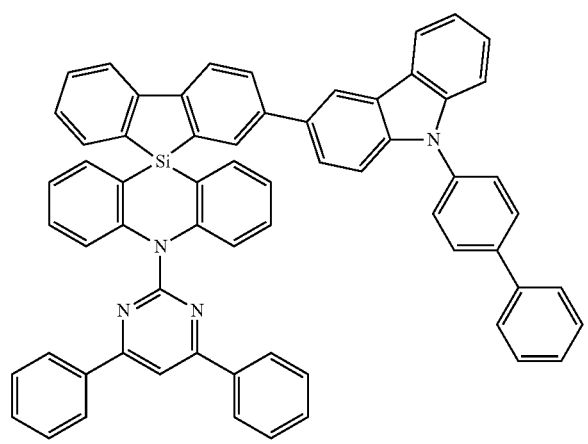
[A-86]
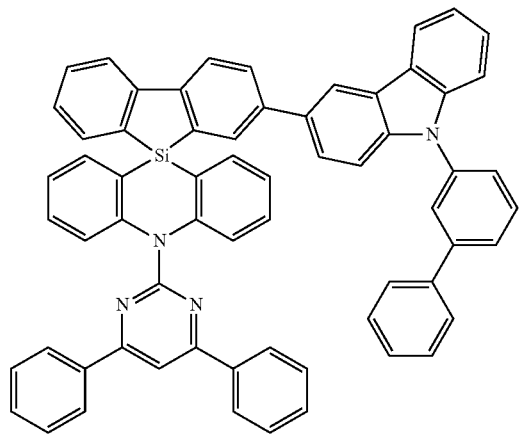
-continued
[A-87]
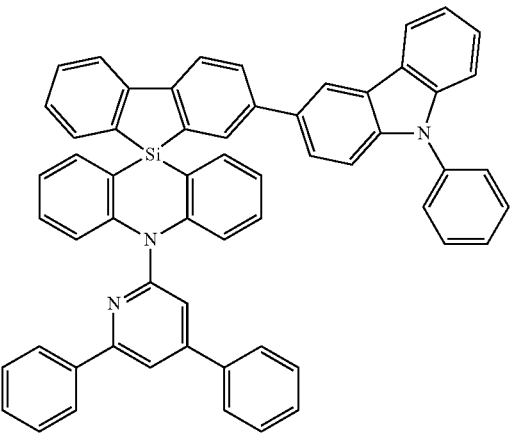
[A-88]
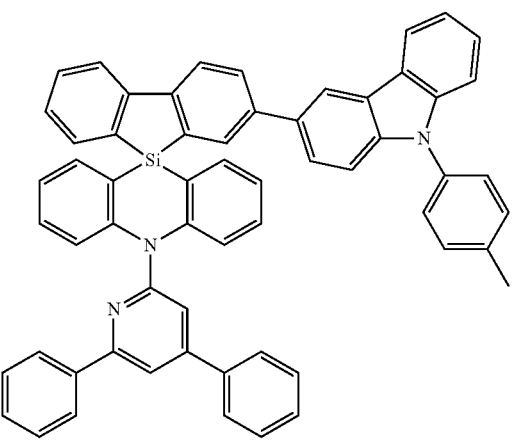
[A-89]
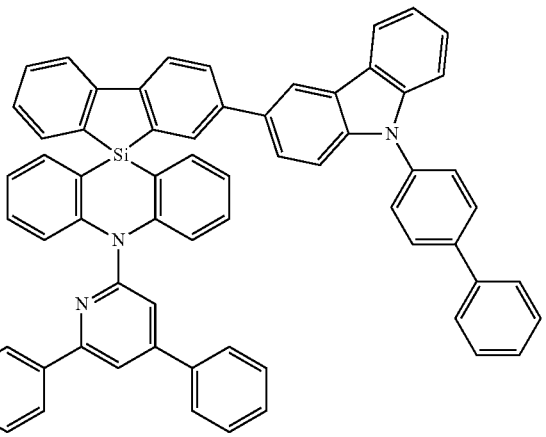

[A-90]
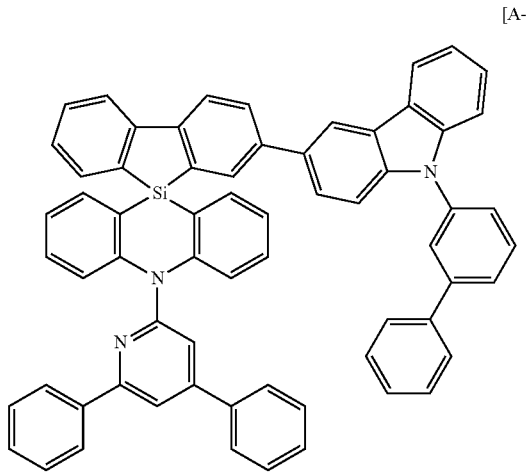
[A-93]
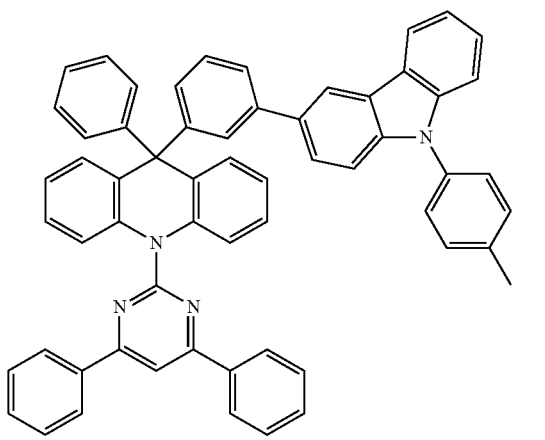
[A-91]
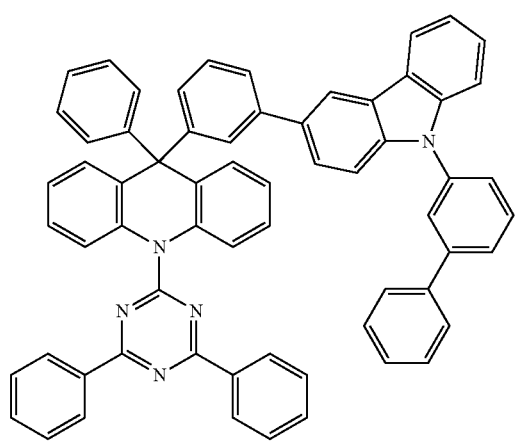
[A-94]
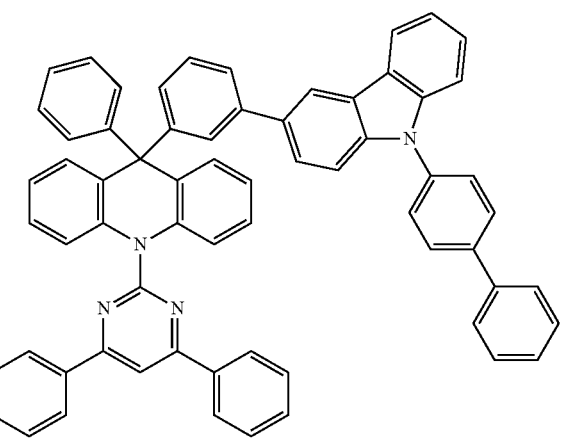
[A-92]
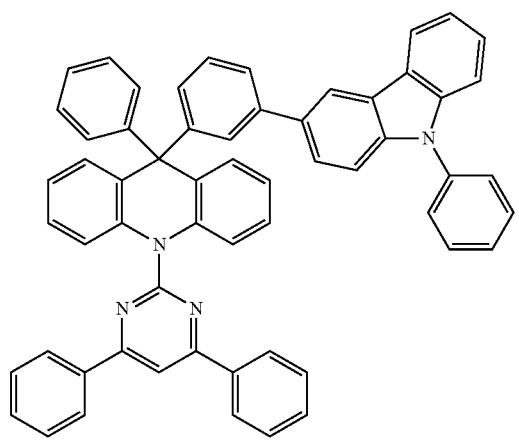
[A-95]
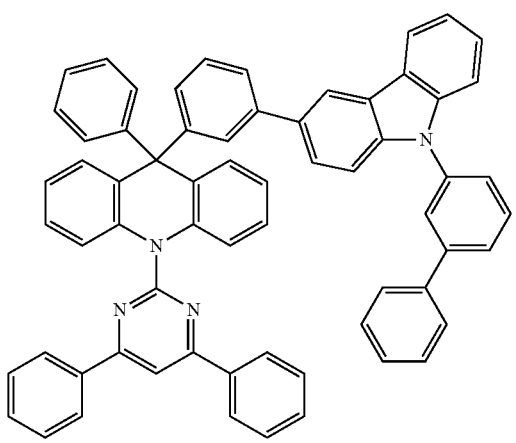

[A-96]
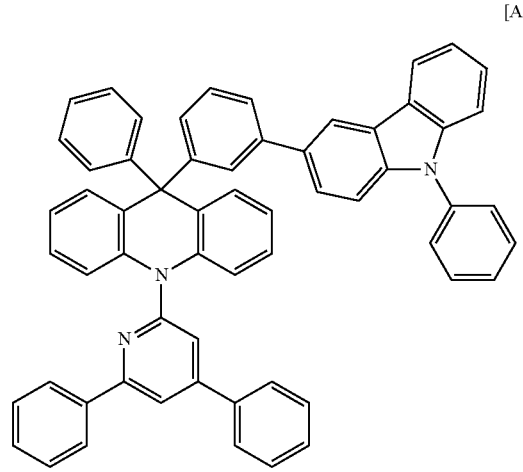
[A-97]
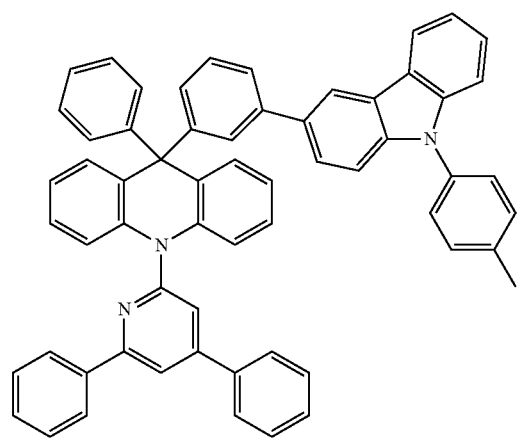
[A-98]
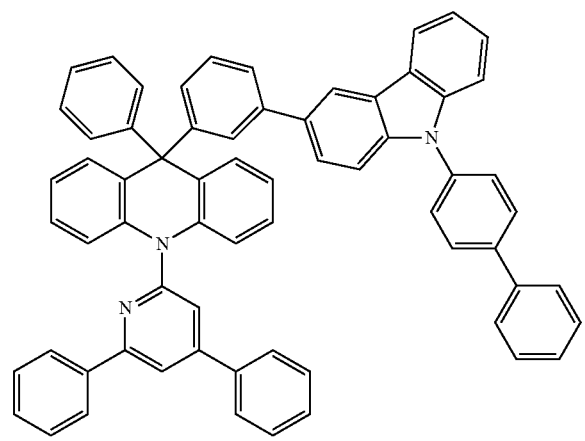
[A-99]
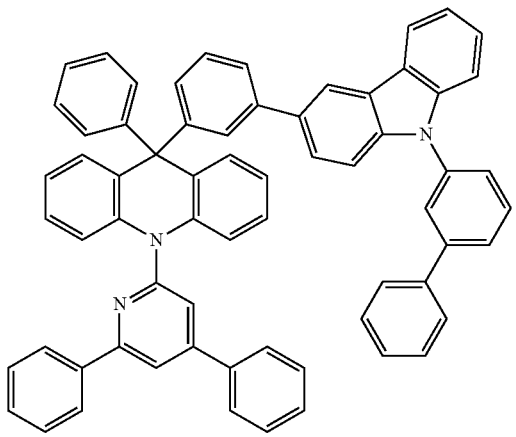
[A-100]
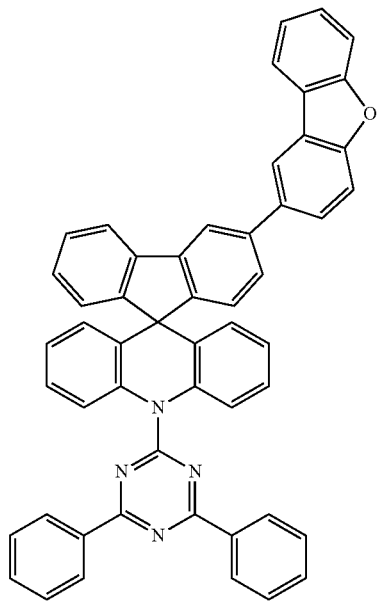
[A-101]

[A-102]
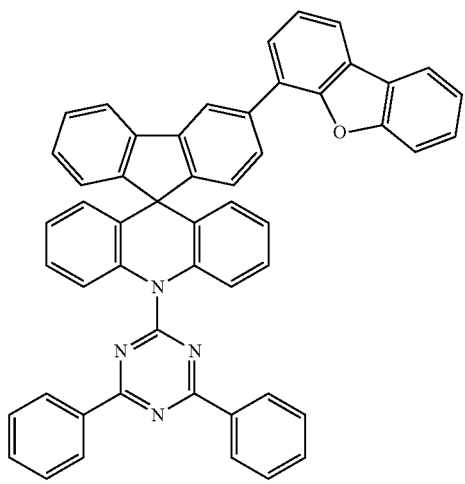
[A-103]
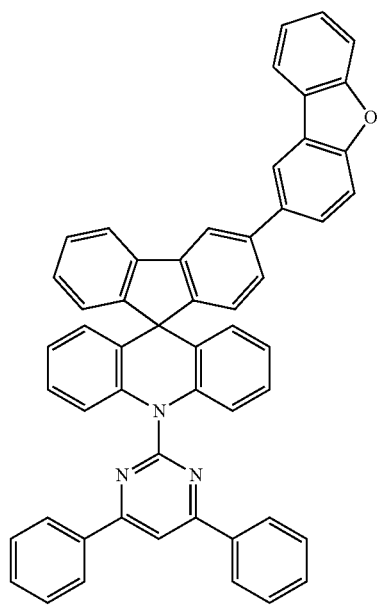
[A-104]
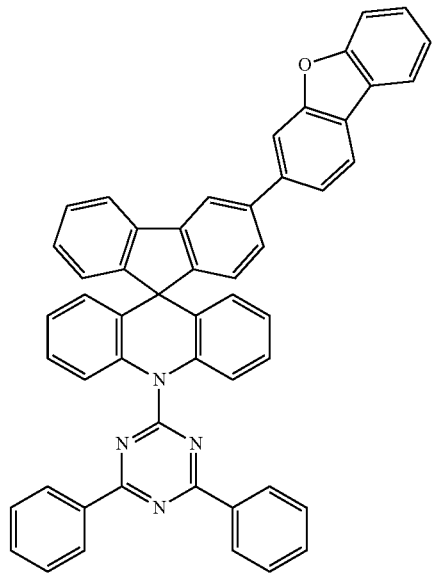
[A-105]
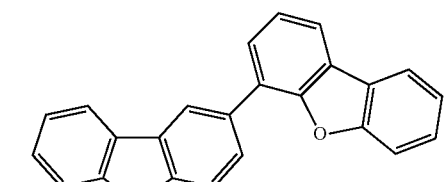
[A-106]
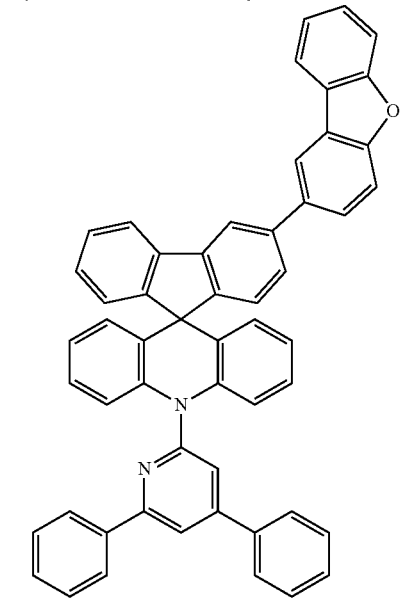
[A-107]
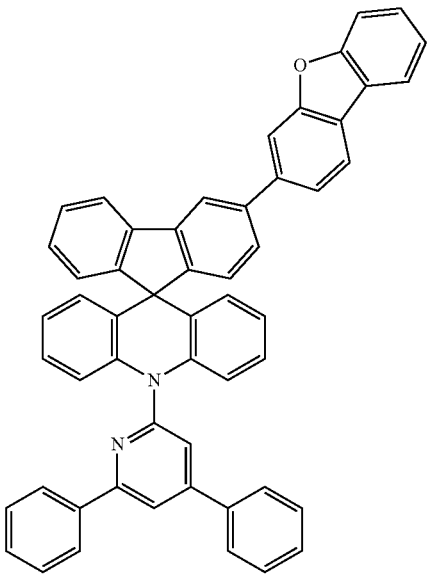

[A-108]
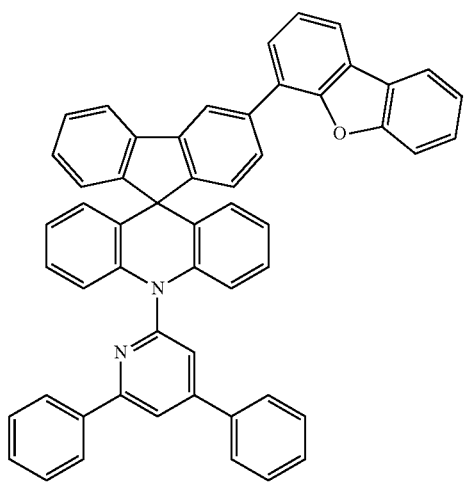
[A-111]
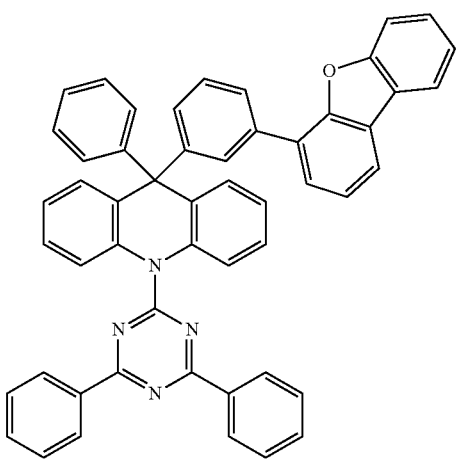
[A-109]
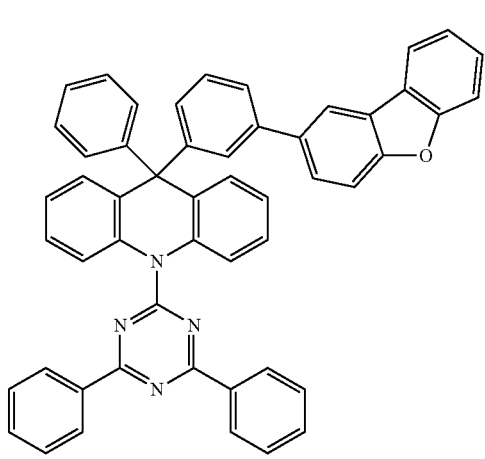
[A-112]
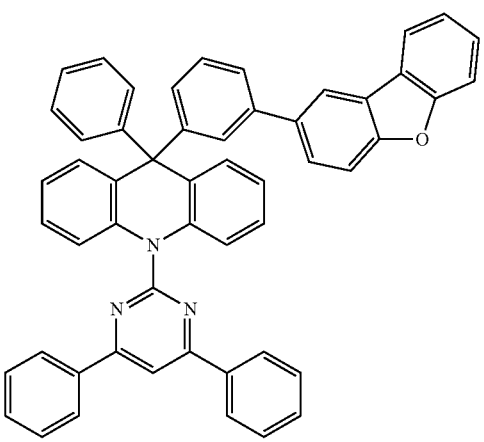
[A-110]
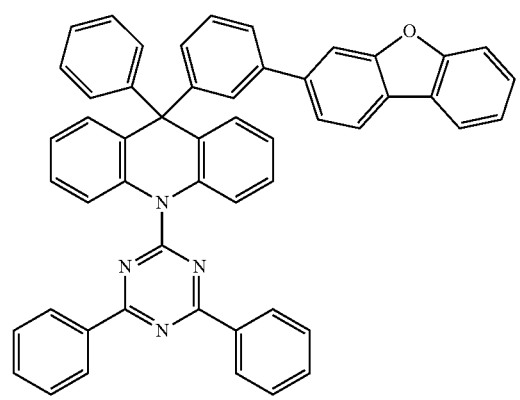
[A-113]
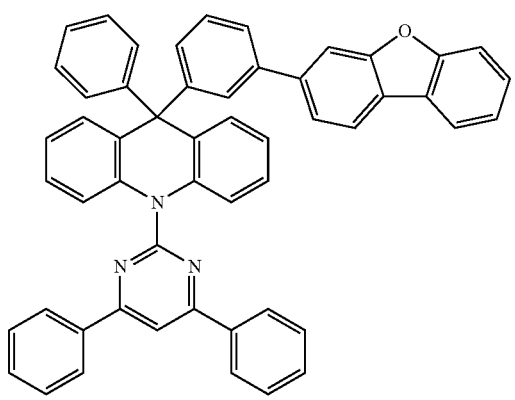

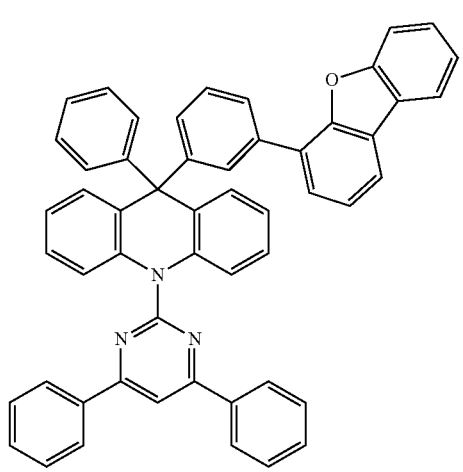
[A-114]
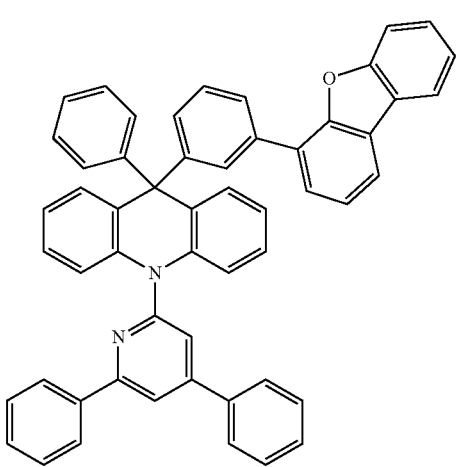
[A-117]
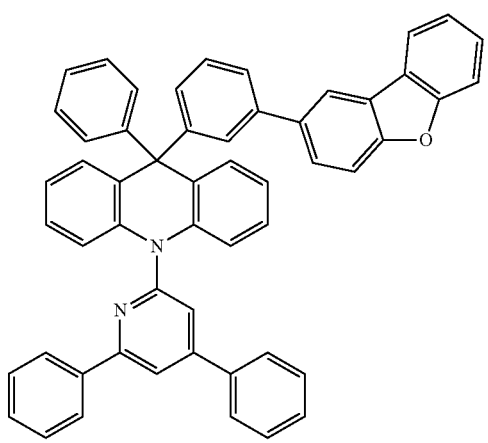
[A-115]
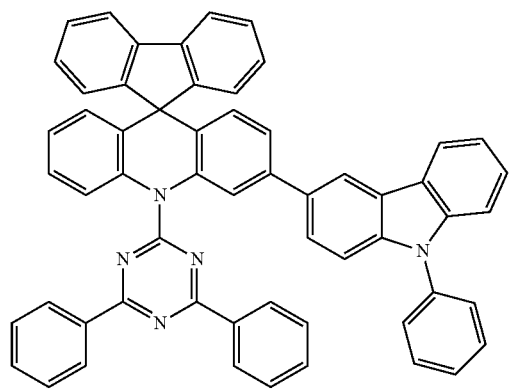
(B-1)
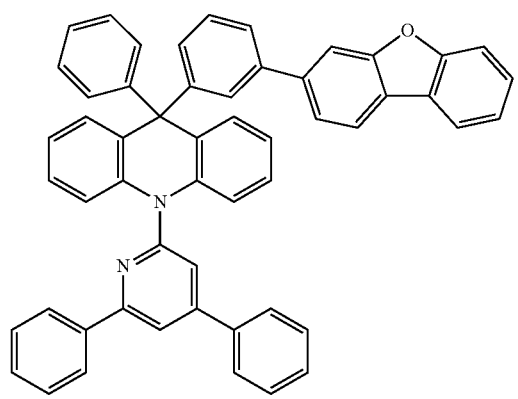
[A-116]
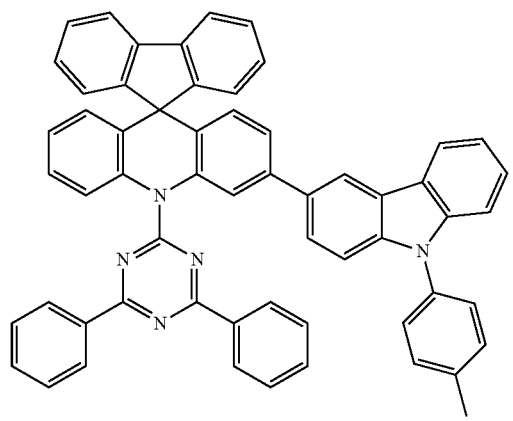
(B-2)

-continued
[B-3]
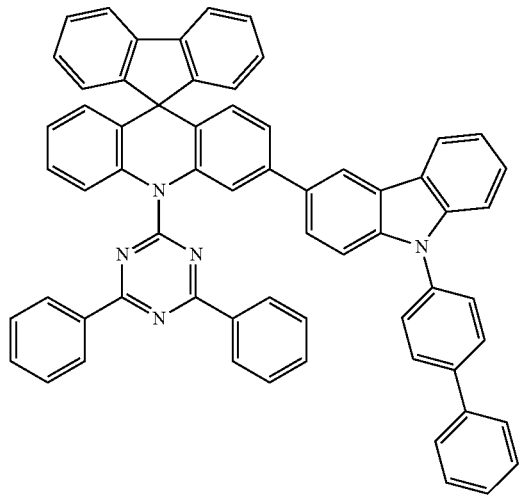
[B-4]
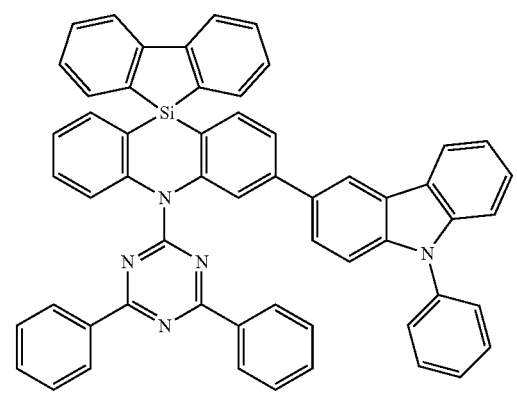
[B-5]
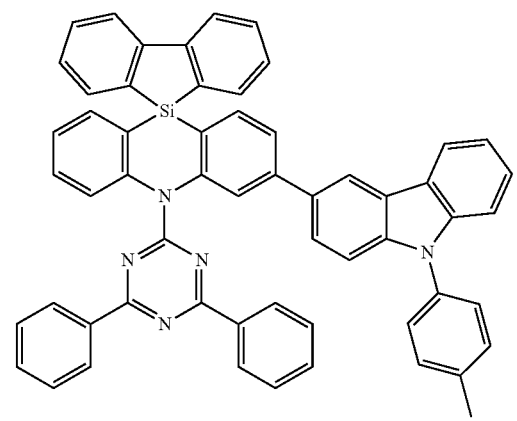
[B-6]
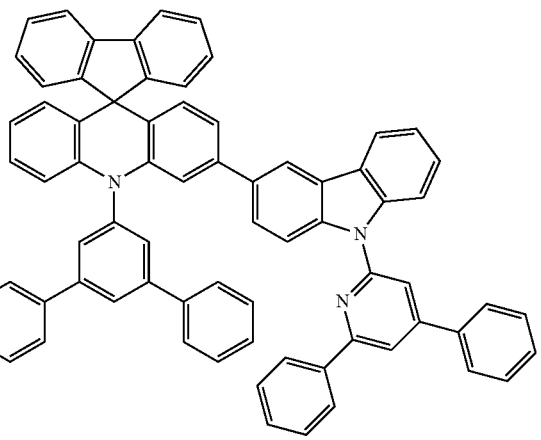
[B-7]
[B-8]
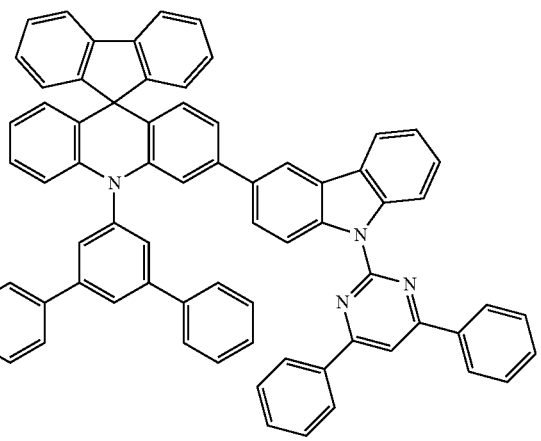

[B-9]
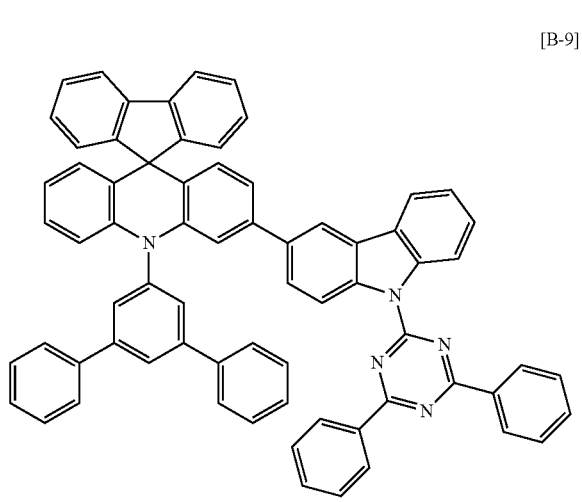
[B-10]
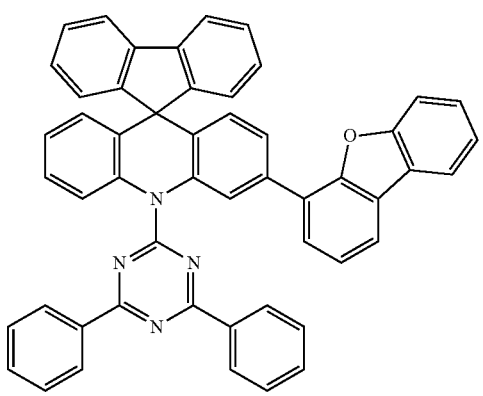
[B-11]
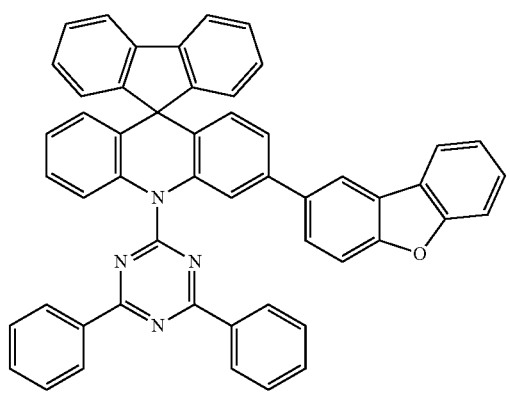
[B-12]
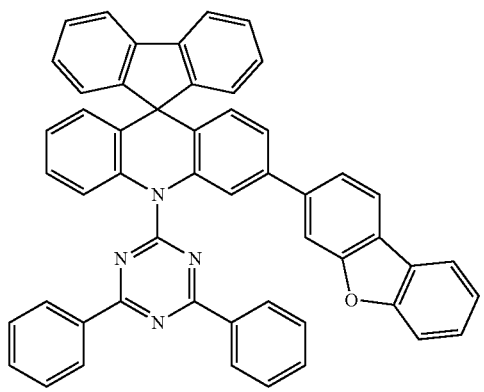
[B-13]
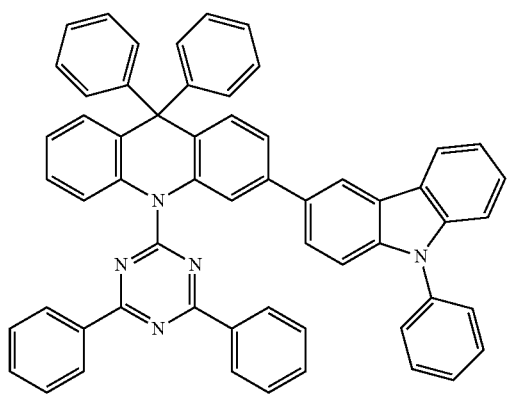
[B-14]
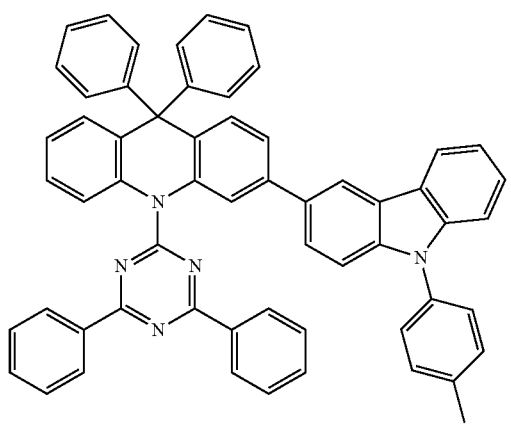

[B-15]
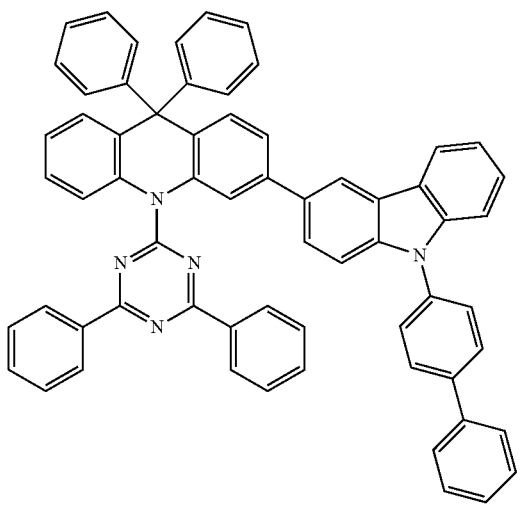
[B-16]
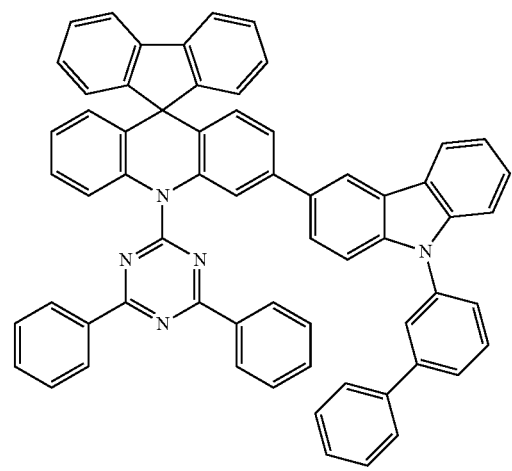
[B-17]
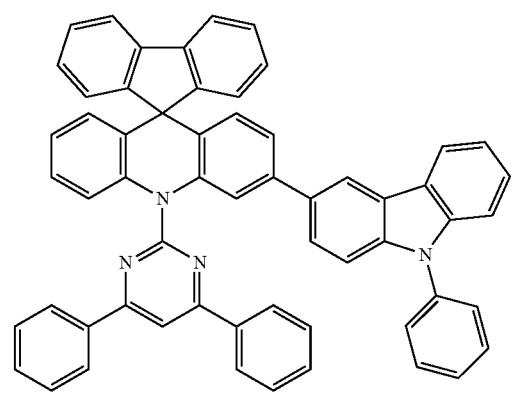
[B-18]
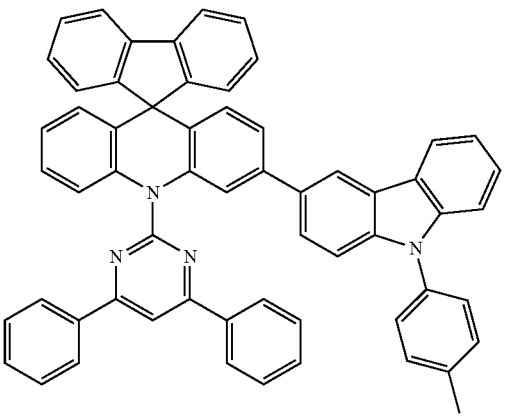
[B-19]
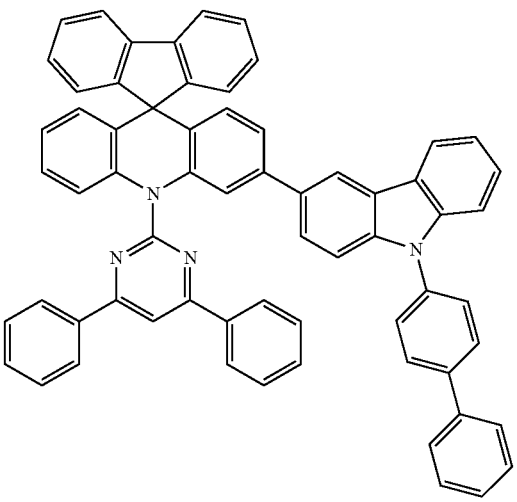
[B-20]
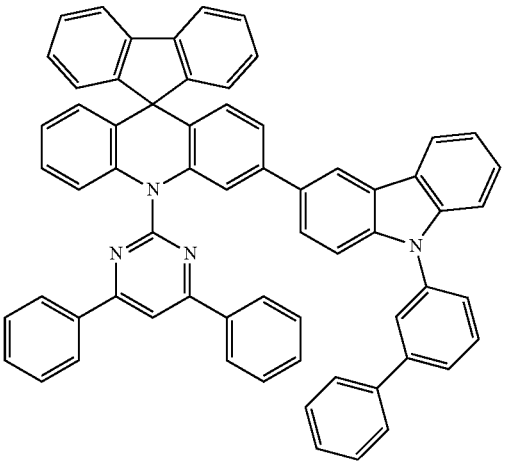

[B-21]
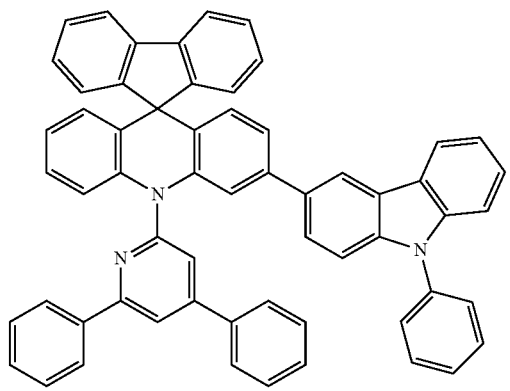
[B-22]
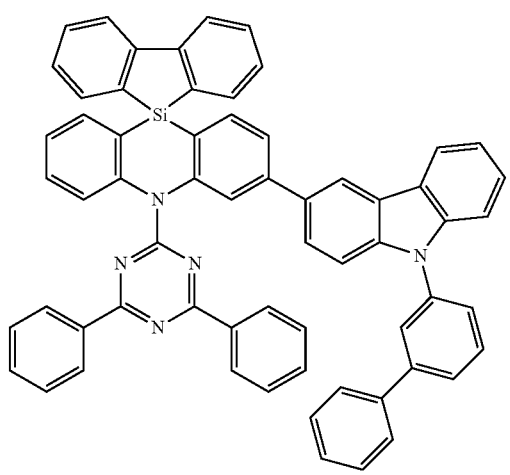
[B-23]
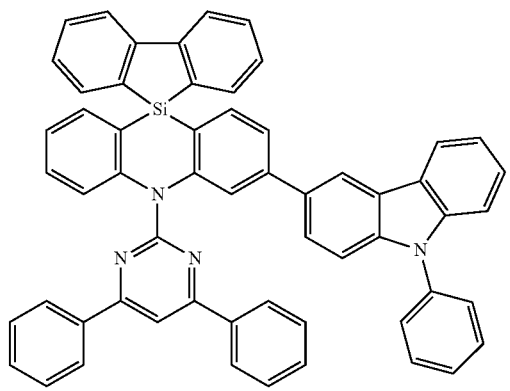
[B-24]
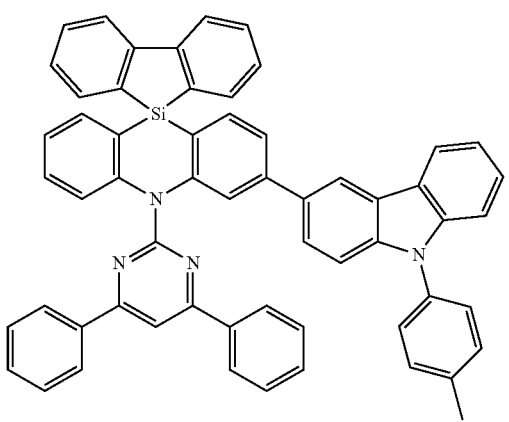
[B-25]
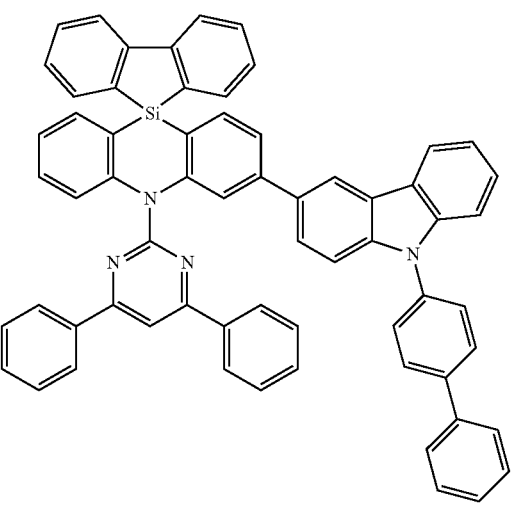
[B-26]
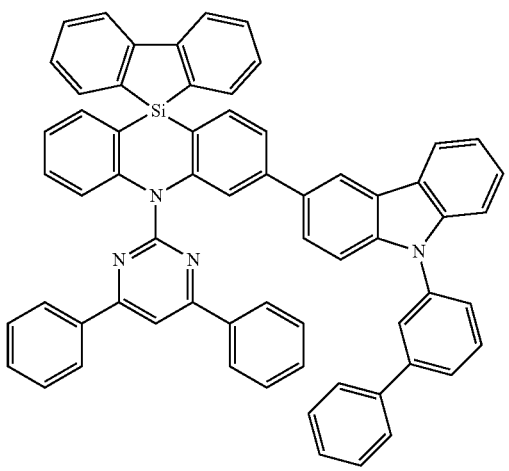

[B-27]
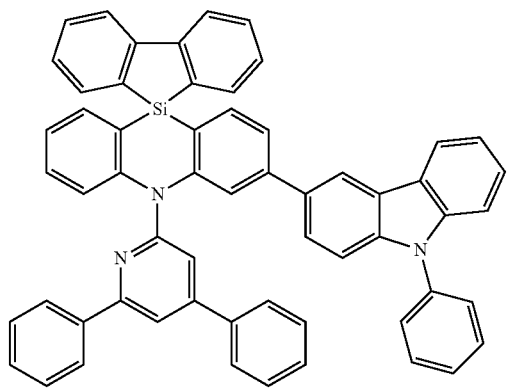
[B-28]
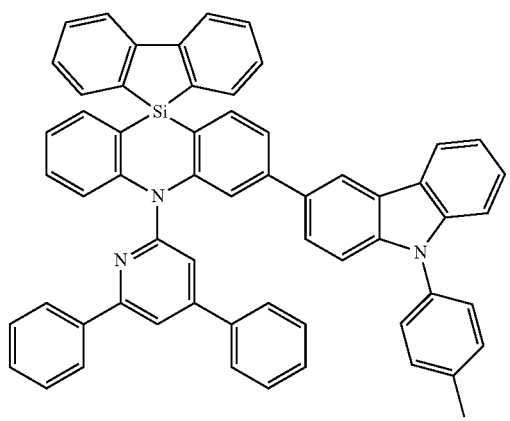
[B-29]
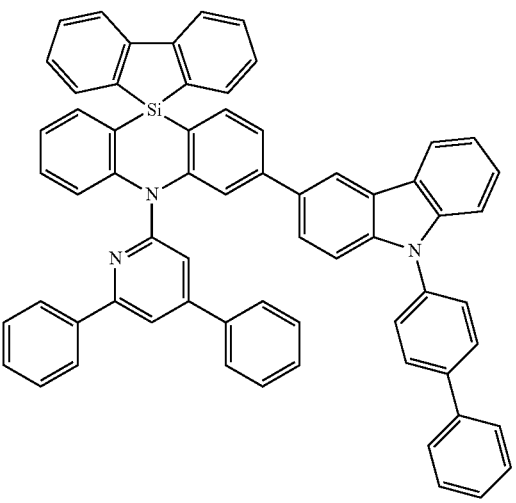
[B-30]
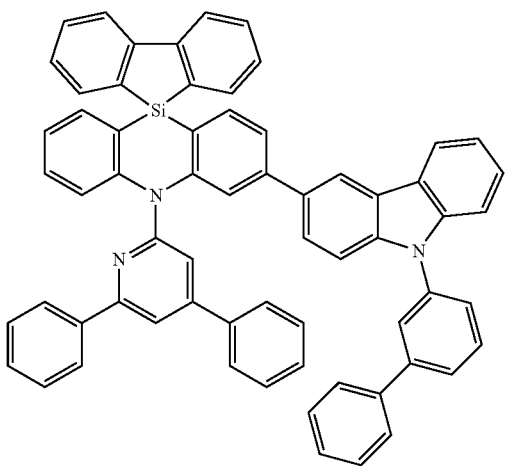
[B-31]
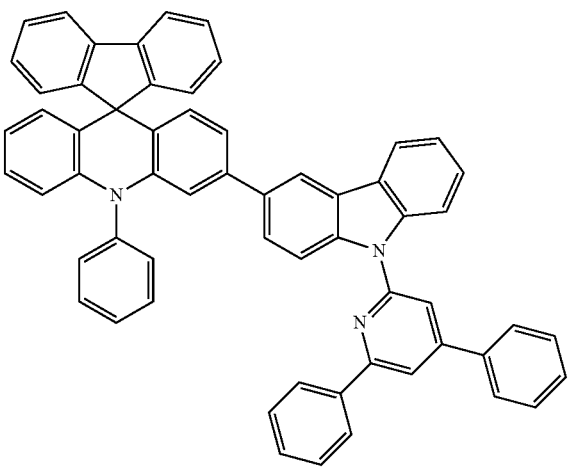
[B-32]
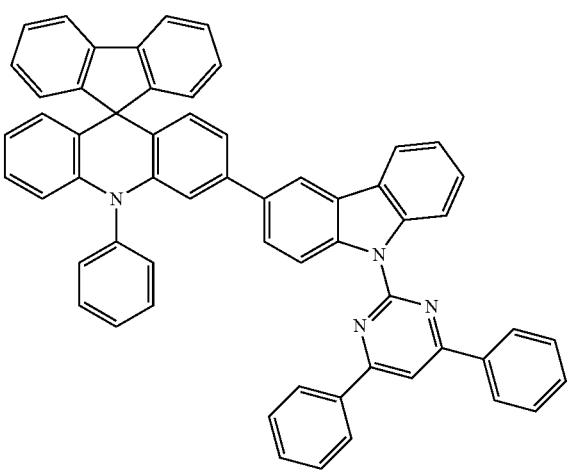

[B-33]
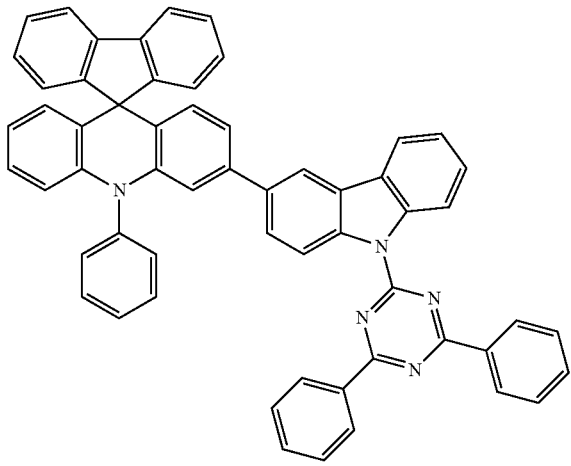
[B-34]
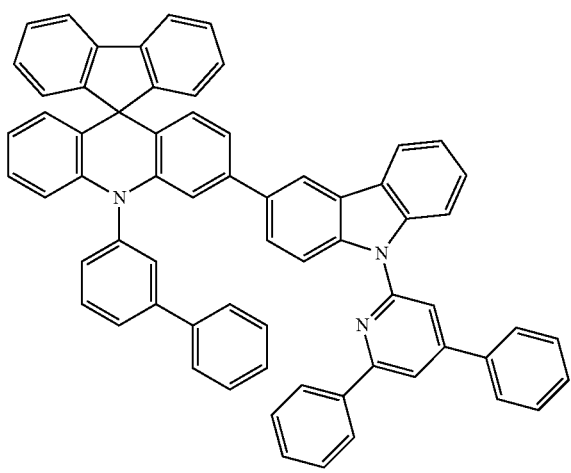
[B-35]
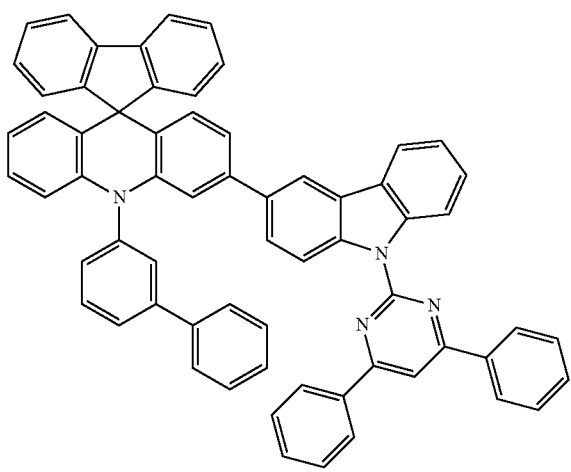
[B-36]
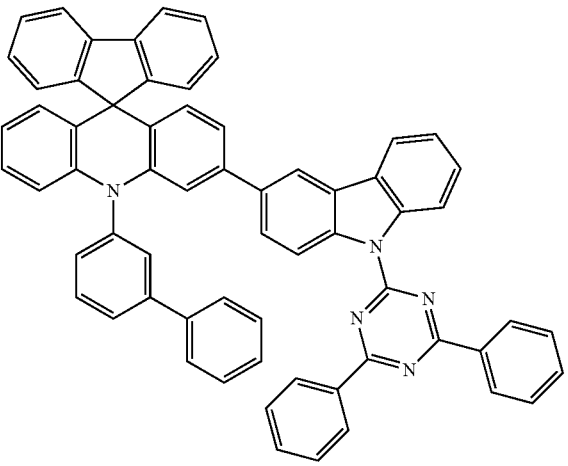
[B-37]
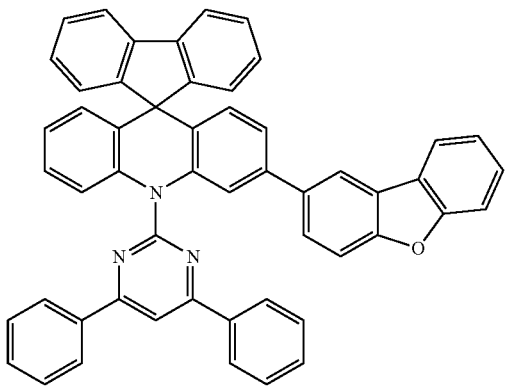
[B-38]
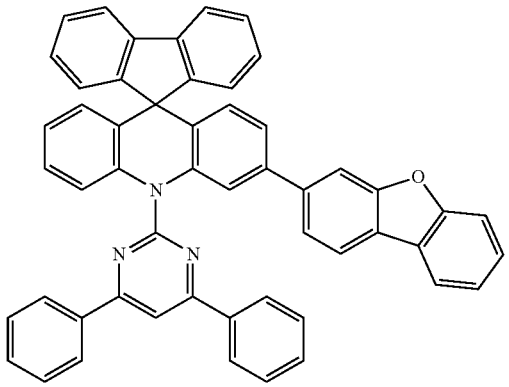

[B-39]
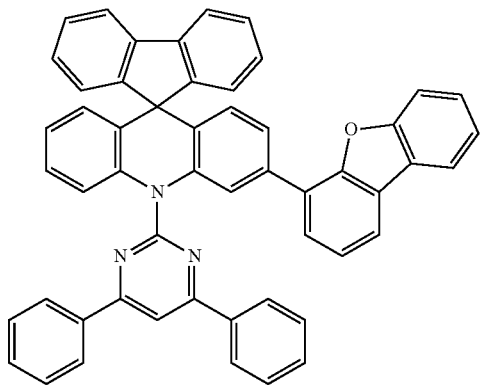
[B-40]
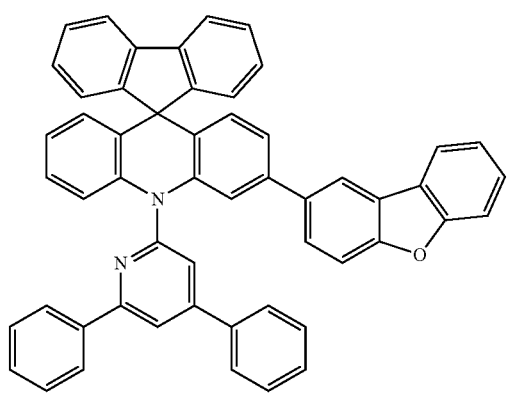
[B-41]
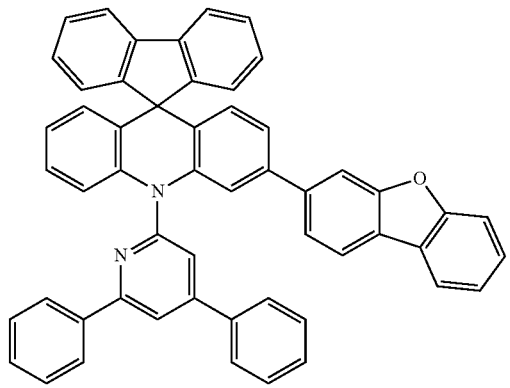
[B-42]
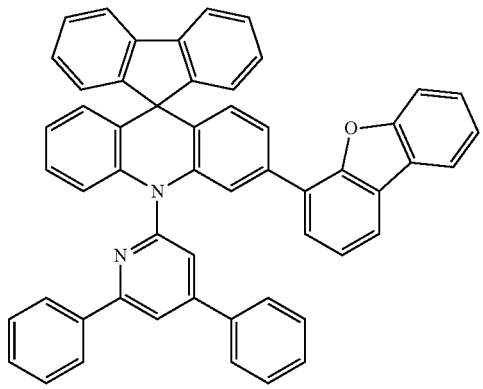
[B-43]
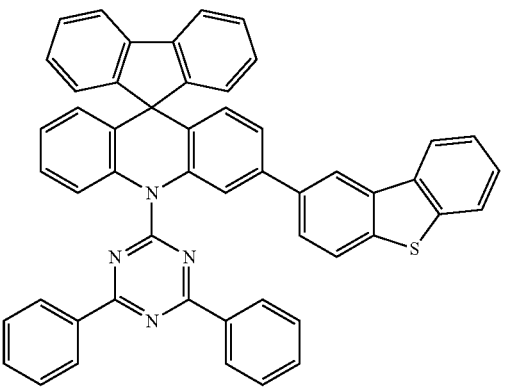
[B-44]
[B-45]
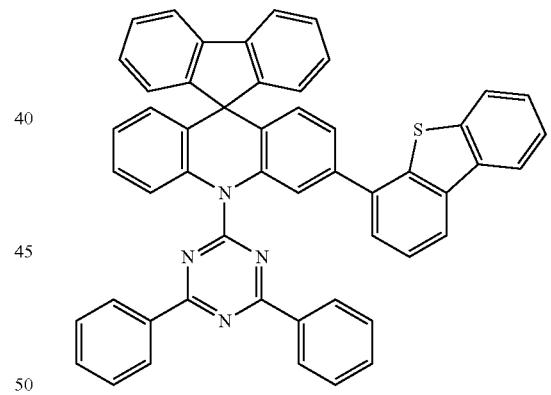
[B-46]
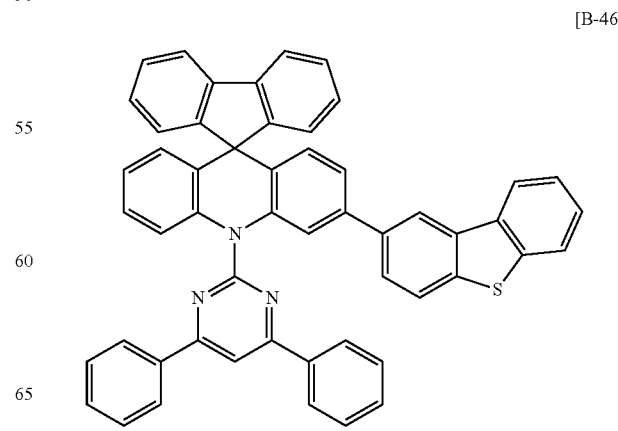

[B-47]
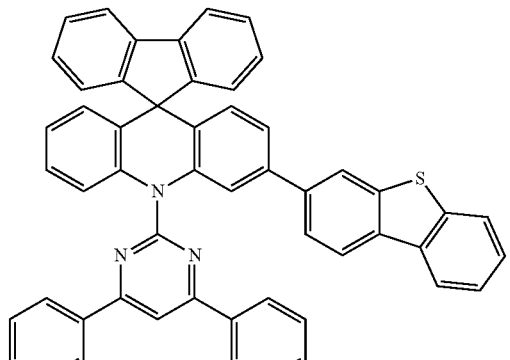
[B-48]
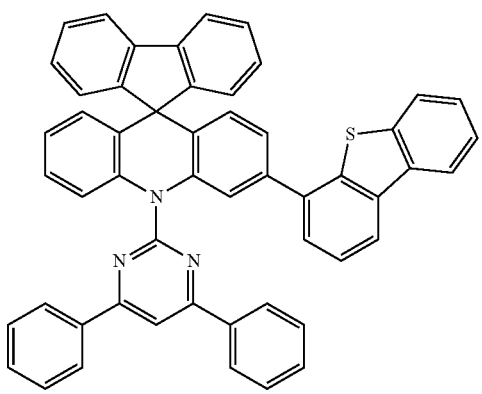
[B-49]
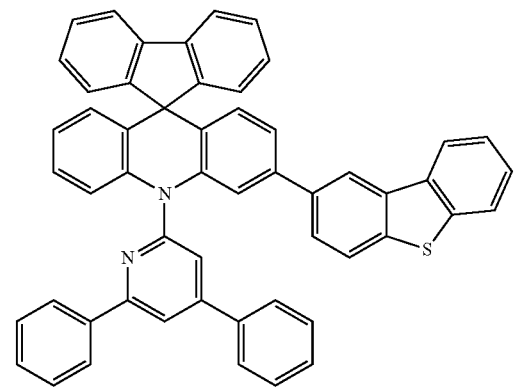
[B-50]
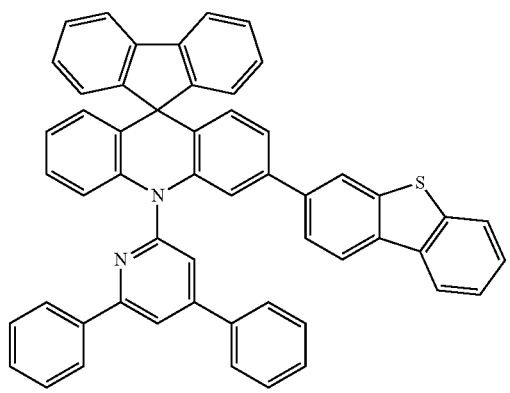
[B-51]
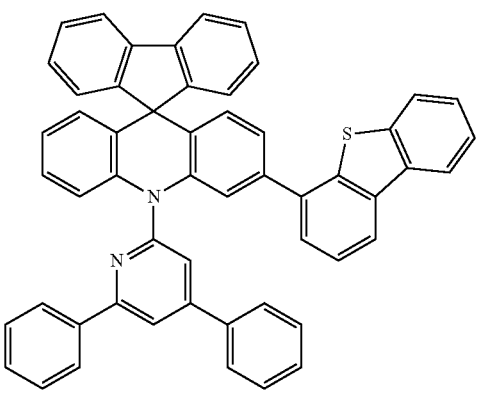
[B-52]
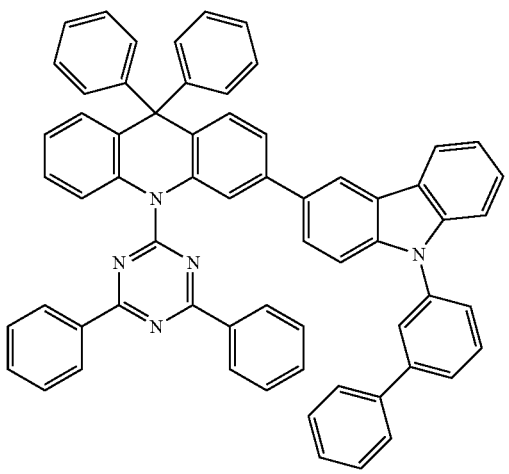
[B-53]
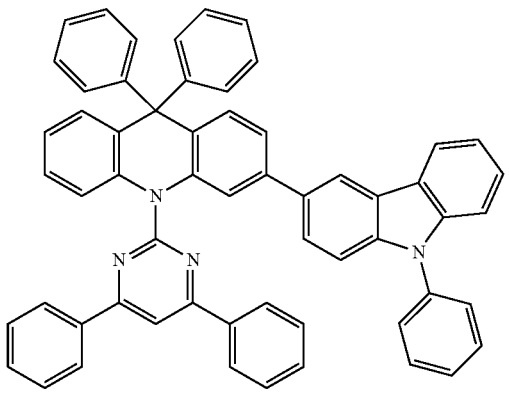

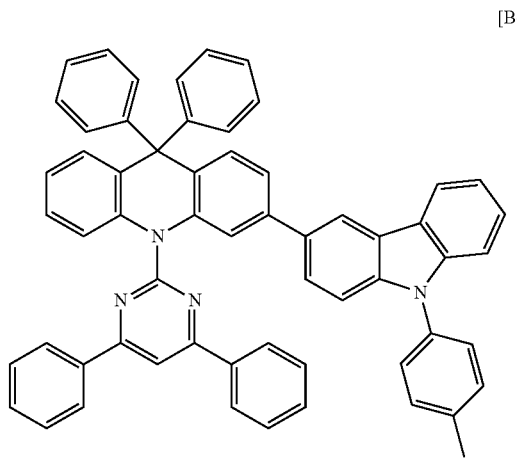
[B-54]
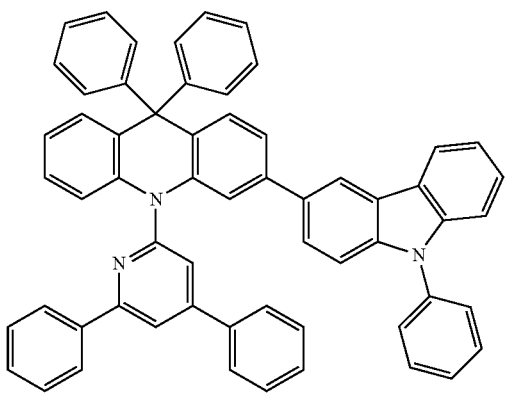
[B-57]
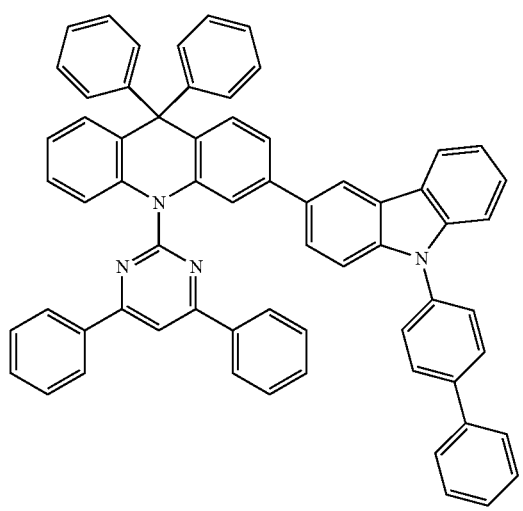
[B-55]
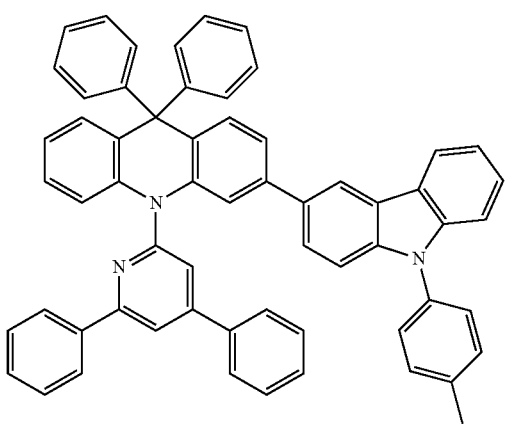
[B-58]
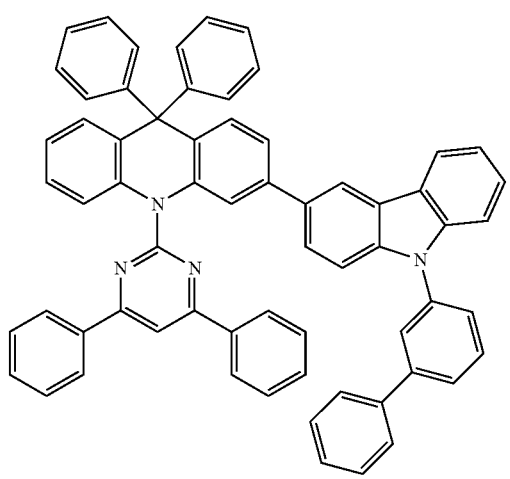
[B-56]
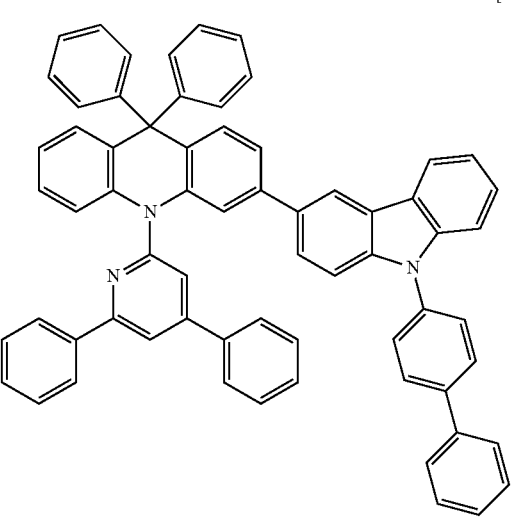
[B-59]

-continued

[B-60]

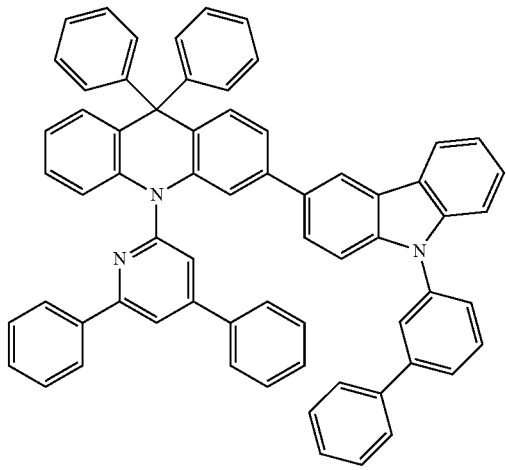

The compound for an organic optoelectronic device has a maximum light emitting wavelength in a range of about 320 to about 520 nm and a triplet excited energy (T1) ranging from greater than or equal to about 2.0 eV, and specifically, from about 2.0 to about 4.0 eV, and thus may well transport a host charge having high triplet excited energy to a dopant and increase luminous efficiency of the dopant, and is also freely adjusted regarding HOMO and LUMO energy levels and decreases a driving voltage, and accordingly may be usefully applied as a host material or a charge transport material.

In addition, the compound for an organic optoelectronic device has photoactive and electrical activities, and thus may be usefully applied for a nonlinear optic material, an electrode material, a discolored material, a light switch, a sensor, a module, a wave guide, an organic transistor, a laser, a light absorbent, a dielectric material, a separating membrane, and the like.

The compound for an organic optoelectronic device including the compounds has a glass transition temperature of greater than or equal to 90° C. and a thermal decomposition temperature of greater than or equal to 400° C., indicating improved thermal stability. Thereby, it is possible to produce an organic optoelectronic device having high efficiency.

The compound for an organic optoelectronic device including the compounds may play a role of emitting light or injecting and/or transporting electrons, and may also act as a light emitting host with an appropriate dopantIn other words, the compound for an organic optoelectronic device may be used as a phosphorescent or fluorescent host material, a blue light emitting dopant material, or an electron transport material.

Since the compound for an organic optoelectronic device according to one embodiment is used for an organic thin layer, and it may improve the life-span characteristic, efficiency characteristic, electrochemical stability, and thermal stability of an organic optoelectronic device, and decrease the driving voltage.

Further, according to another embodiment, an organic optoelectronic device that includes the compound for an organic optoelectronic device is provided. The organic optoelectronic device may include an organic photoelectric device, an organic light emitting diode, an organic solar cell, an organic transistor, an organic photoconductor drum, an organic memory device, and the like. Particularly, the compound for an organic optoelectronic device according to one embodiment may be included in an electrode or an electrode buffer layer in an organic solar cell to improve the quantum efficiency, and it may be used as an electrode material for a gate, a source-drain electrode, or the like in the organic transistor.

Hereinafter, an organic light emitting diode is described.

According to another embodiment of the present invention, an organic light emitting diode includes an anode, a cathode, and at least one organic thin layer between the anode and the cathode, and at least one organic thin layer may include the compound for an organic optoelectronic device according to one embodiment of the present invention.

The organic thin layer that may include the compound for an organic optoelectronic device may include a layer selected from the group consisting of an emission layer, a hole transport layer (HTL), a hole injection layer (HIL), an electron transport layer (ETL), an electron injection layer (EIL), a hole blocking layer, and a combination thereof. The at least one layer includes the compound for an organic optoelectronic device according to one embodiment. Particularly, the compound for an organic optoelectronic device according to one embodiment may be included in a hole transport layer (HTL) or a hole injection layer (HIL). In addition, when the compound for an organic optoelectronic device is included in the emission layer, the compound for an organic optoelectronic device may be included as a phosphorescent or fluorescent host, and particularly, as a fluorescent blue dopant material.

Figure 2:
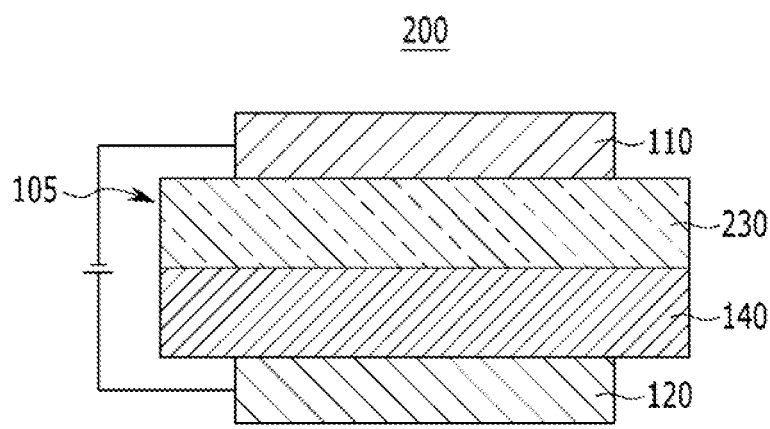

FIGS. 1 and 2 are cross-sectional views of each organic light emitting diode according to one embodiment.

Referring to FIG. 1, an organic optoelectronic device 100 according to one embodiment includes an anode 120 and a cathode 110 facing each other and an organic layer 105 interposed between the anode 120 and cathode 110.

The anode 120 may be made of a conductor having a large work function to help hole injection, and may be for example metal, metal oxide and/or a conductive polymer. The anode 120 may be, for example a metal nickel, platinum, vanadium, chromium, copper, zinc, gold, and the like or an alloy thereof; metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDT), polypyrrole, and polyaniline, but is not limited thereto.

The cathode 110 may be made of a conductor having a small work function to help electron injection, and may be for example metal, metal oxide and/or a conductive polymer. The cathode 110 may be for example a metal or an alloy thereof such as magnesium, calcium, sodium, potassium, titanium, indium, yttrium, lithium, gadolinium, aluminum silver, tin, lead, cesium, barium, and the like; a multi-layer structure material such as LiF/Al, $LiO_2$/Al, LiF/Ca, LiF/Al and $BaF_2$/Ca, but is not limited thereto.

The organic layer 105 includes an emission layer 130 including the organic compound.

The emission layer 130 may include, for example the compound for an organic optoelectronic device at alone or with at least two of the compounds for an organic photoelectric device or as a mixture with other different compound from the compound for an organic optoelectronic device. When the compound for an organic optoelectronic device is mixed with the other compound, for example they may be included as a host and a dopant, wherein the compound for an organic optoelectronic device may be, for example included as a host. The host may be, for example phosphorescent host or fluorescent host, for example a phosphorescent host.

When the compound for an organic optoelectronic device is included as a host, the dopant may be selected from well-known inorganic, organic, organic/inorganic compound as a dopant.

Referring to FIG. 2, an organic light emitting diode 200 further includes a hole auxiliary layer 140 as well as an emission layer 230. The hole auxiliary layer 140 may further increase hole injection and/or hole mobility between the anode 120 and emission layer 230 and block electrons. The hole auxiliary layer 140 may be, for example a hole transport layer (HTL), a hole injection layer (HIL), and/or an electron blocking layer, and may include at least one layer. The above organic compound may be included in the emission layer 230 and/or the hole auxiliary layer 140. In one embodiment of the present invention, an organic light emitting diode may further include an electron transport layer (ETL), an electron injection layer (EIL), a hole injection layer (HIL), and the like, as an organic thin layer 105 in FIG. 1 or FIG. 2.

The organic light emitting diodes 100 and 200 may be manufactured by forming an anode or a cathode on a substrate, forming an organic layer in accordance with a dry coating method such as evaporation, sputtering, plasma plating, and ion plating; or a wet coating method such as spin coating, slit coating, dipping, flow coating and inkjet printing; and forming a cathode or an anode thereon.

The organic light emitting diode may be applied to a display device.

Hereinafter, the embodiments are illustrated in more detail with reference to examples. These examples, however, are not in any sense to be interpreted as limiting the scope of the invention.

(Preparation of Compound for Organic Optoelectronic Device)

Example 1

Synthesis of Compound Represented by Chemical Formula (A-1)

A compound represented by the above Chemical Formula (A-1) as specific examples of a compound for an organic optoelectronic device according to the present invention was synthesized according to the following Reaction Scheme 1.

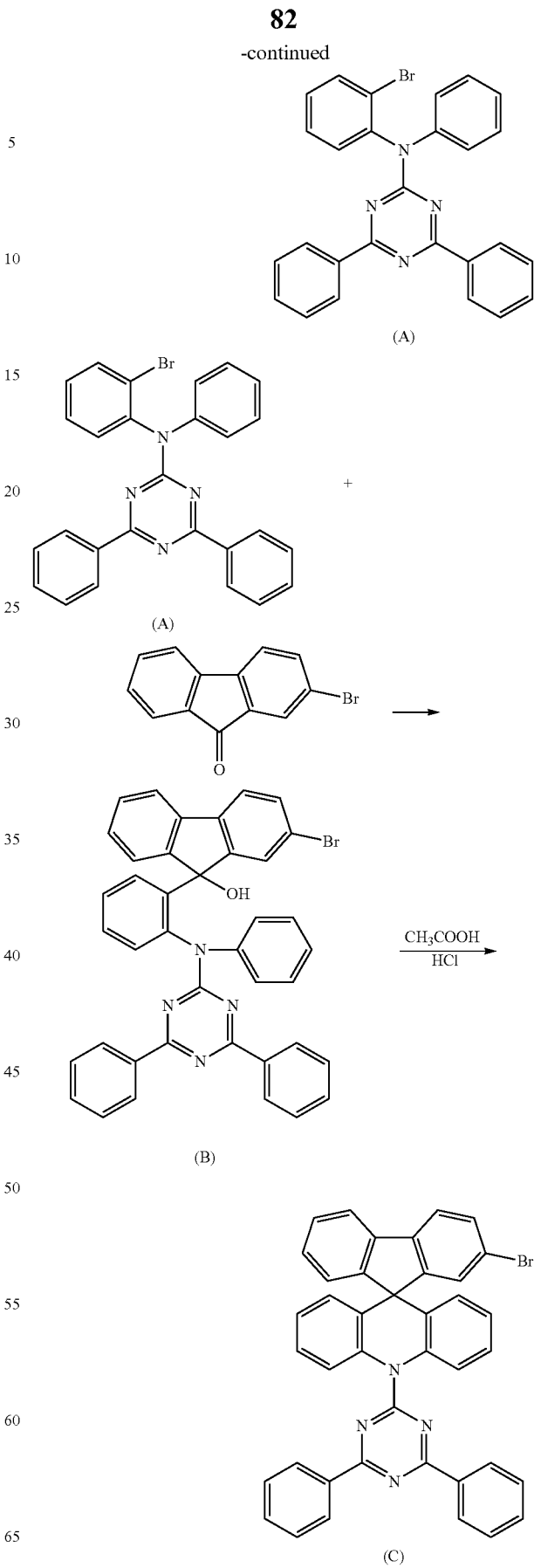

-continued

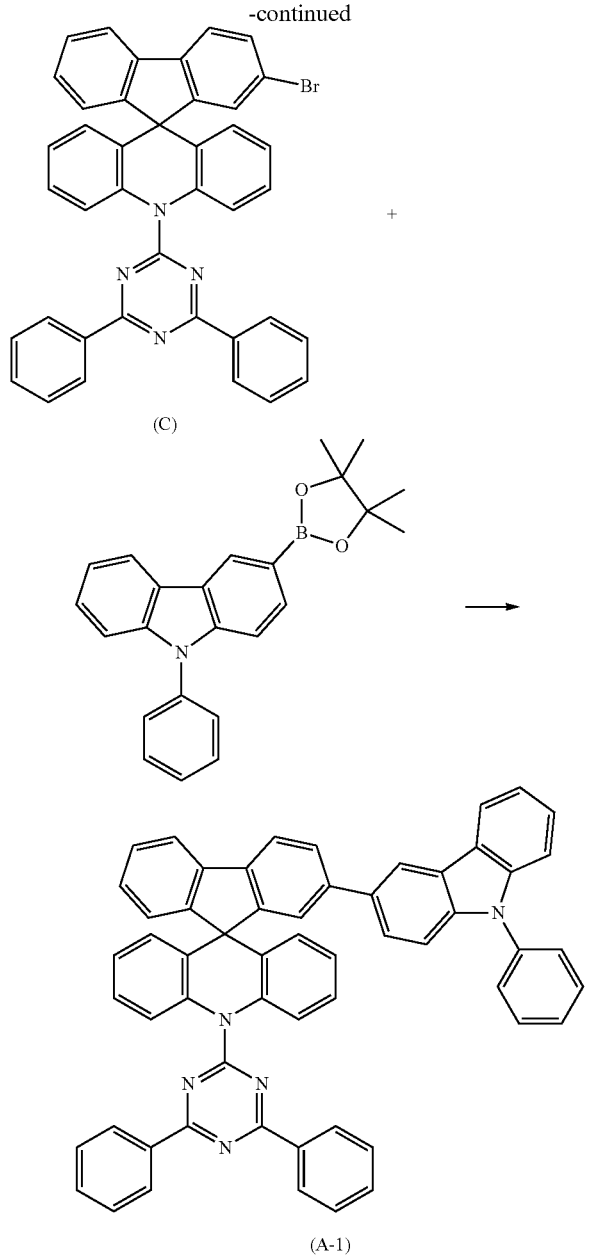

First Step; Synthesis of Compound (A)

30 g (120 mmol) of 2-bromo aniline, 38.8 g (150 mmol) of 1-chloro-3,5-phenyl triazine, and 7.3 g (300 mmol) of sodium hydride were agitated in 900 ml of dimethyl formaldehyde in a 2000 mL round flask at room temperature for 24 hours. After removing non-reaction sodium hydride by slowly dropping the reaction solution to distilled water, the reaction solution was poured into an excessive water of distilled water, and the mixture was filtered. The obtained solid was dissolved in an excessive amount of methylene chloride, the solution was hot-filtered, methylene chloride was removed therefrom again, and a solid obtained by precipitating the resultant in methanol was filtered, obtaining 40.5 g of a compound (A) (a yield of 70%).

The elemental analysis result of the compound (A) was provided as follows.

calcd. $C_{27}H_{19}BrN_4$: C, 67.65; H, 4.00; Br, 16.67; N, 11.69. found: C, 67.35; H, 4.03; N, 10.88.

Second Step: Synthesis of Compound (C)

30 g (62.5 mmol) of the compound (A) was put in a 500 mL round flask and dissolved in 300 mL of tetrahydrofuran after making its reaction atmosphere be in a nitrogen state, and a temperature around a reactor was maintained at −78° C. Then, 25 mL of 2.5 M-normal butyl lithium was slowly added thereto in a dropwise fashion. When the addition was complete, the mixture was agitated for 30 minutes, and a solution obtained by dissolving 16.2 g (62.5 mmol) of 2-bromo fluoreneol in 200 mL of purified tetrahydrofuran was slowly added thereto. The reaction solution was agitated for about one hour while maintained at −78° C. and then, heated up to room temperature and kept being agitated until the next day morning. After completing a reaction by adding a 5 wt % sodium bicarbonate aqueous solution to the reaction solution, the resultant was separately extracted by using methylene chloride. The obtained organic layer was distilled under a reduced pressure after removing water remaining there with magnesium sulfate, obtaining an intermediate (B). The unpurified intermediate (B) was put in 400 mL of acetic acid, hydrochloric acid in a catalyst amount was added thereto, and the mixture was agitated for 12 hours at a reflux temperature. When the reaction was complete, 24 g of a compound (C) was obtained through column chromatography (a yield of 62%).

The elemental analysis result of the compound (C) was provided as follows.

calcd. $C_{40}H_{25}BrN_4$: C, 74.88; H, 3.93; Br, 12.45; N, 8.73. found: C, 74.65; H, 3.91; N, 8.75

Third Step: Synthesis of Compound (A-1)

20 g (31.1 mmol) of the compound (C), 11.5 g (31.1 mmol) of a 3-(4,4,5,5-tetramethyl-1,3,2-dioxaborane-N-phenyl-carbazole compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid therein was filtered and dissolved in monochlorobenzene, and the solution was filtered with silica gel/Celite. After removing an organic solvent in an appropriate amount therefrom, the resultant was recrystallized in MeOH, obtaining 11.4 g of a compound (A-1) (a yield of 50%).

The elemental analysis result of the compound (A-1) was provided as follows.

calcd. $C_{58}H_{37}N_5$: C, 86.65; H, 4.64; N, 8.71. found: C, 86.71; H, 4.64; N, 8.75

Example 2

Synthesis of Compound Represented by Chemical Formula (A-6)

A compound represented by the above Chemical Formula (A-6) as specific examples of a compound for an organic optoelectronic device of the present invention was synthesized according to the following Reaction Scheme 2.

[Reaction Scheme 2]

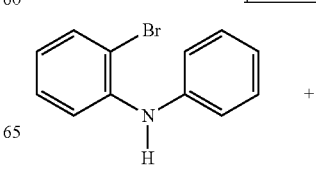

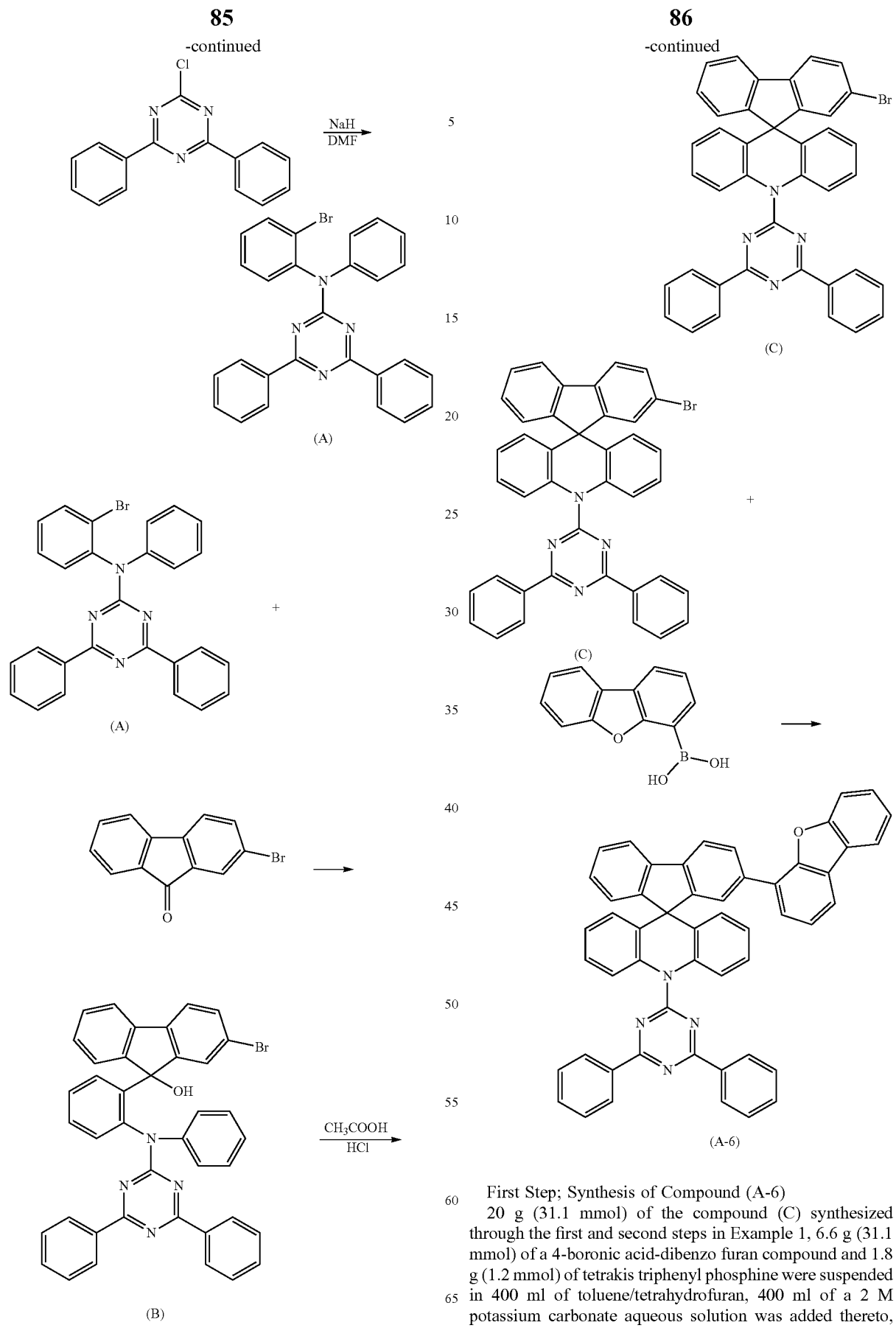

First Step; Synthesis of Compound (A-6)

20 g (31.1 mmol) of the compound (C) synthesized through the first and second steps in Example 1, 6.6 g (31.1 mmol) of a 4-boronic acid-dibenzo furan compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid therein was filtered and dissolved in monochlorobenzene, and the solution was filtered with silica gel/Celite. After removing an organic solvent in an appropriate amount therefrom, the resultant was recrystallized in MeOH, obtaining 11.4 g of a compound (A-6) (a yield of 50%).

The elemental analysis result of the compound (A-6) was provided as follows.

calcd. $C_{52}H_{32}N_4O$: C, 85.69; H, 4.43; N, 7.69; O, 2.20.
found: C, 85.69; H, 4.43; N, 7.69

Example 3

Synthesis of Compound Represented by Chemical Formula (A-26)

A compound represented by the above Chemical Formula (A-26) as specific examples of a compound for an organic optoelectronic device of the present invention was synthesized according to the following Reaction Scheme 3.

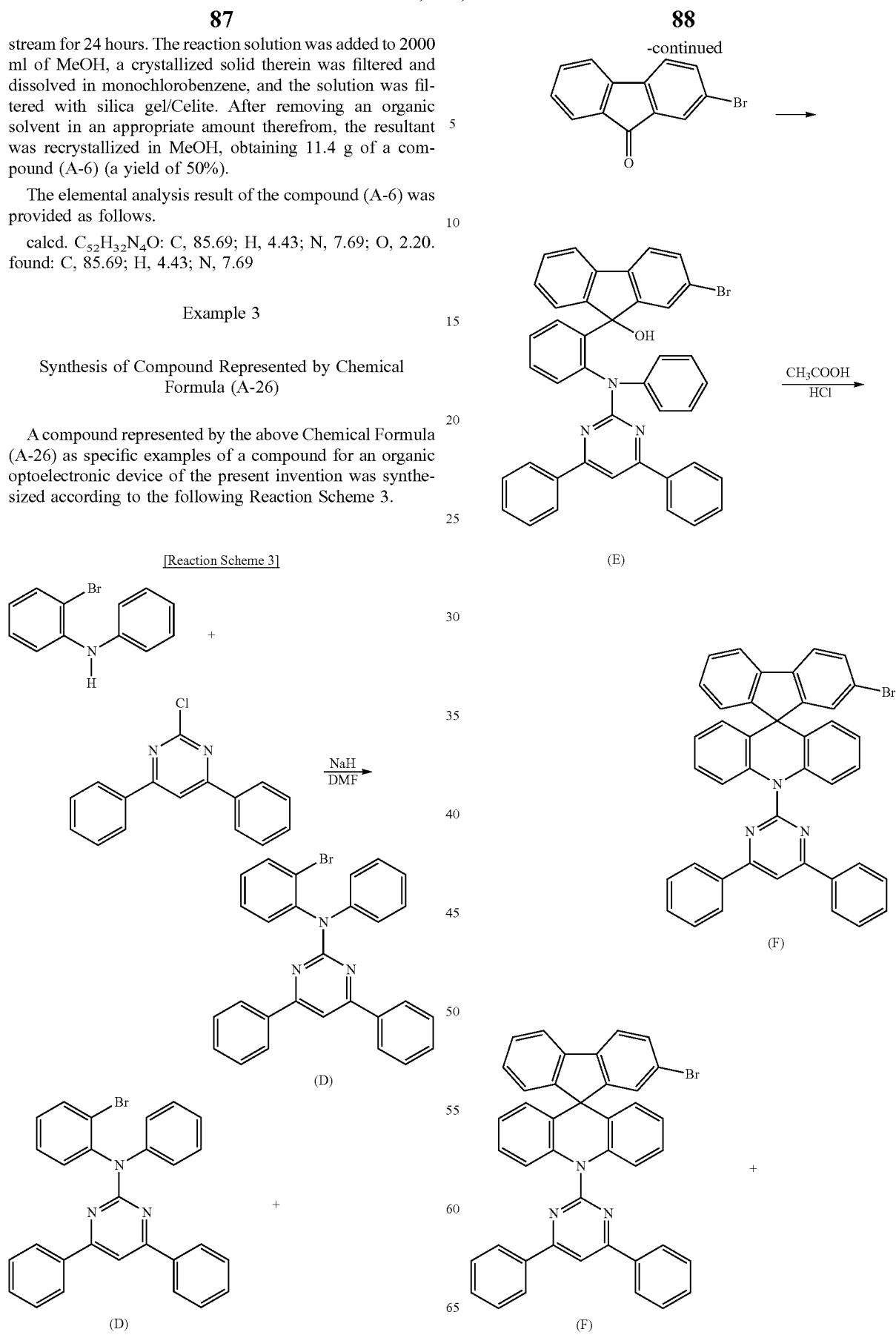

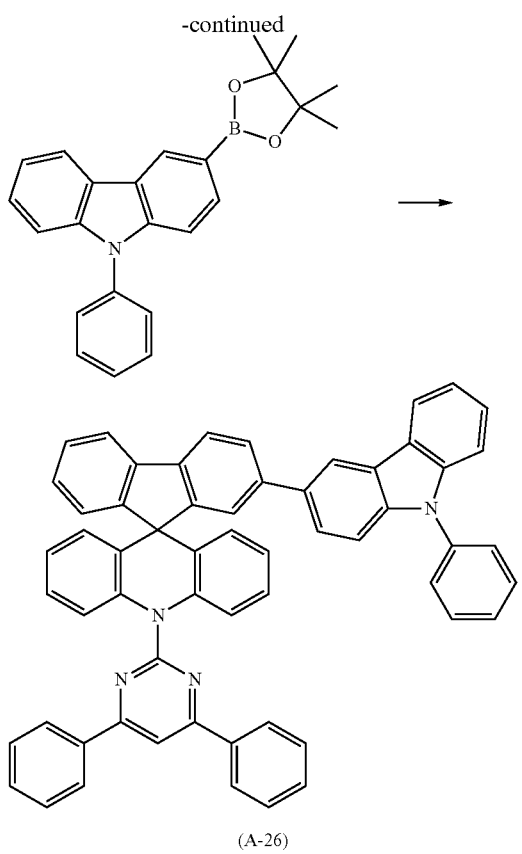

(A-26)

First Step; Synthesis of Compound (D)

30 g (120 mmol) of 2-bromo aniline, 38.8 g (150 mmol) of 1-chloro-3,5-phenyl pyrimidine, and 7.3 g (300 mmol) of sodium hydride were put in 900 ml of dimethyl formaldehyde in a 2000 mL round flask, and the mixture was agitated at room temperature for 24 hours. After removing non-reaction sodium hydride by slowly dropping the reaction solution to distilled water, the reaction solution was poured into an excessive amount of distilled water again, and then, the mixture was filtered. The obtained solid was dissolved in an excessive amount of methylene chloride, the solution was hot-filtered, methylene chloride was removed therefrom again, and a solid obtained by precipitating the resultant in methanol was filtered, obtaining 36.5 g of a compound (D) (a yield of 66%).

The elemental analysis result of the compound (D) was provided as follows.

calcd. $C_{28}H_{20}BrN_3$: C, 70.30; H, 4.21; Br, 16.70; N, 8.78. found: C, 70.32; H, 4.20; N, 8.90

Second Step: Synthesis of Compound (F)

30 g (62.5 mmol) of the compound (D) was put in a 500 mL round flask and then, dissolved in 300 mL of purified tetrahydrofuran after making its reaction atmosphere be in a nitrogen state, and a temperature around a reactor was maintained at −78° C. Then, 25 mL of 2.5 M-normal butyl lithium was slowly added thereto in a dropwise fashion. When the addition was complete, the mixture was agitated for 30 minutes, and a solution obtained by dissolving 16.2 g (62.5 mmol) of 2-bromo fluoreneol in 200 mL of purified tetrahydrofuran was slowly added thereto. The reaction solution was agitated for about one hour while maintained at −78° C. and then, heated up to room temperature and kept being agitated until the next day morning. After completing the reaction by adding a 5 wt % sodium bicarbonate aqueous solution to the reaction solution, the mixture was separately extracted by using methylene chloride. The obtained organic layer was distilled under a reduced pressure after removing water remaining there by using magnesium sulfate, obtaining an intermediate (E). The unpurified intermediate (E) was put in 400 mL of acetic acid, hydrochloric acid in a catalyst amount was added thereto, and the mixture was agitated at a reflux temperature for 12 hours. When the reaction was complete, 28 g of a compound (F) was obtained through column chromatography (a yield of 64%).

The elemental analysis result of the compound (F) was provided as follows.

calcd. $C_{41}H_{26}BrN_3$: C, 76.88; H, 4.09; Br, 12.47; N, 6.56. found: C, 76.72; H, 4.15; N, 6.61

Third Step: Synthesis of Compound (A-26)

20 g (31.1 mmol) of the compound (F), 11.5 g (31.1 mmol) of a 3-(4,4,5,5-tetramethyl-1,3,2-dioxaborane-N-phenyl-carbazole compound and 1.8 g (1.2 mmol) of tetrakis triphenyl phosphine were suspended in 400 ml of toluene/tetrahydrofuran, 400 ml of a 2 M potassium carbonate aqueous solution were added thereto, and the mixture was heated and refluxed under a nitrogen stream for 24 hours. The reaction solution was added to 2000 ml of MeOH, a crystallized solid therein was filtered and dissolved in monochlorobenzene, and the solution was filtered with silica gel/Celite. After removing an organic solvent in an appropriate amount therefrom, the resultant was recrystallized with MeOH, obtaining 13 g of a compound (A-26) (a yield of 55%).

The elemental analysis result of the compound (A-26) was provided as follows.

calcd. $C_{59}H_{38}N_4$: C, 88.25; H, 4.77; N, 6.98. found: C, 88.21; H, 4.69; N, 7.01

Example 4

Synthesis of Compound Represented by Chemical Formula (A-36)

A compound represented by the above Chemical Formula A-36 as specific examples of a compound for an organic optoelectronic device of the present invention was synthesized through the following Reaction Scheme 4.

[Reaction Scheme 4]

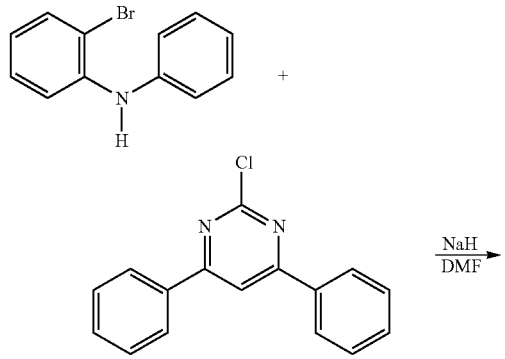

-continued

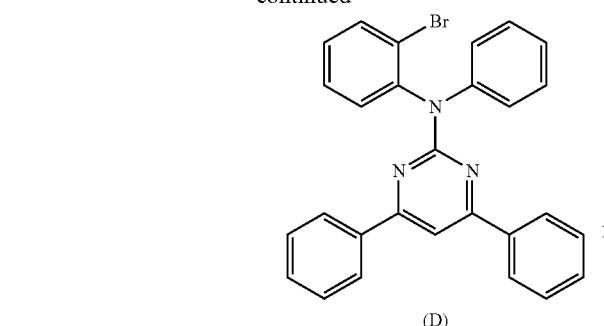

(D)

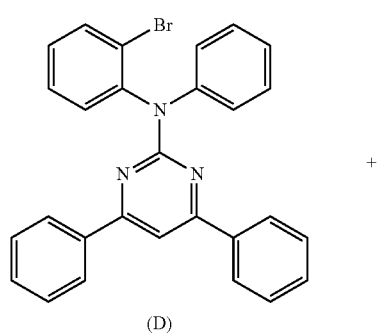

(D)

+

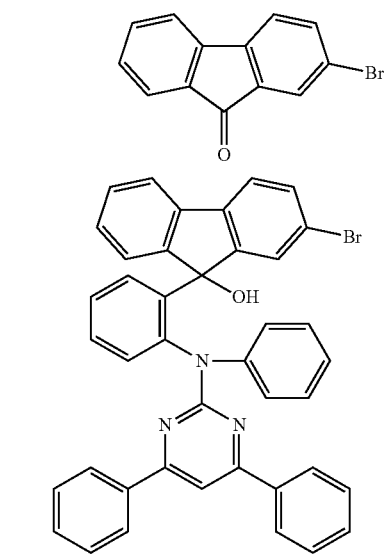

(E)

CH₃COOH
⎯⎯⎯⎯→
HCl

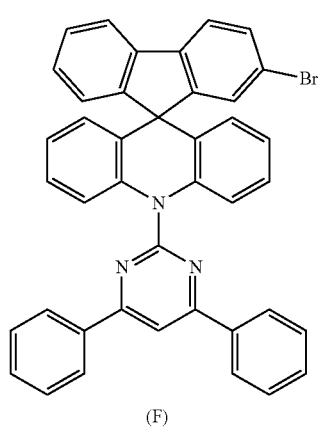

(F)

-continued

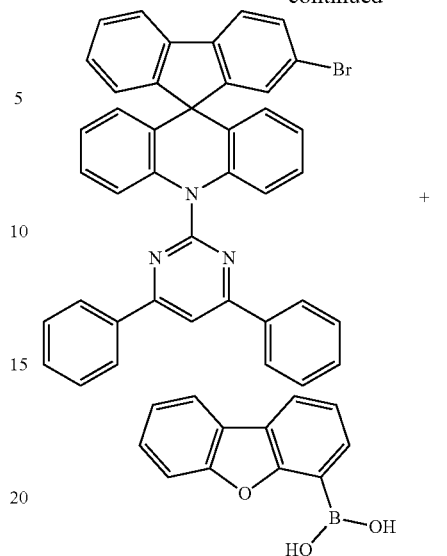

+

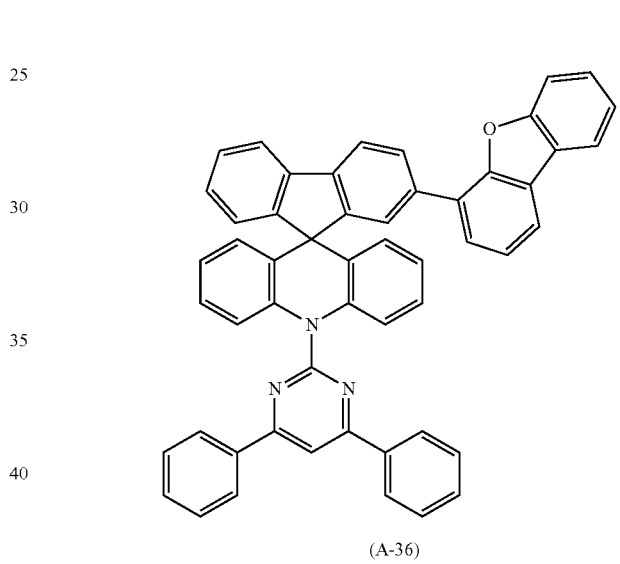

(A-36)

First Step; Synthesis of Compound (A-36)

20 g (31.1 mmol) of the compound (F) synthesized through the steps 1 and 2 in Example 3, 6.6 g (31.1 mmol) of a 4-boronic acid-dibenzo furan compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid therein was filtered and dissolved in monochlorobenzene, and then, the solution was filtered with silica gel/Celite. After removing an organic solvent in an appropriate amount therefrom, the resultant was recrystallized with MeOH, obtaining 14 g of a compound A-36 (a yield of 60%).

The elemental analysis result of the compound A-36 was provided as follows.

calcd. $C_{53}H_{33}N_3O$: C, 87.46; H, 4.57; N, 5.77; O, 2.20. found: C, 87.36; H, 4.60; N, 5.77

Example 5
Synthesis of Compound Represented by Chemical Formula (A-22)
A compound represented by the above Chemical Formula A-22 as specific examples of a compound for an organic optoelectronic device of the present invention was synthesized according to the following Reaction Scheme 5.
[Reaction Scheme 5]
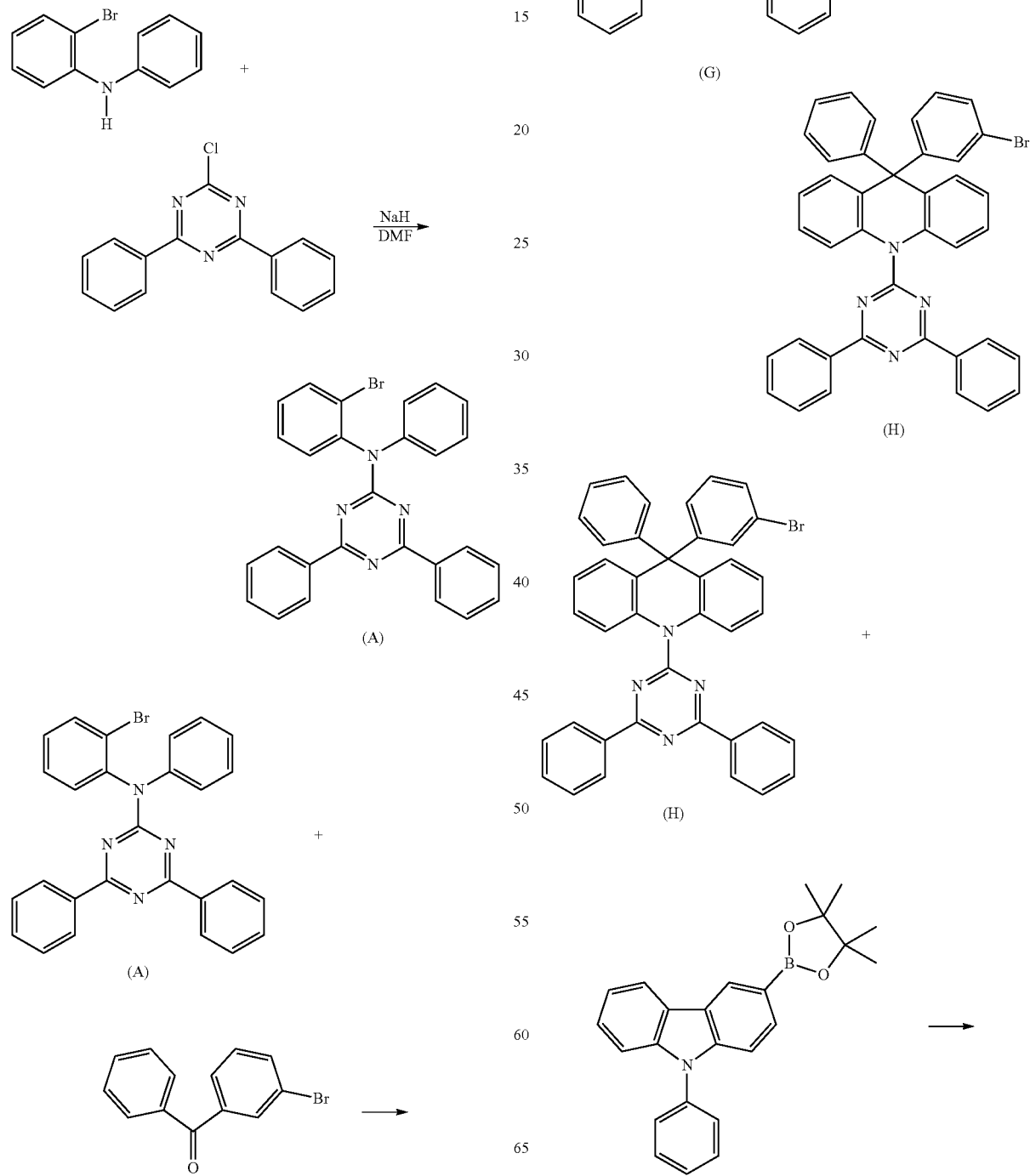

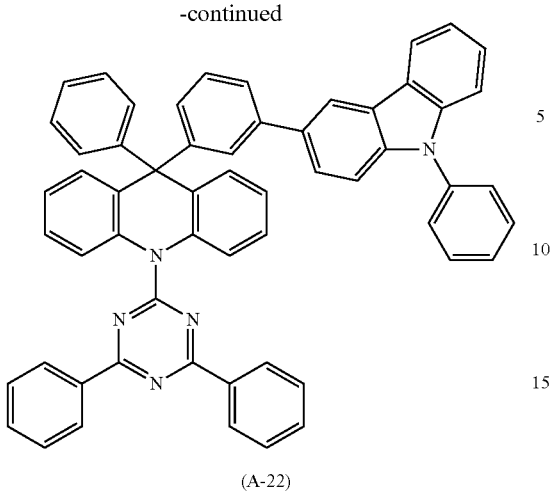

(A-22)

First Step; Synthesis of Compound (H)

30 g (62.5 mmol) of the compound (A) synthesized through the step 1 of Example 1 was put in a 500 mL round flask and then, dissolved in 300 mL of purified tetrahydrofuran after making its reaction atmosphere be in a nitrogen state, and then, a temperature around a reactor was maintained at −78° C. Then, 25 mL of 2.5 M-normal butyl lithium was slowly added thereto in a dropwise fashion. When the addition was complete, the mixture was agitated for 30 minutes, and a solution obtained by dissolving 16.2 g (62.5 mmol) of 3-bromo benzophenone in 200 mL of purified tetrahydrofuran was slowly added thereto in a dropwise fashion. The reaction solution was agitated for about 1 hour while maintained at about −78° C. and then, heated up to room temperature and kept being agitated until the next day morning. After completing the reaction by adding a 5 wt % sodium bicarbonate aqueous solution thereto, the mixture was separately extracted by using methylene chloride. The obtained organic layer therefrom was distilled under a reduced pressure after removing water remaining therein by using magnesium sulfate, obtaining an intermediate (G). The unpurified intermediate (G) was put in 400 mL of acetic acid, hydrochloric acid in a catalyst amount was added thereto, and the mixture was agitated at a reflux temperature for 12 hours. When the reaction was complete, 24 g of a compound (H) was obtained through column chromatography (a yield of 62%).

The elemental analysis result of the compound (H) was provided as follows.

calcd. $C_{40}H_{27}BrN_4$: C, 74.65; H, 4.23; Br, 12.42; N, 8.71. found: C, 74.67; H, 4.21; N, 8.72

Second Step: Synthesis of Compound (A-22)

20 g (31.1 mmol) of the compound (H), 11.5 g (31.1 mmol) of a 3-(4,4,5,5-tetramethyl-1,3,2-dioxaborane-N-phenyl-carbazole compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid therein was filtered and dissolved in monochlorobenzene, and the solution was filtered with silica gel/Celite. After removing an organic solvent in an appropriate amount therefrom, the resultant was recrystallized with MeOH, obtaining 11 g of a compound (A-22) (a yield of 49%).

The elemental analysis result of the compound (A-22) was provided as follows.

calcd. $C_{58}H_{39}N_5$: C, 86.43; H, 4.88; N, 8.69. found: C, 86.41; H, 4.88; N, 8.72

Example 6

Synthesis of Compound Represented by Chemical Formula (A-111)

A compound represented by the above Chemical Formula A-111 as specific examples of a compound for an organic optoelectronic device of the present invention was synthesized according to the same method as the following Reaction Scheme 6.

[Reaction Scheme 6]

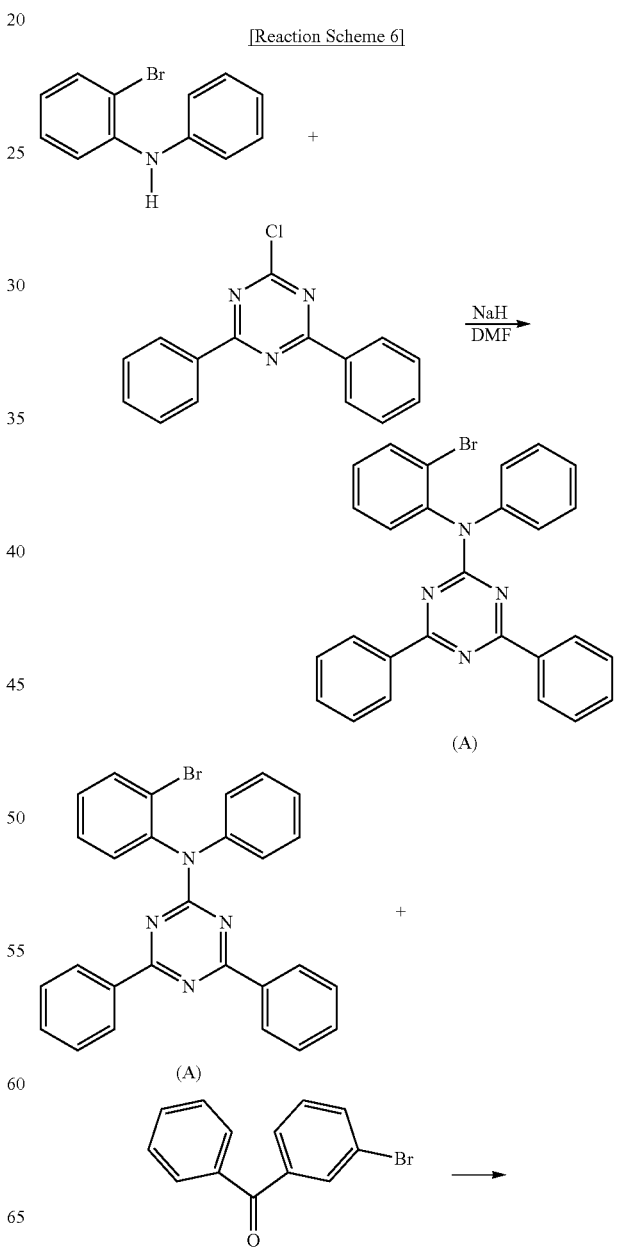

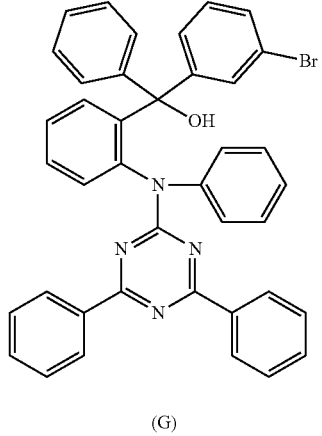

(G)

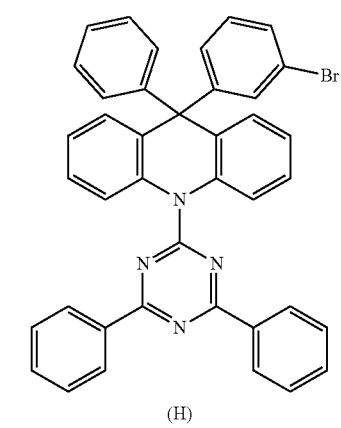

(H)

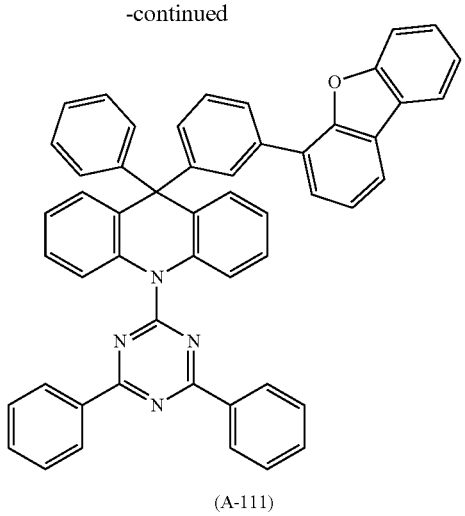

(A-111)

First Step; Synthesis of Compound (A-111)

20 g (31.1 mmol) of the compound (H) synthesized through the steps 1 and 2 in Example 5, 6.6 g (31.1 mmol) of a 4-boronic acid-dibenzo furan compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid therein was filtered and dissolved in monochlorobenzene, and the solution was filtered with silica gel/Celite. After removing an organic solvent in an appropriate amount therefrom, the resultant was recrystallized with MeOH, obtaining 12 g of a compound (A-111) (a yield of 54%).

The elemental analysis result of the compound (A-111) was provided as follows.

calcd. $C_{52}H_{34}N_4O$: C, 85.46; H, 4.69; N, 7.67; O, 2.19. found: C, 85.49; H, 4.65; N, 7.61

Example 7

Synthesis of Compound Represented by Chemical Formula (A-92)

A compound represented by the above Chemical Formula A-92 as specific examples of a compound for an organic optoelectronic device of the present invention was synthesized through the following Reaction Scheme 7.

[Reaction Scheme 7]

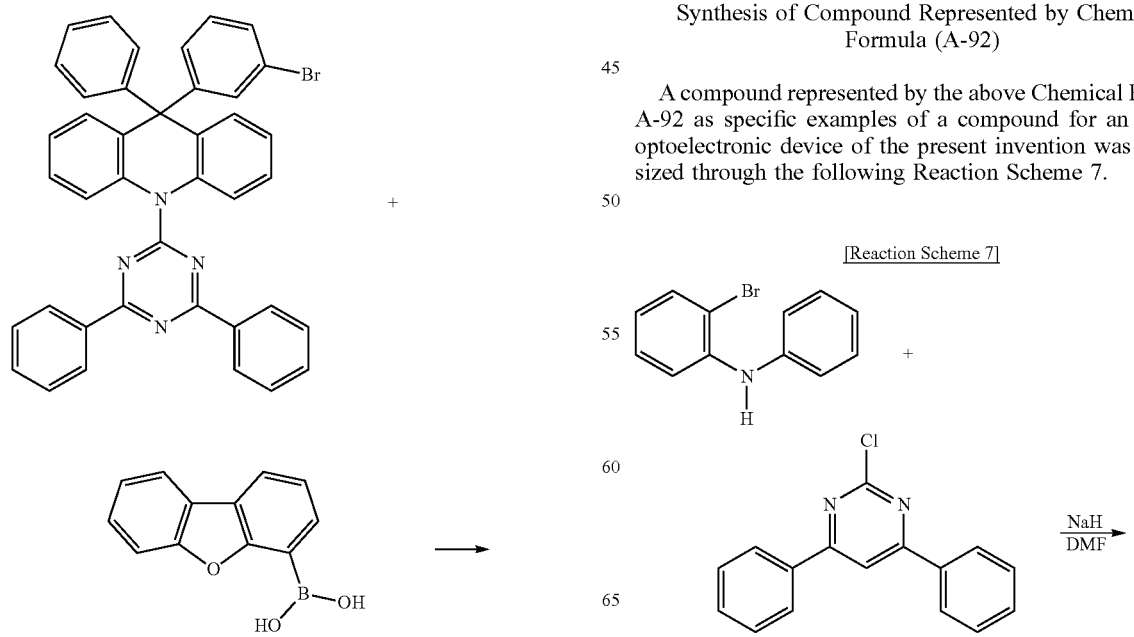

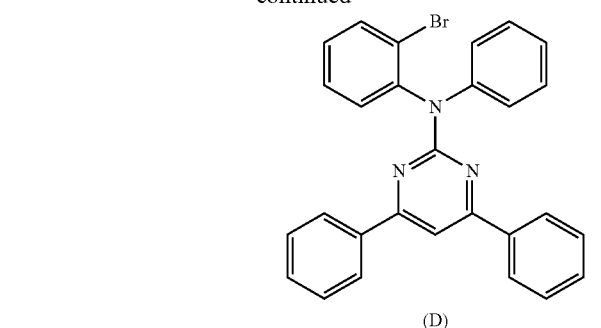

(D)

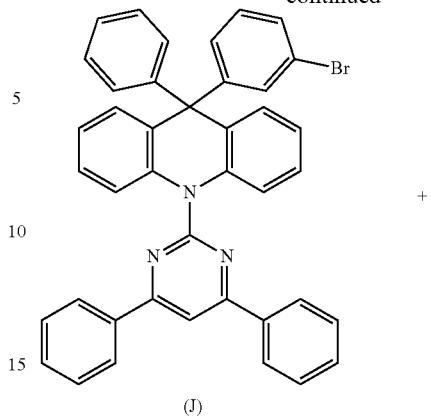

(J)

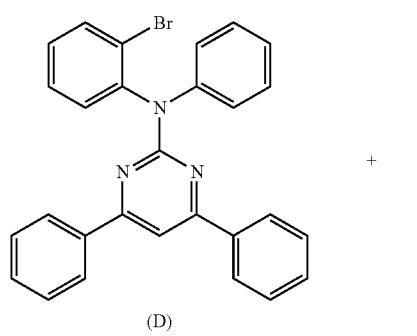

(D)

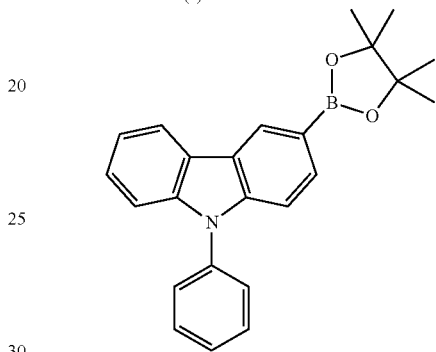

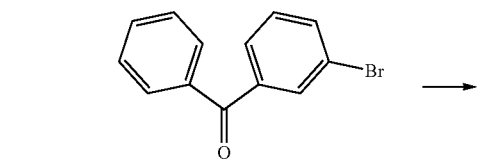

CH₃COOH / HCl →

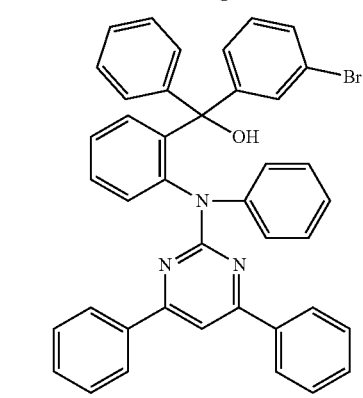

(I)

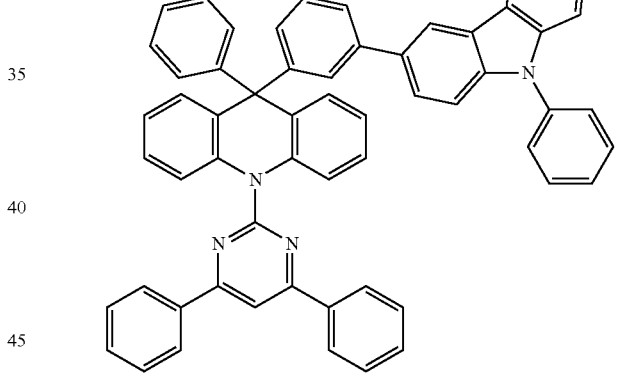

(A-92)

First Step; Synthesis of Compound (J)

30 g (62.5 mmol) of the compound (D) synthesized through the step 1 of Example 3 was put in a 500 mL round flask and then, dissolved in 300 mL of purified tetrahydrofuran after making the reaction atmosphere be in a nitrogen state, and a temperature around a reactor was maintained at −78° C. Then, 25 mL of a 2.5 M-normal butyl lithium was slowly added thereto in a dropwise fashion. When the addition was complete, the mixture was agitated for 30 minutes, a solution obtained by dissolving 16.2 g (62.5 mmol) of 3-bromo benzophenone in 200 mL of tetrahydrofuran was slowly added thereto. The reaction solution was agitated for about 1 hour while maintained at −78° C. and then, heated up to room temperature and kept being agitated until the next day morning. After completing the reaction by adding a 5 wt % sodium bicarbonate aqueous solution to the reaction solution, the resultant was separately extracted by using methylene chloride. The obtained organic layer was

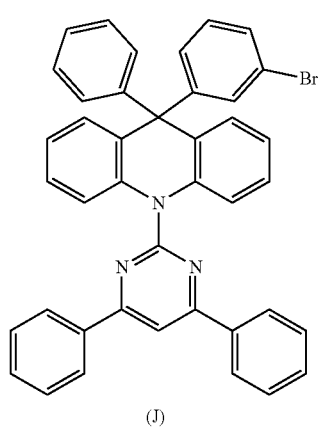

(J)

distilled under a reduced pressure after removing water remaining there by using magnesium sulfate, obtaining an intermediate (I). The unpurified intermediate (I) was put in 400 mL of acetic acid, hydrochloric acid in a catalyst amount was added thereto, and the mixture was agitated for 12 hours at a reflux temperature. When the reaction was complete, 25 g of a compound (J) was obtained through column chromatography (a yield of 59%).

The elemental analysis result of the compound (J) was provided as follows.

calcd. $C_{41}H_{28}BrN_3$: C, 76.63; H, 4.39; Br, 12.43; N, 6.54. found: C, 76.63; H, 4.36; N, 6.55

Second Step: Synthesis of Compound (A-92)

20 g (31.1 mmol) of the compound (J), 11.5 g (31.1 mmol) of a 3-(4,4,5,5-tetramethyl-1,3,2-dioxaborane-N-phenyl-carbazole compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid was filtered therefrom and dissolved in monochlorobenzene, and the solution was filtered with silica gel/Celite. After removing an organic solvent in an appropriate amount therefrom, the resultant was recrystallized with MeOH, obtaining 13 g of a compound (A-26) (a yield of 55%).

The elemental analysis result of the compound (A-92) was provided as follows.

calcd. $C_{59}H_{40}N_4$: C, 88.03; H, 5.01; N, 6.96. found: C, 88.02; H, 5.00; N, 6.96

Example 8

Synthesis of Compound Represented by Chemical Formula (A-114)

A compound represented by the above Chemical Formula A-114 as specific examples of a compound for an organic optoelectronic device of the present invention was synthesized according to the following Reaction Scheme 8.

[Reaction Scheme 8]

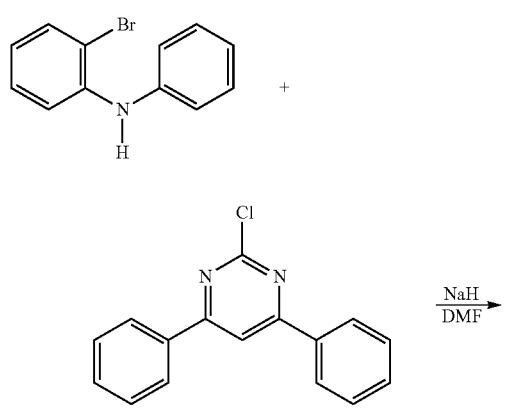

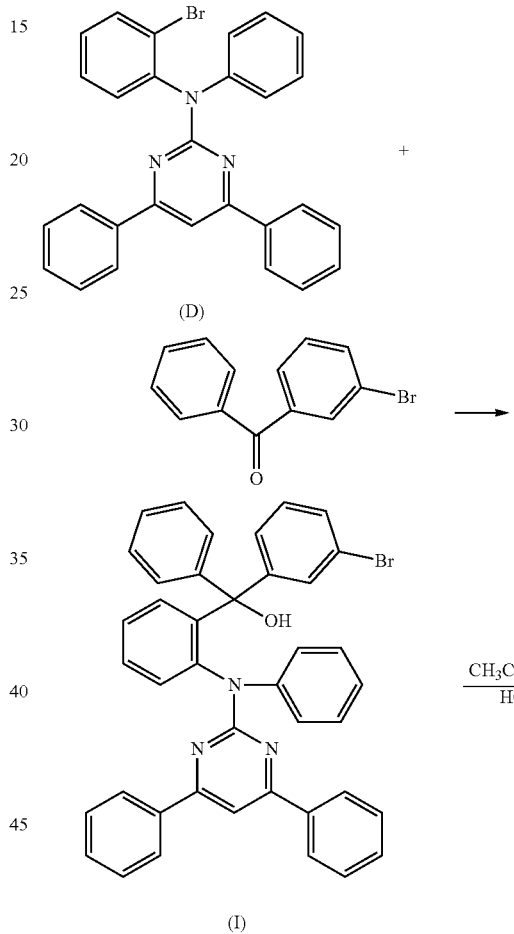

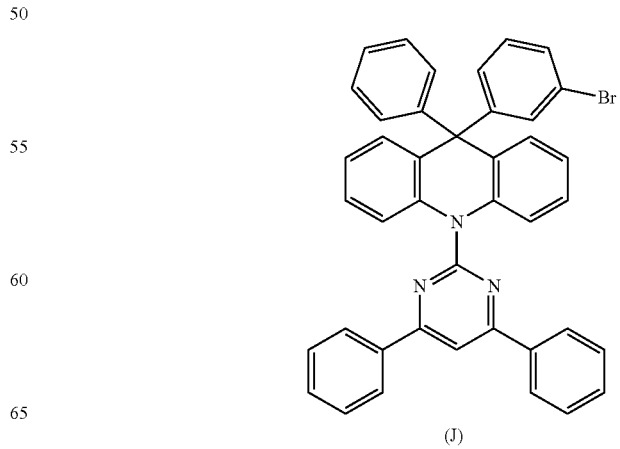

103

-continued

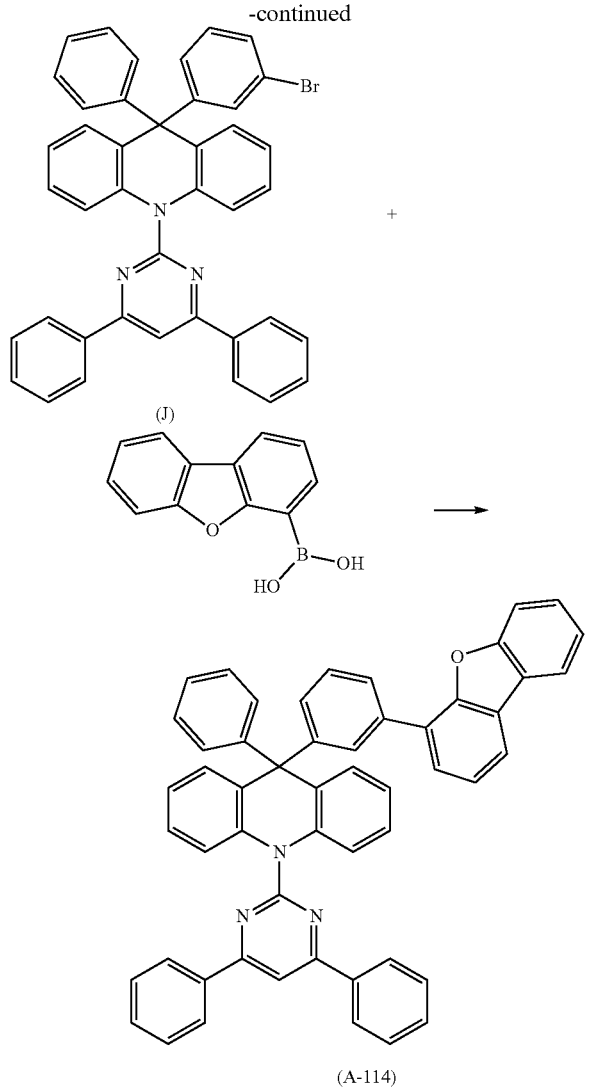

(J)

(A-114)

First Step; Synthesis of Compound (A-114)

20 g (31.1 mmol) of the compound (J) synthesized through the steps 1 and 2 in Example 7, 6.6 g (31.1 mmol) of a 4-boronic acid-dibenzo furan compound and 1.8 g (1.2 mmol) of tetrakis triphenyl phosphine were suspended in 400 ml of toluene/tetrahydrofuran, 400 ml of a 2 M potassium carbonate aqueous solution was added thereto, and the mixture was heated and refluxed under a nitrogen stream for 24 hours. The reaction solution was added to 2000 ml of MeOH, a crystallized solid was filtered therefrom and dissolved in monochlorobenzene, and the solution was filtered with silica gel/Celite. After removing an organic solvent in an appropriate amount therefrom, the resultant was recrystallized with MeOH, obtaining 17 g of a compound (A-114) (a yield of 65%).

The elemental analysis result of the compound (A-114) was provided as follows.

calcd. $C_{53}H_{35}N_3O$: C, 87.22; H, 4.83; N, 5.76; O, 2.19. found: C, 87.21; H, 4.83; N, 5.77

(Manufacture of Organic Light Emitting Diode)

Example 9

Specifically, illustrating a method of manufacturing an organic light emitting diode, an anode was manufactured by cutting an ITO glass substrate having a sheet resistance of 15 $\Omega/cm^2$ into a size of 50 mm×50 mm×0.7 mm, respectively ultrasonic wave-cleaning it in acetone, isopropylalcohol and pure water for 15 minutes and then, UV ozone-cleaning it for 30 minutes.

This obtained ITO transparent electrode was used as an anode, and a 1200 Å-thick hole injection layer (HIL) was formed on the ITO substrate by vacuum-depositing the following HTM compound.

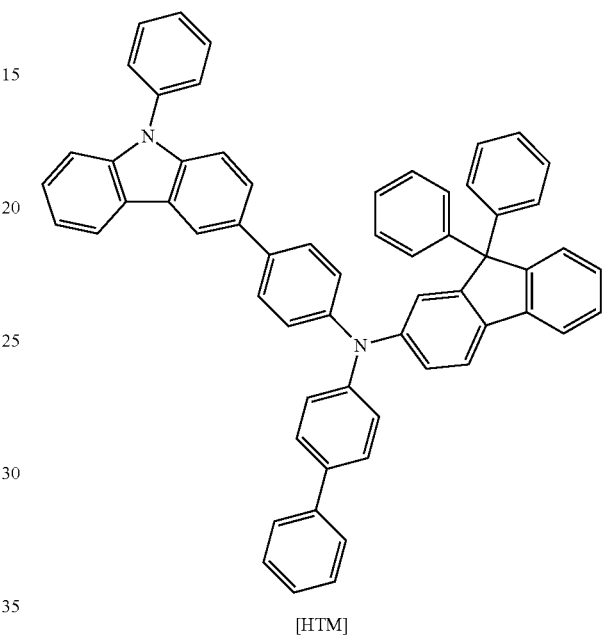

[HTM]

Then, the compound synthesized in Example 1 as a host and 7 wt % of the following PhGD compound as a phosphorescent green dopant were vacuum-deposited to form a 300 Å-thick emission layer. As for an anode, 1000 Å-thick aluminum (Al) was used, while 1000 Å-thick ITO was used as for a cathode.

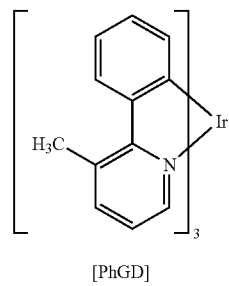

[PhGD]

Then, on the emission layer, 50 Å-thick BAlq [bis(2-methyl-8-quinolinolato-N1,O8)-(1,1'-Biphenyl-4-olato)aluminum] and 250 Å-thick Alq3 [tris(8-hydroxyquinolinato) aluminium] were sequentially accumulated to form an electron transport layer (ETL). On the electron transport layer (ETL), 5 Å-thick LiF and 1000 Å-thick Al were sequentially vacuum-deposit to form a cathode, manufacturing an organic light emitting diode.

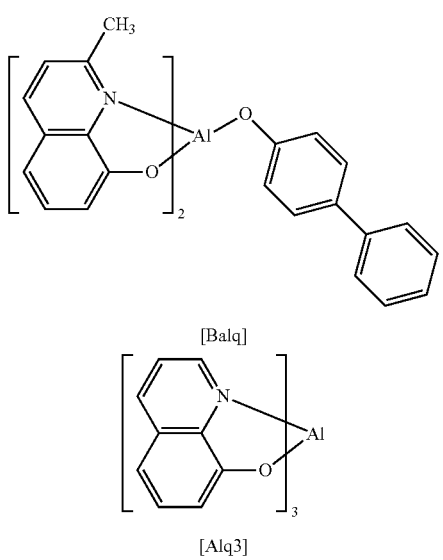

[Balq]

[Alq3]

Example 10

An organic light emitting diode was manufactured according to the same method as Example 9 except for using the compound of Example 2 instead of the compound of Example 1 in Example 9.

Example 11

An organic light emitting diode was manufactured according to the same method as Example 9 except for using the compound of Example 3 instead of the compound of Example 1 in Example 9.

Comparative Example 1

An organic light emitting diode was manufactured according to the same method as Example 9 except for using 4,4-N,N-dicarbazolebiphenyl (CBP) instead of the compound synthesized in Example 1 as the host for the emission layer in Example 9.

(Performance Measurement of Organic Light Emitting Diode)

Current density change, luminance change, and luminous efficiency of each organic light emitting diode according to the Examples 9 to 11 and Comparative Example 1 depending on a voltage were measured. Specific measurement methods are as follows, and the results are shown in the following Table 1.

(1) Measurement of Current Density Change Depending on Voltage Change

The obtained organic light emitting diodes were measured for current value flowing in the unit device while increasing the voltage from 0 V to 10 V using a current-voltage meter (Keithley 2400), the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

The luminance, current density, and voltage obtained from the (1) and (2) were used to calculate current efficiency (cd/A) at the same current density (10 mA/cm2).

TABLE 1

|  | Driving voltage (Vd, V) | Current efficiency (cd/A) | Power efficiency (lm/W) | Luminance (cd/m$^2$) | Color coordinate (CIEx) | Color coordinate (CIEy) |
| --- | --- | --- | --- | --- | --- | --- |
| Comparative Example 1 | 4.02 | 36.9 | 34 | 3000 | 0.340 | 0.627 |
| Example 9 | 4.05 | 39.1 | 38.2 | 3000 | 0.350 | 0.618 |
| Example 10 | 4.15 | 38.6 | 37.9 | 3000 | 0.350 | 0.620 |
| Example 11 | 4.09 | 41.2 | 40.2 | 3000 | 0.350 | 0.619 |

The organic light emitting diodes of Examples 6 to 7 showed improved efficiency compared with the organic light emitting diodes of Comparative Example 1 using CBP as the host for the emission layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A compound for an organic optoelectronic device, the compound comprising moieties represented by the following Chemical Formula I and Chemical Formula II, the moieties represented by Chemical Formula I and Chemical Formula II being sequentially linked:

[Chemical Formula I]

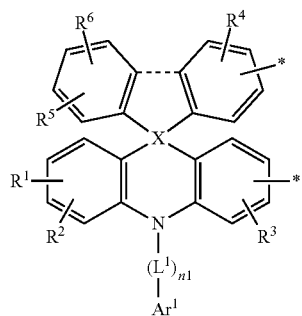

[Chemical Formula II]

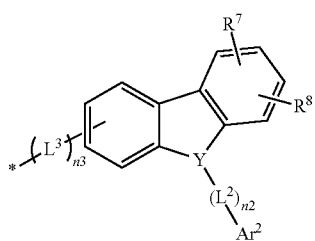

wherein, in Chemical Formula I and Chemical Formula II,
--- indicates a single bond or no bond,
* indicates a binding point of Chemical Formula I and Chemical Formula II wherein Chemical Formula I is linked to Chemical Formula II at one * of the two *s of Chemical Formula I,
X is C or Si,
Y is N, O, or S,
$R^1$ to $R^8$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof,
$L^1$ to $L^3$ are each independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are each independently integers of 0 to 3, $Ar^1$ and $Ar^2$ are each independently a substituted or unsubstituted C6 to C30 aryl group or a substituted or unsubstituted C2 to C30 heteroaryl group, and at least one of $Ar^1$, $Ar^2$, and $R^8$ is a substituted or unsubstituted C2 to C30 heteroaryl group having electron characteristics.

2. The compound for an organic optoelectronic device as claimed in claim 1, wherein the compound is represented by one of the following Chemical Formula 1 to Chemical Formula 4:

[Chemical Formula 1]

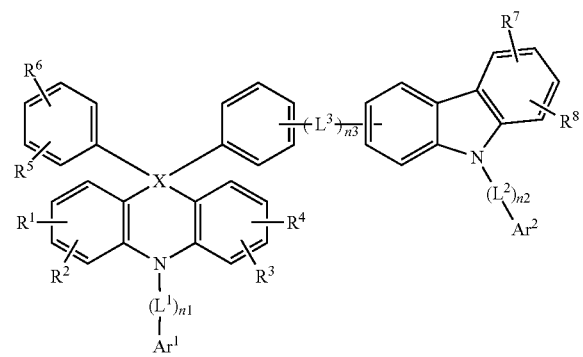

[Chemical Formula 2]

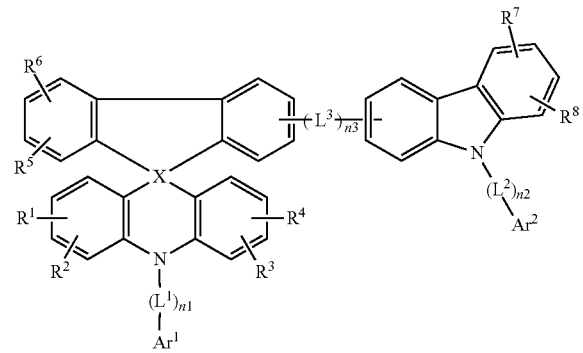

[Chemical Formula 3]

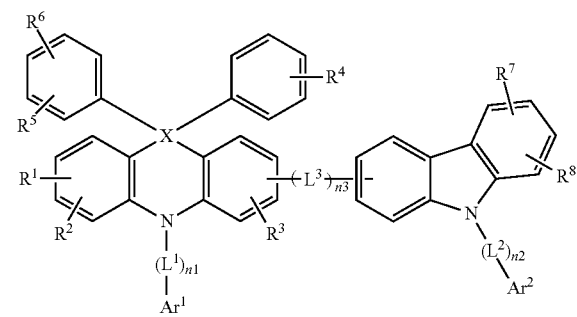

-continued

[Chemical Formula 4]

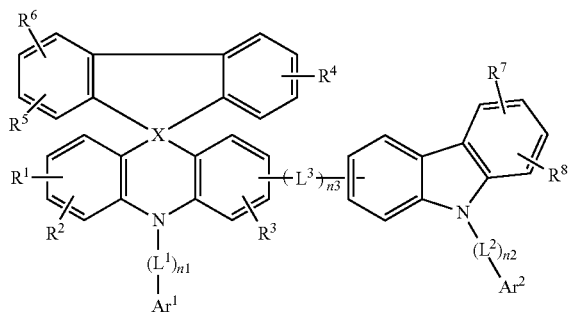

[Chemical Formula 1-1]

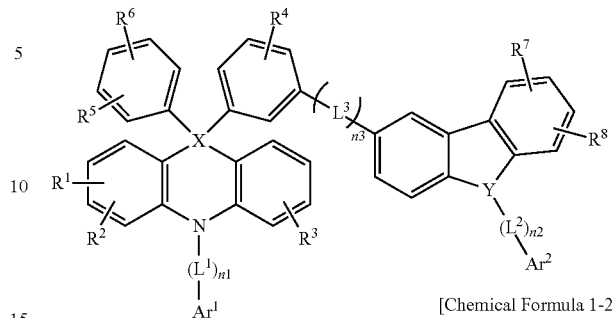

[Chemical Formula 1-2]

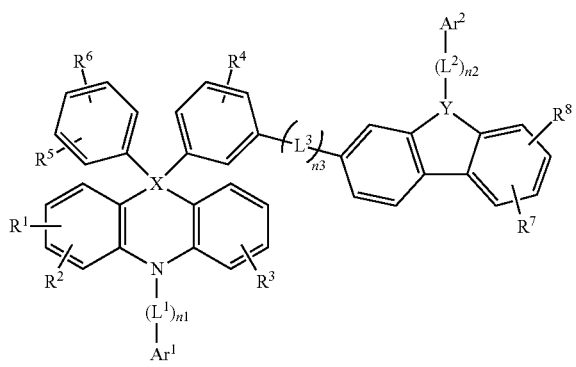

[Chemical Formula 1-3]

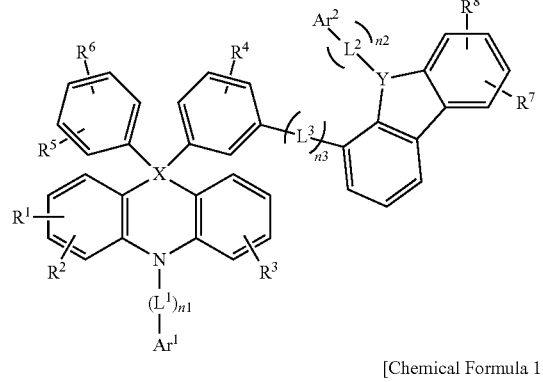

[Chemical Formula 1-4]

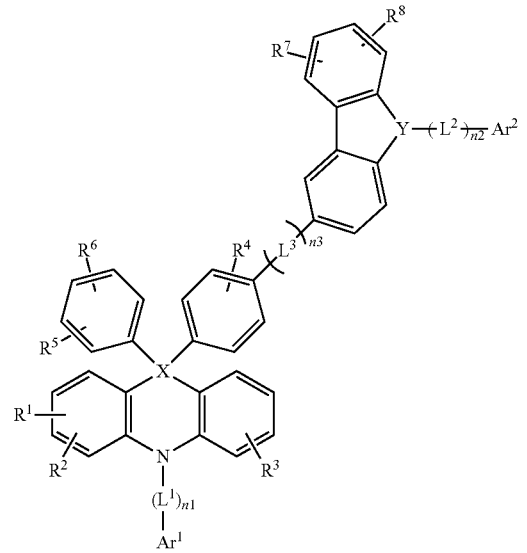

wherein, in Chemical Formula 1 to Chemical Formula 4,

X is C or Si,

Y is N, O, or S, $R^1$ to $R^8$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof, $L^1$ to $L^3$ are each independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are each independently integers of 0 to 3, $Ar^1$ and $Ar^2$ are each independently a substituted or unsubstituted C6 to C30 aryl group or a substituted or unsubstituted C2 to C30 heteroaryl group, and at least one of $Ar^1$, $Ar^2$, and $R^8$ is a substituted or unsubstituted C2 to C30 heteroaryl group having electron characteristics.

3. The compound for an organic optoelectronic device as claimed in claim 1, wherein the compound is represented by one of the following Chemical Formula 1-1 to Chemical Formula 4-3:

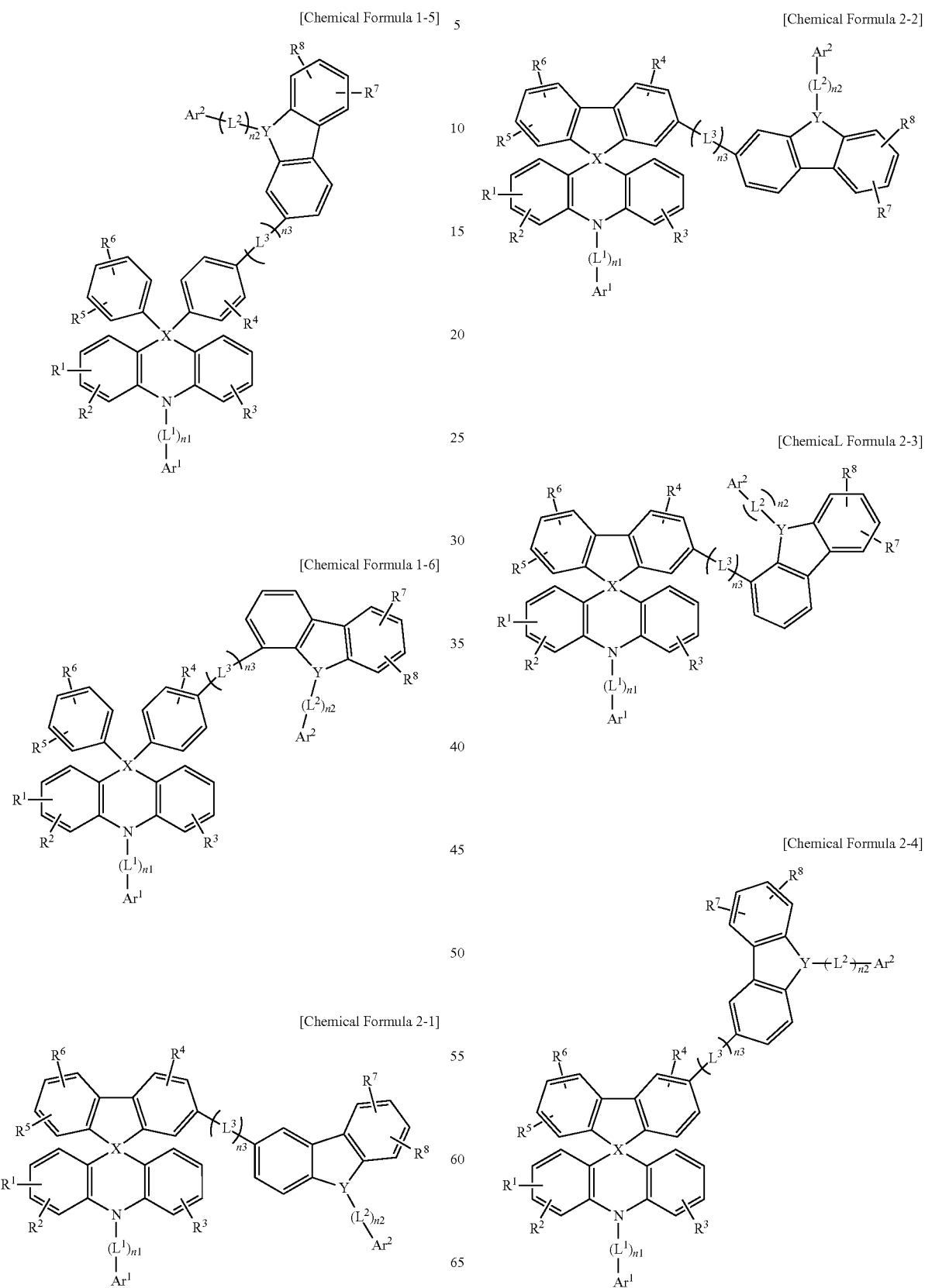

[Chemical Formula 2-5]
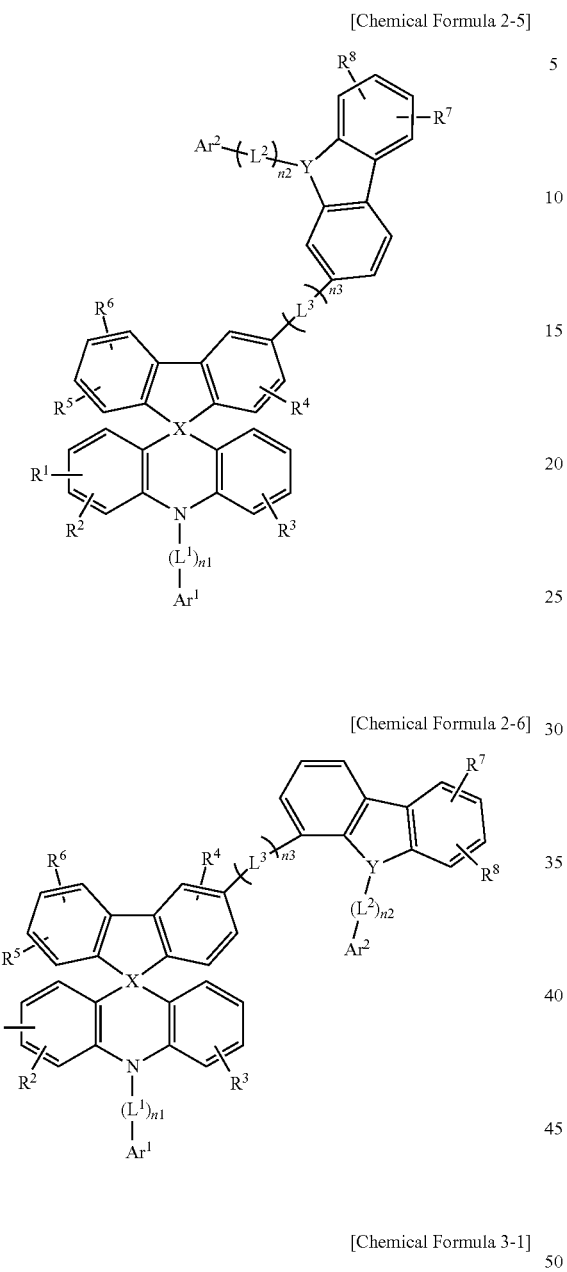
[Chemical Formula 2-6]
[Chemical Formula 3-1]
[Chemical Formula 3-2]
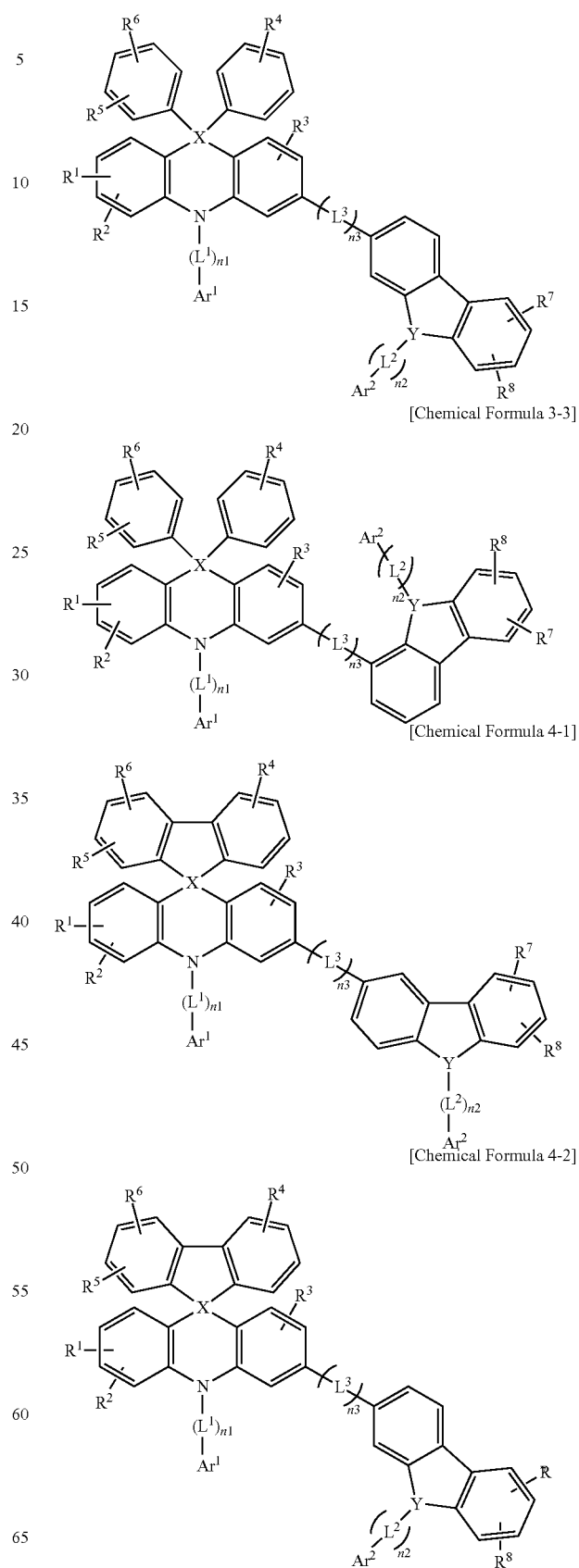
[Chemical Formula 3-3]
[Chemical Formula 4-1]
[Chemical Formula 4-2]

[Chemical Formula 4-3]

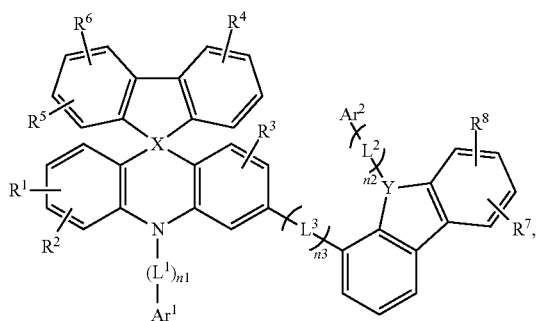

wherein, in Chemical Formula 1-1 to Chemical Formula 4-3,

X is C or Si,

Y is N, O, or S, $R^1$ to $R^8$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof, $L^1$ to $L^3$ are each independently a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 to n3 are each independently integers of 0 to 3, $Ar^1$ and $Ar^2$ are each independently a substituted or unsubstituted C6 to C30 aryl group or a substituted or unsubstituted C2 to C30 heteroaryl group, and at least one of $Ar^1$, $Ar^2$, and $R^8$ is a substituted or unsubstituted C2 to C30 heteroaryl group having electron characteristics.

4. The compound for an organic optoelectronic device as claimed in claim 1, wherein:

$Ar^1$ is a substituted or unsubstituted C2 to C30 heteroaryl group having electron characteristics, and $Ar^2$ is a substituted or unsubstituted C6 to C30 aryl group.

5. The compound for an organic optoelectronic device as claimed in claim 1, wherein:

$Ar^2$ is a substituted or unsubstituted C2 to C30 heteroaryl group having electron characteristics, and $Ar^1$ is a substituted or unsubstituted C6 to C30 aryl group.

6. The compound for an organic optoelectronic device as claimed in claim 1, wherein the substituted or unsubstituted C2 to C30 heteroaryl group having electron characteristics is a group represented by one of the following Chemical Formulae 5 to 9:

[Chemical Formula 5]

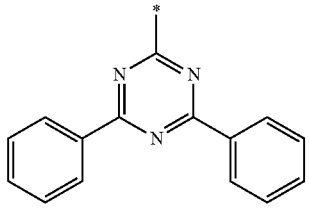

[Chemical Formula 6]

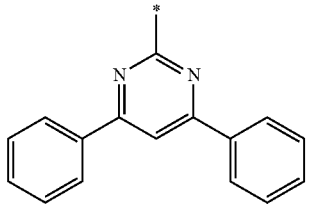

[Chemical Formula 7]

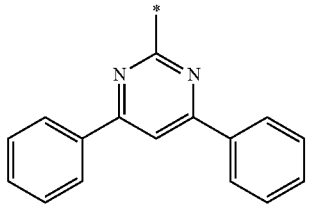

[Chemical Formula 8]

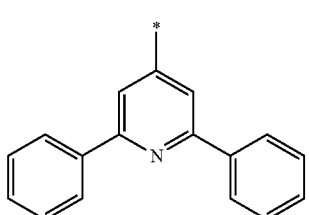

[Chemical Formula 9]

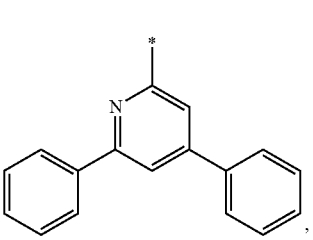

in which * represents a binding site to a neighboring atom.

7. The compound for an organic optoelectronic device as claimed in claim 1, wherein $Ar^1$ and $Ar^2$ are each independently a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof.

8. The compound for an organic optoelectronic device as claimed in claim 1, wherein $L^1$ to $L^3$ are each independently a substituted or unsubstituted phenylene group, a substituted or unsubstituted biphenylene group, a substituted or unsubstituted terphenylene group, a substituted or unsubstituted naphthylene group, a substituted or unsubstituted anthracenylene group, a substituted or unsubstituted phenanthrylene group, a substituted or unsubstituted pyrenylene group, a substituted or unsubstituted fluorenylene group, a substituted or unsubstituted naphthacenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group. substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group and a substituted or unsubstituted phenoxazinyl group.

9. The compound for an organic optoelectronic device as claimed in claim 1, wherein at least one of $R^1$ to $R^8$ is a substituted or unsubstituted C3 to C40 silyl group.

10. The compound for an organic optoelectronic device as claimed in claim 1, wherein the compound is one selected from Compounds A-1 to A-117 and B-1 to B-60:

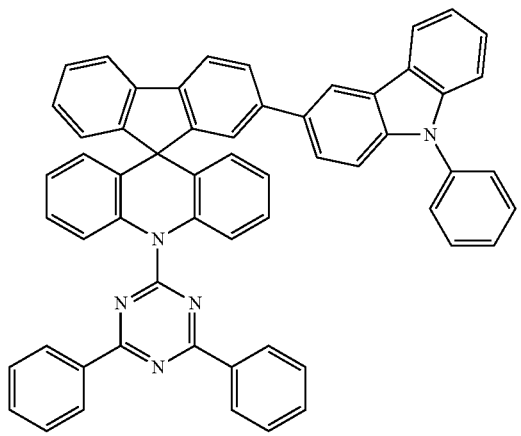

[A-1]

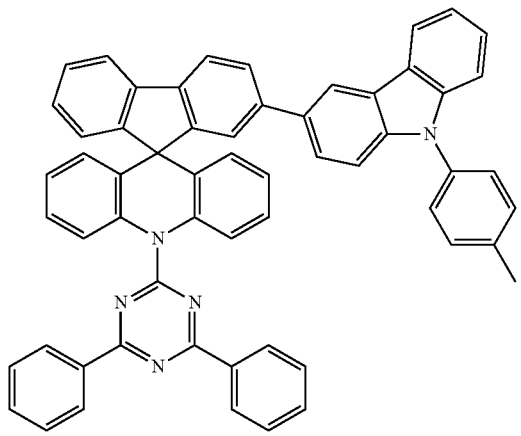

[A-2]

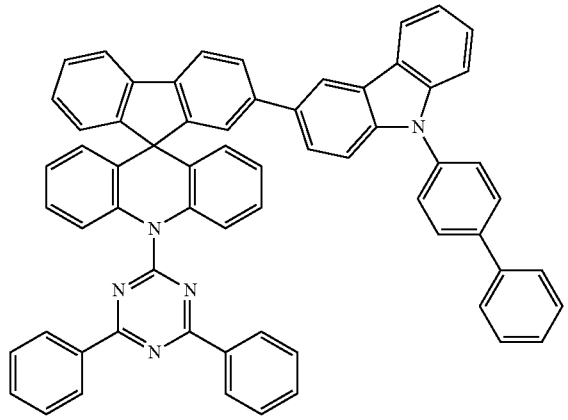

[A-3]

[A-4]
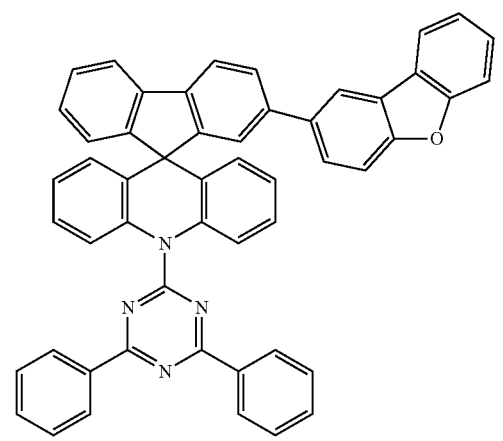
[A-5]
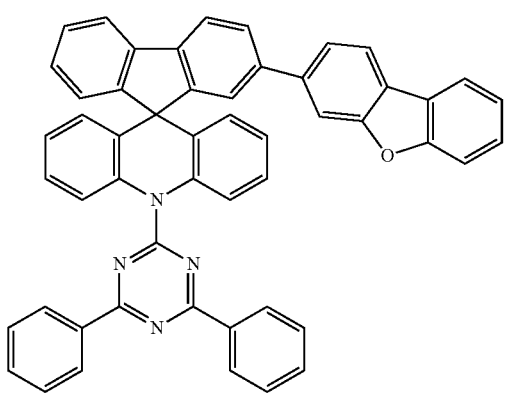
[A-6]
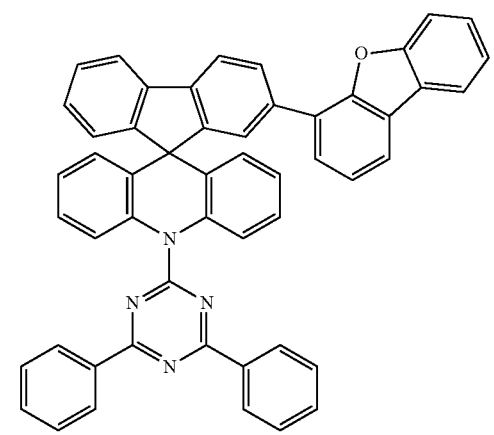
[A-7]
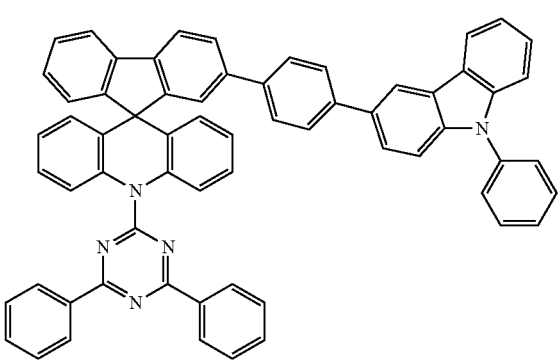
[A-8]
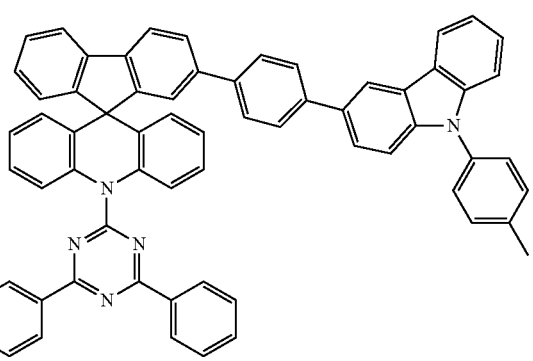
[A-9]
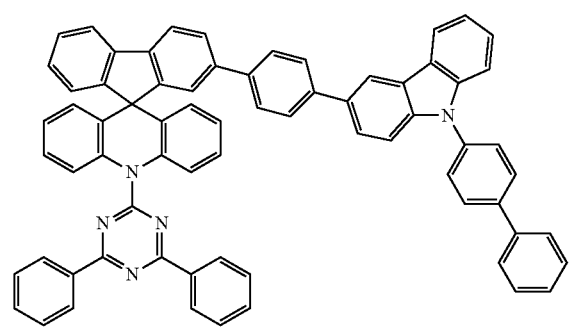
[A-10]
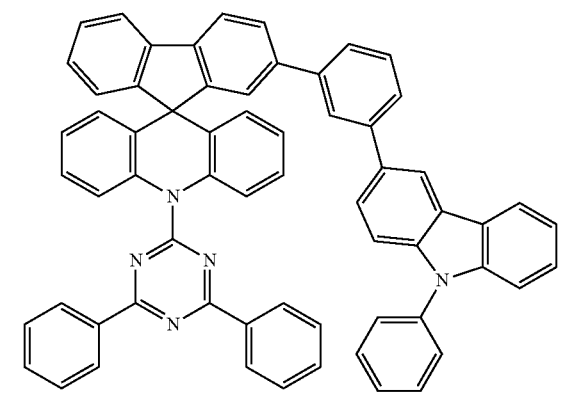
[A-11]
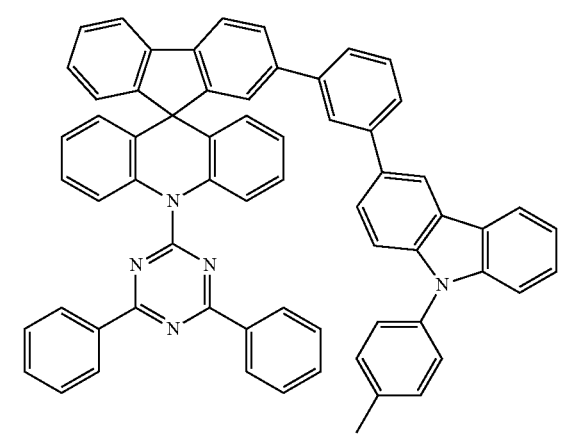

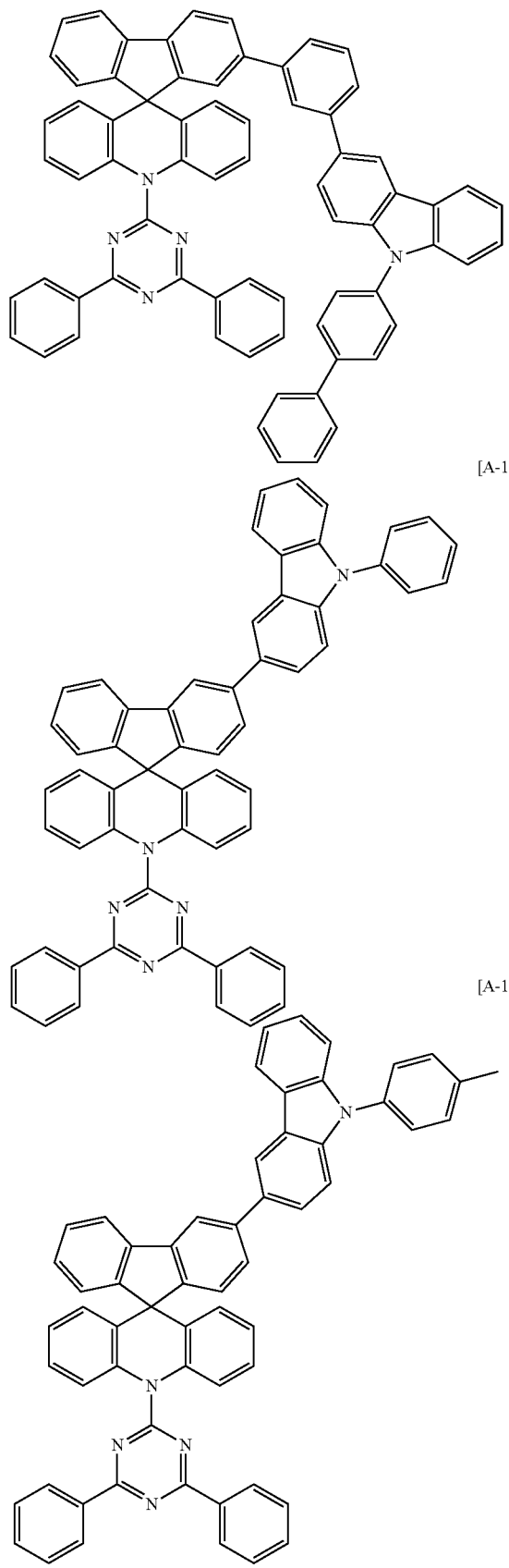
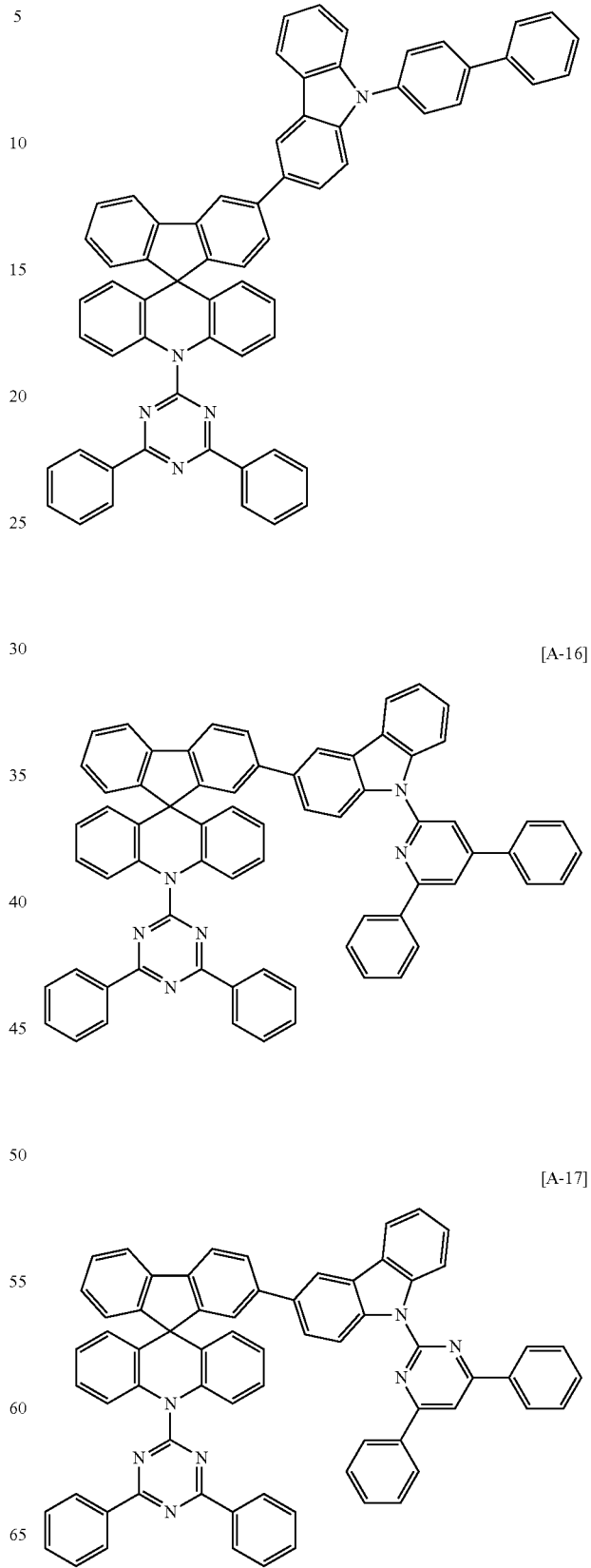

-continued
[A-18]
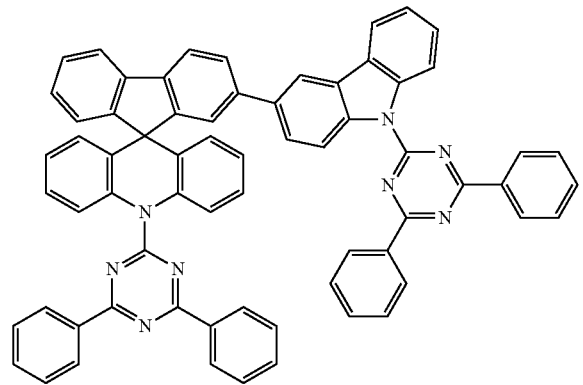
[A-19]
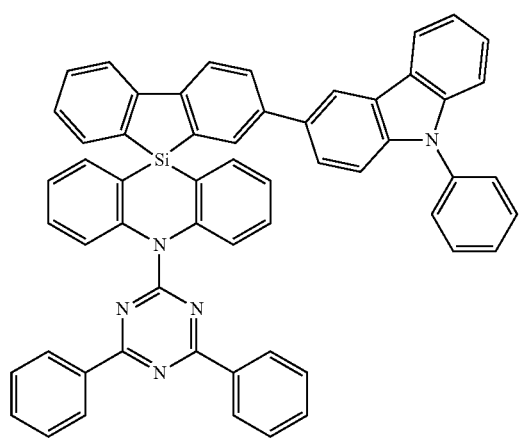
[A-20]
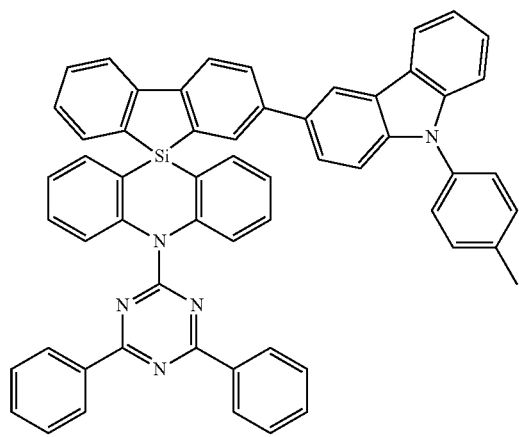
-continued
[A-21]
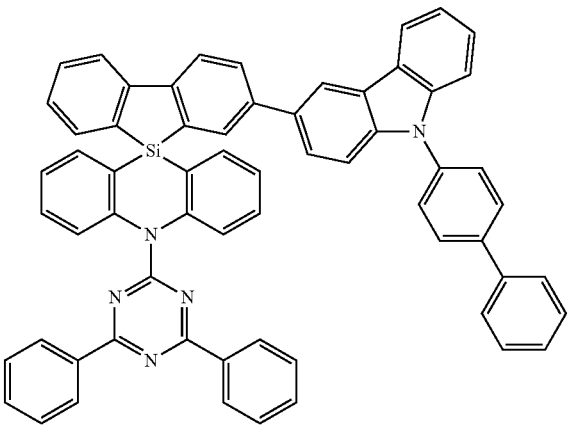
[A-22]
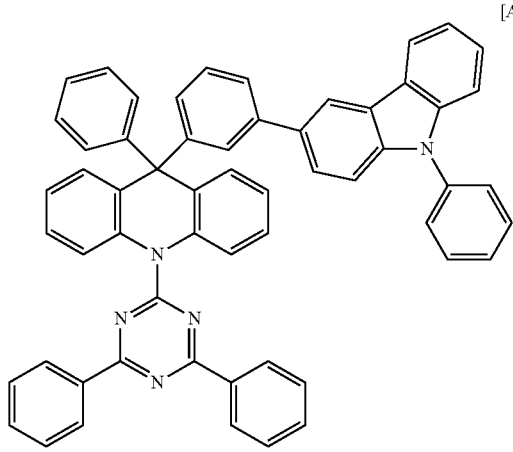
[A-23]
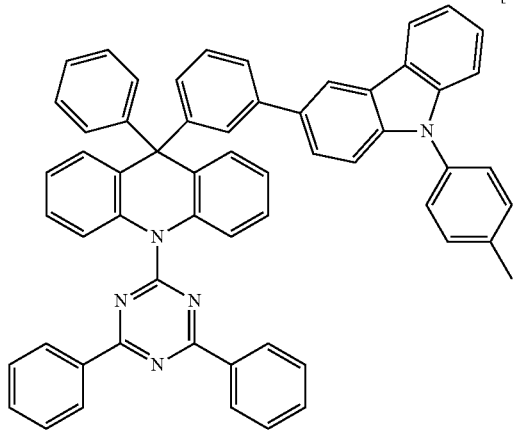

[A-24]
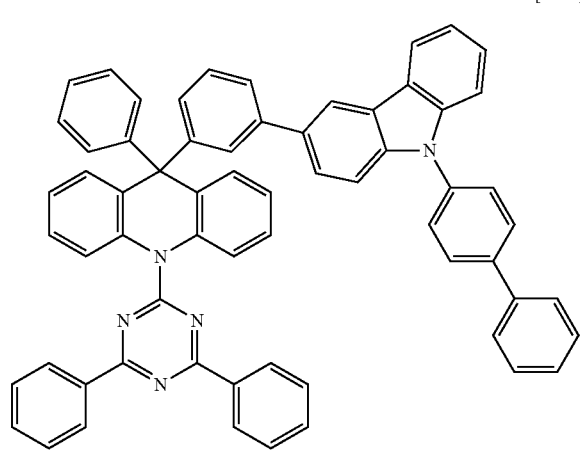
[A-27]
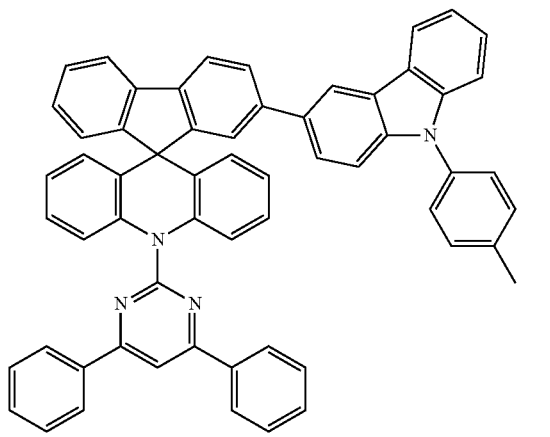
[A-25]
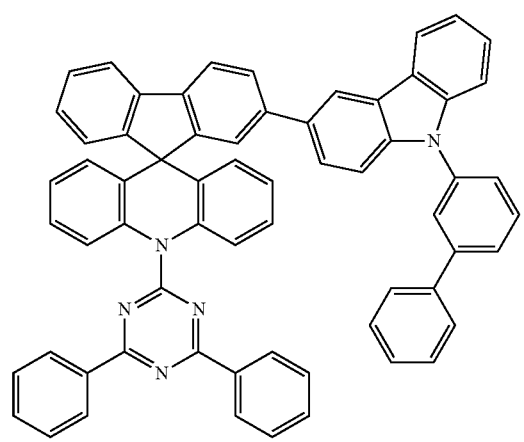
[A-28]
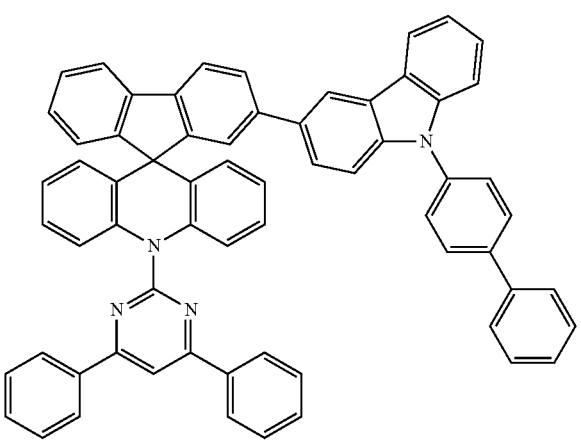
[A-26]
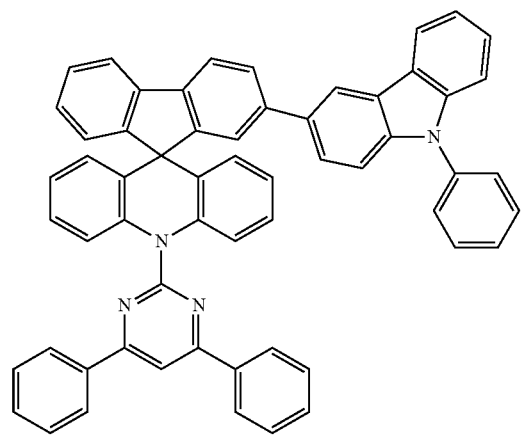
[A-29]
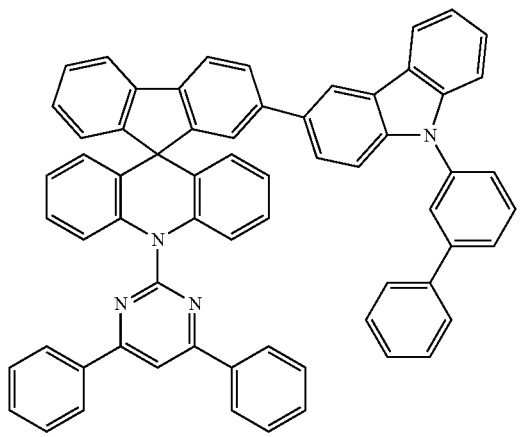

[A-30]
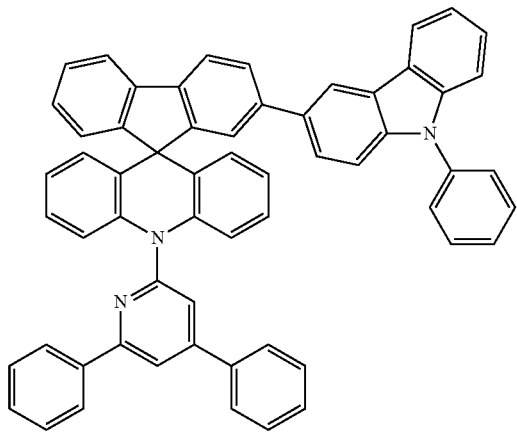
[A-31]
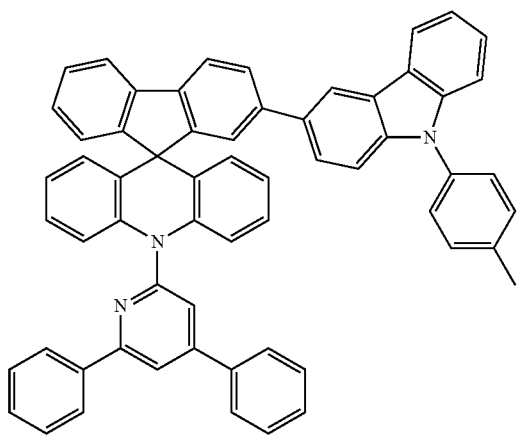
[A-32]
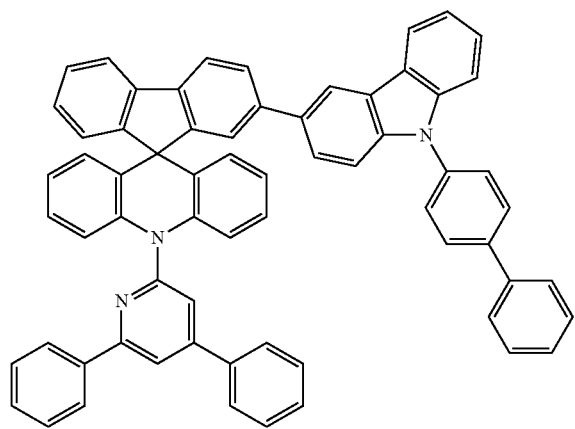
[A-33]
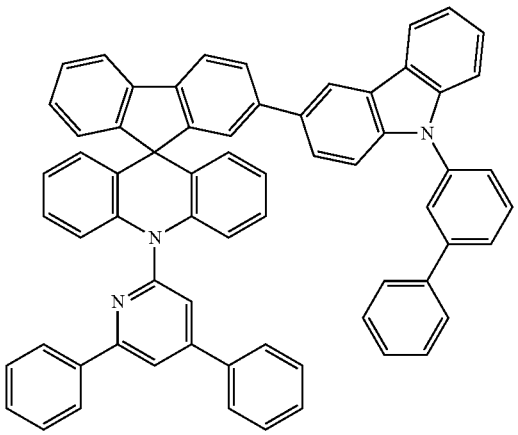
[A-34]
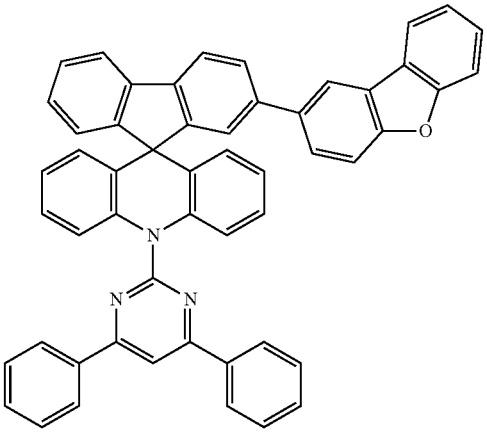
[A-35]
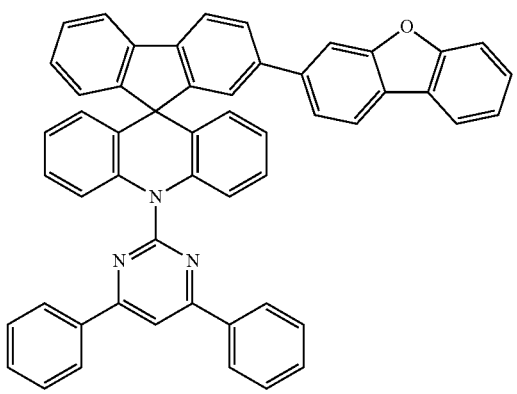

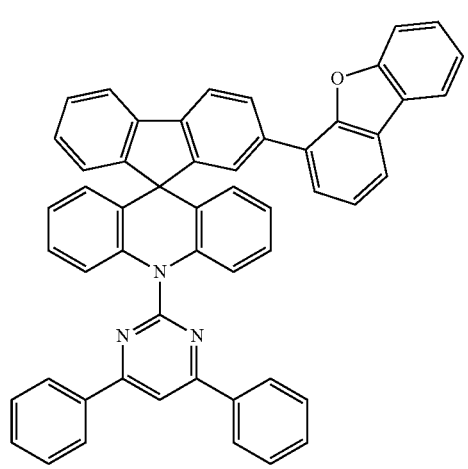
[A-36]
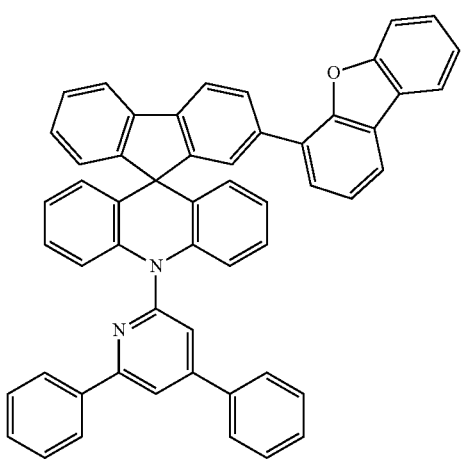
[A-39]
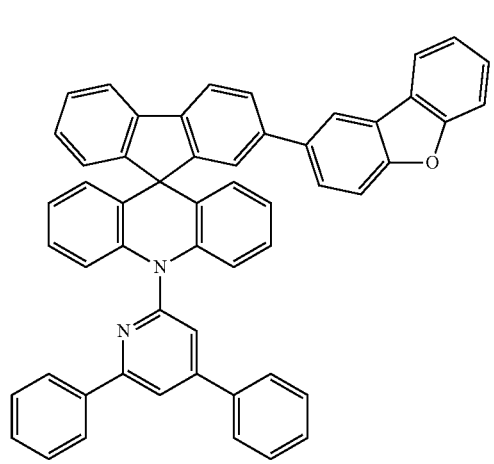
[A-37]
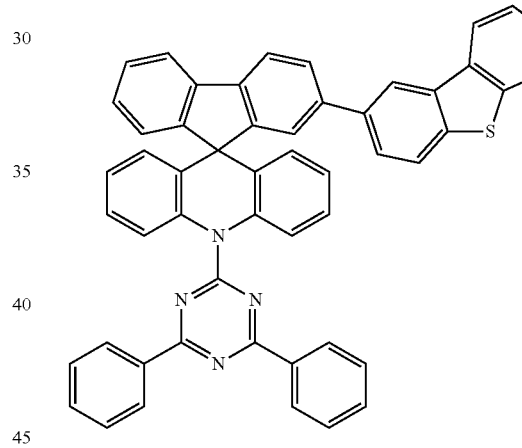
[A-40]
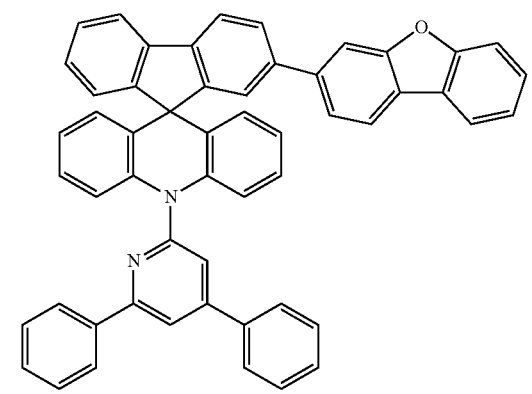
[A-38]
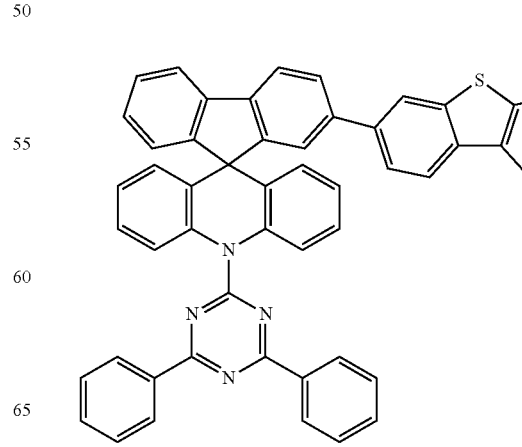
[A-41]

[A-42]
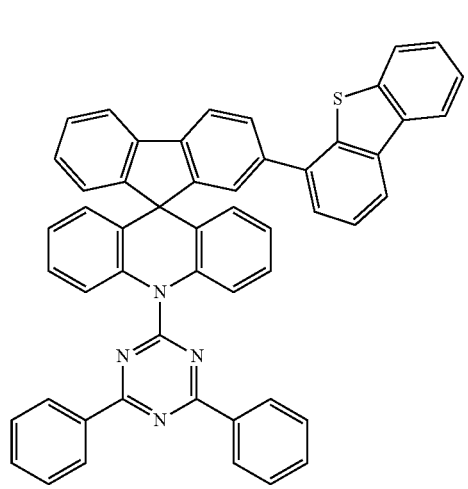
[A-45]
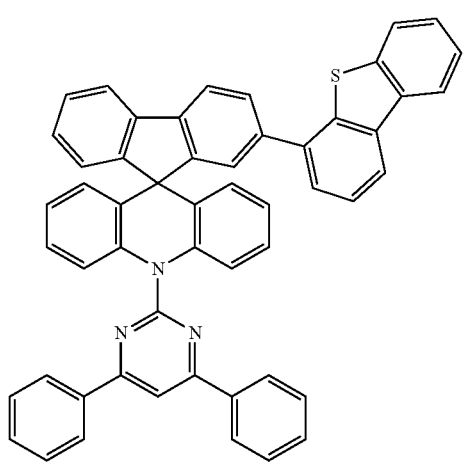
[A-43]
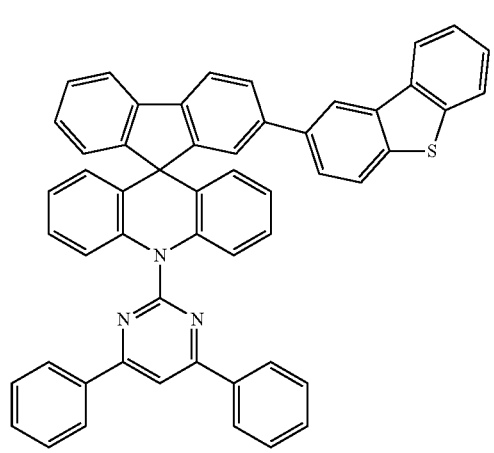
[A-46]
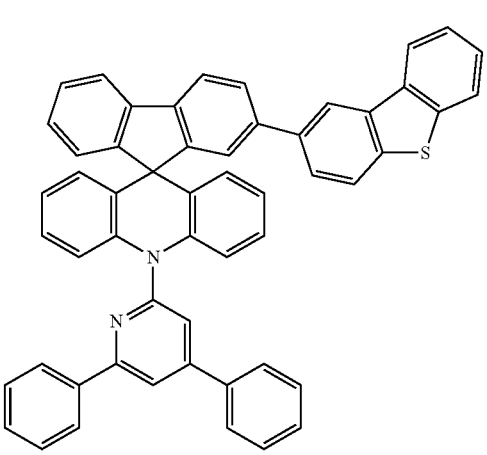
[A-44]
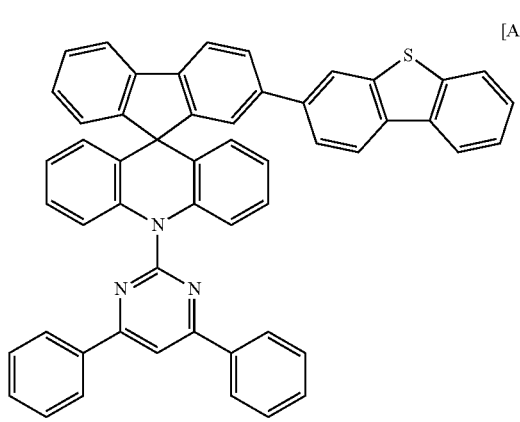
[A-47]
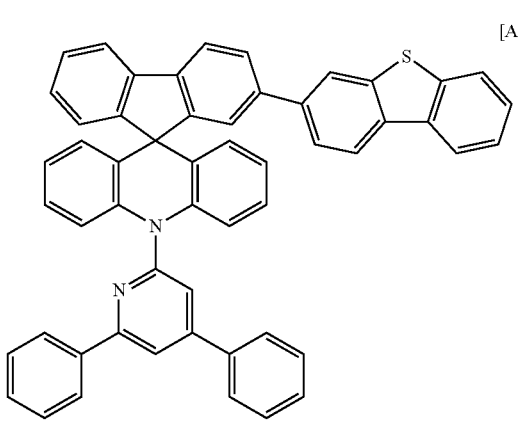

-continued
[A-48]
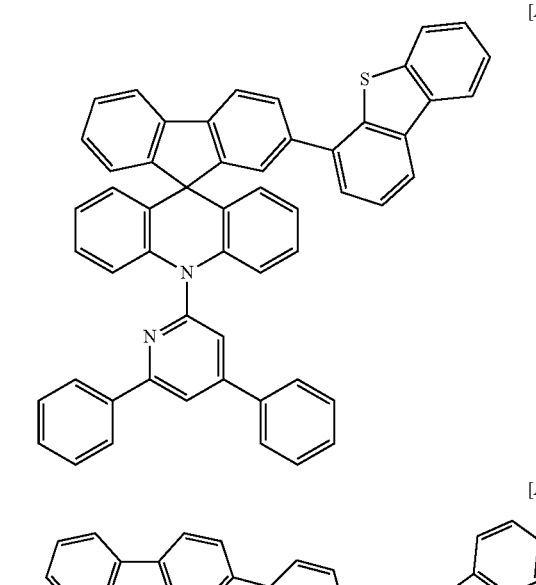
[A-49]
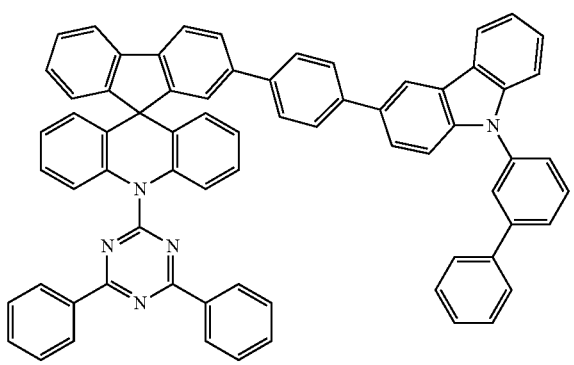
[A-50]
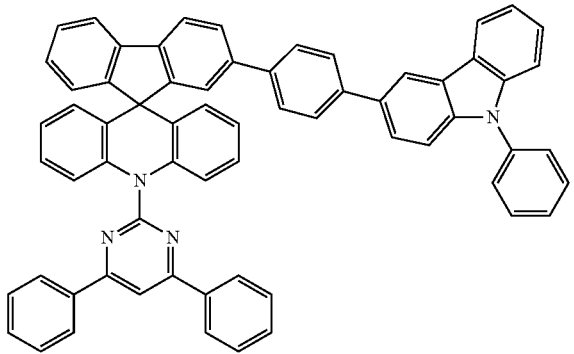
[A-51]
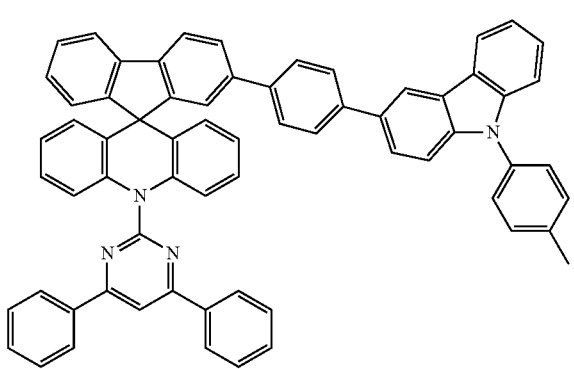
-continued
[A-52]
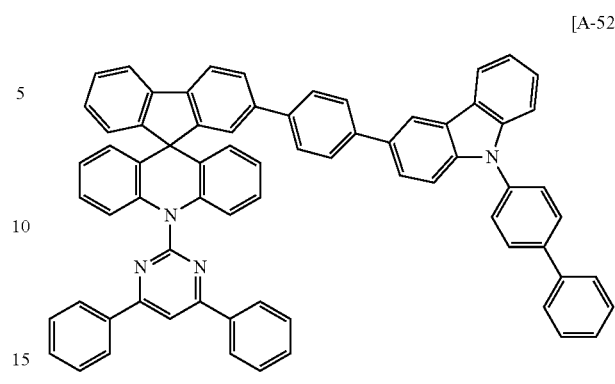
[A-53]
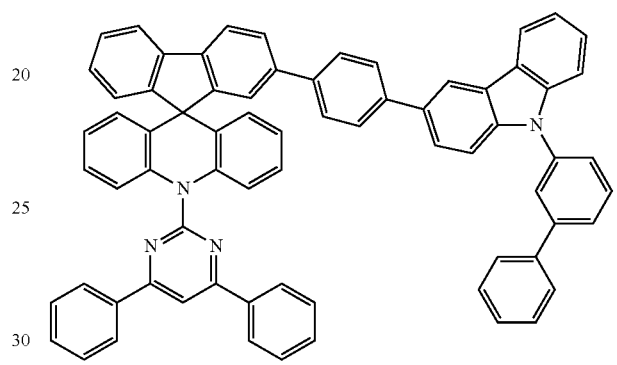
[A-54]
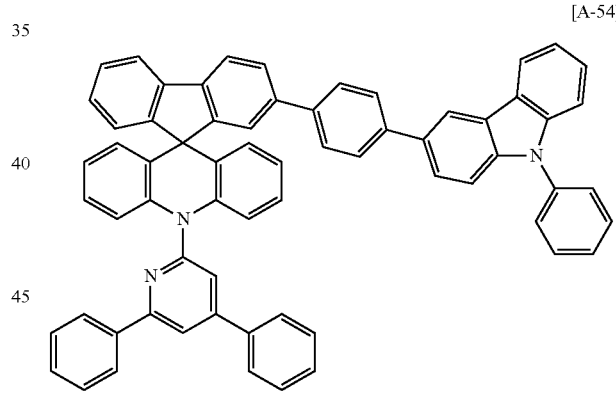
[A-55]
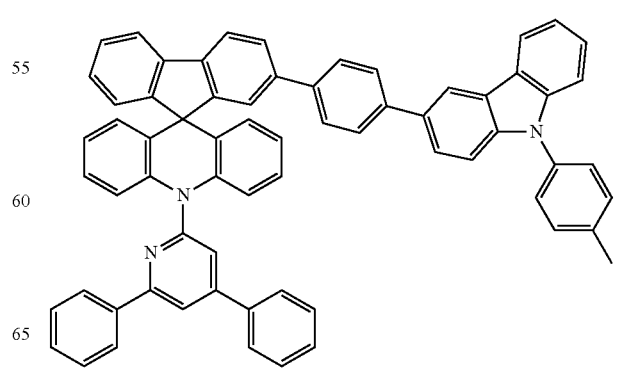

[A-56]
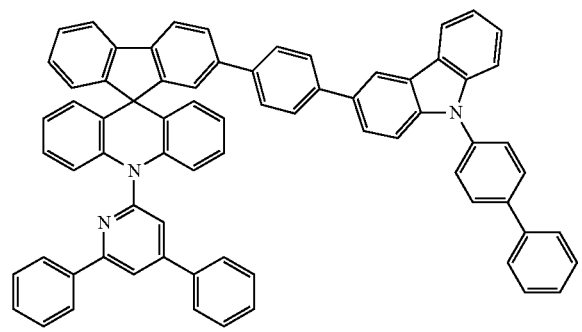
[A-57]
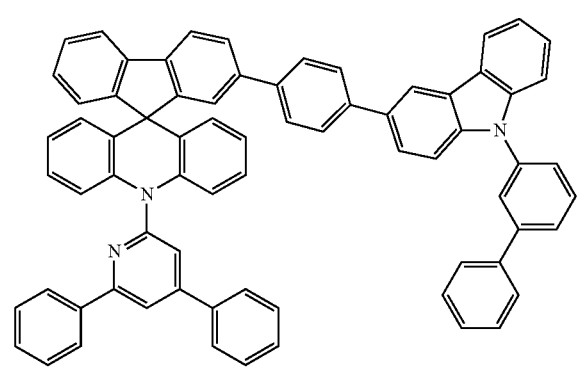
[A-58]
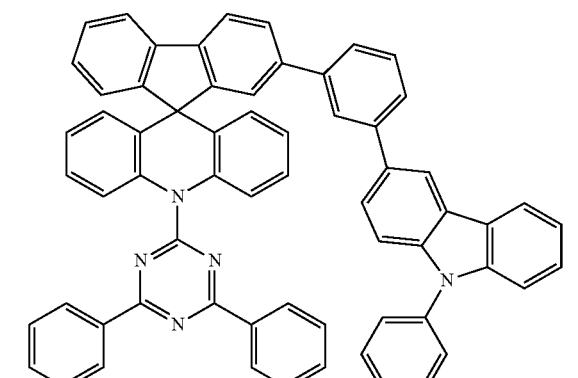
[A-59]
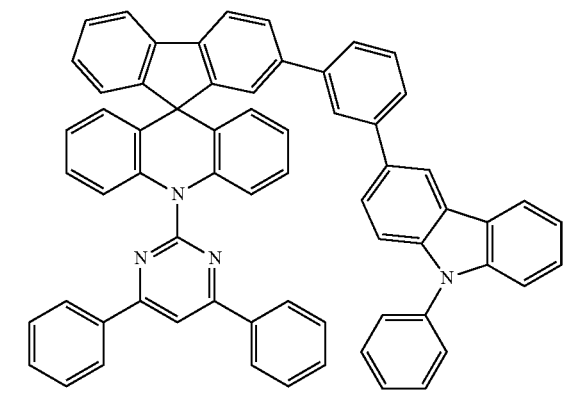
[A-60]
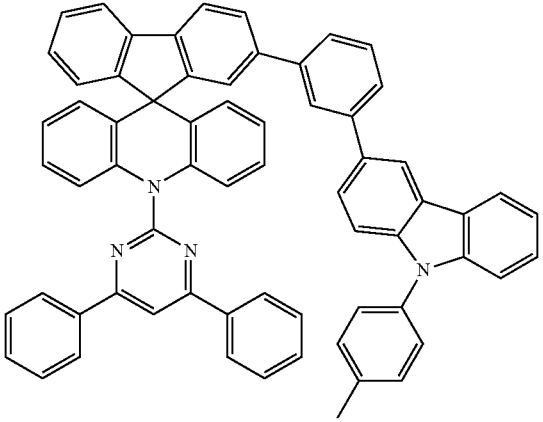
[A-61]
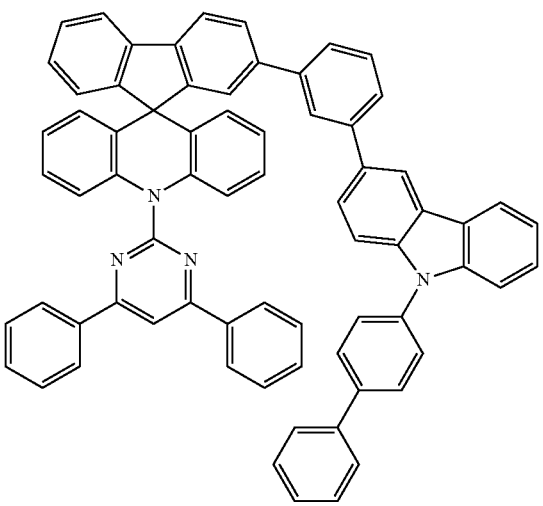
[A-62]
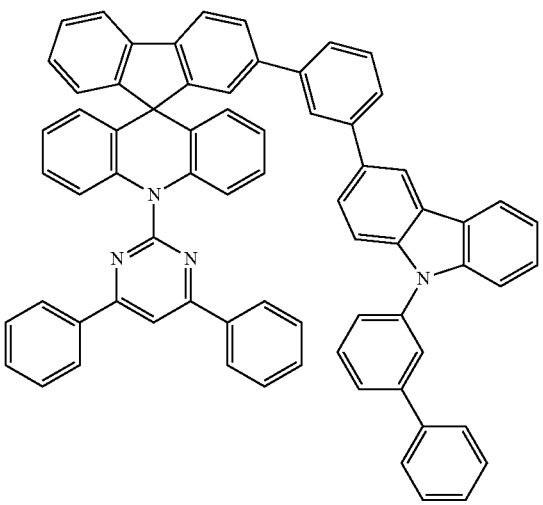

[A-63]
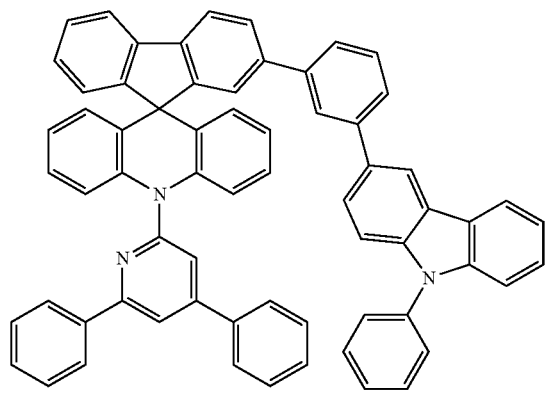
[A-64]
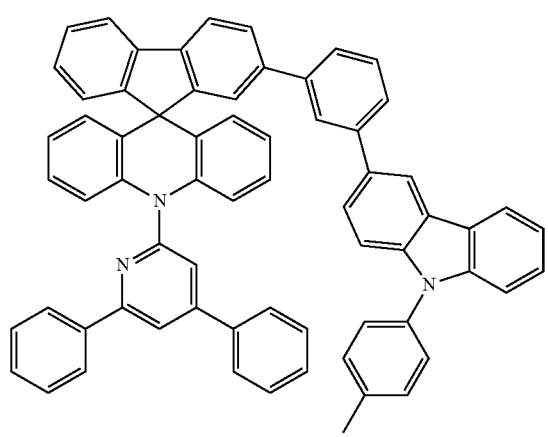
[A-65]
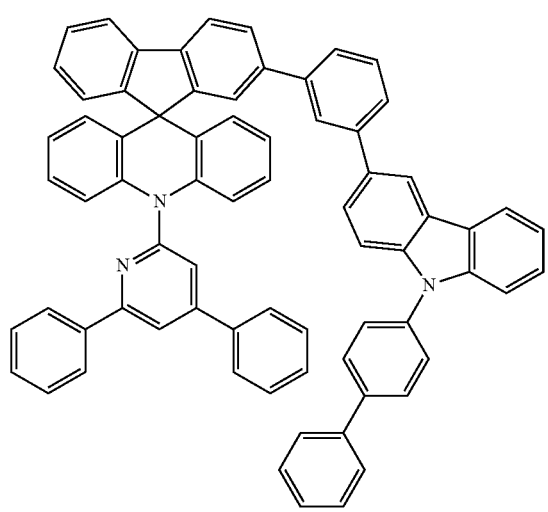
[A-66]
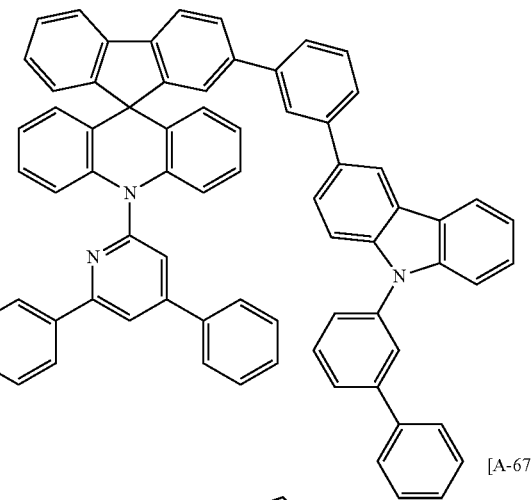
[A-67]
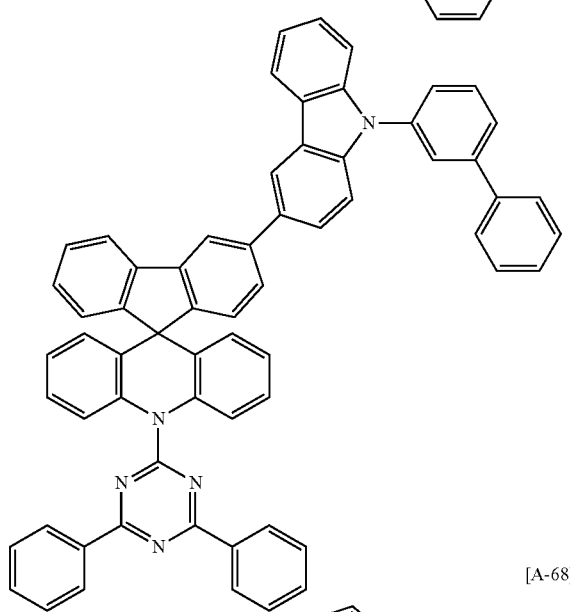
[A-68]
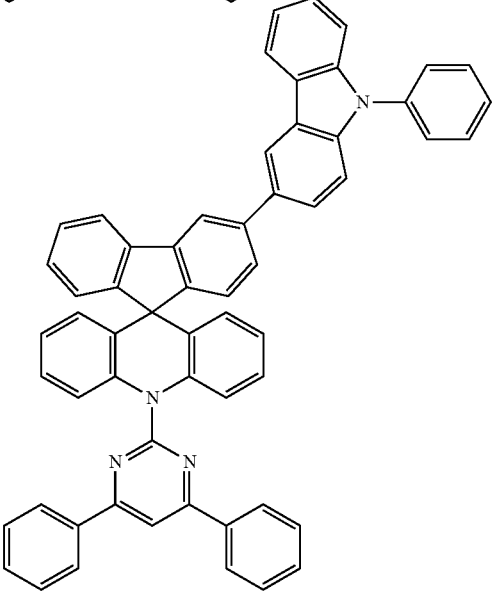

-continued
[A-69]
[A-70]
[A-71]
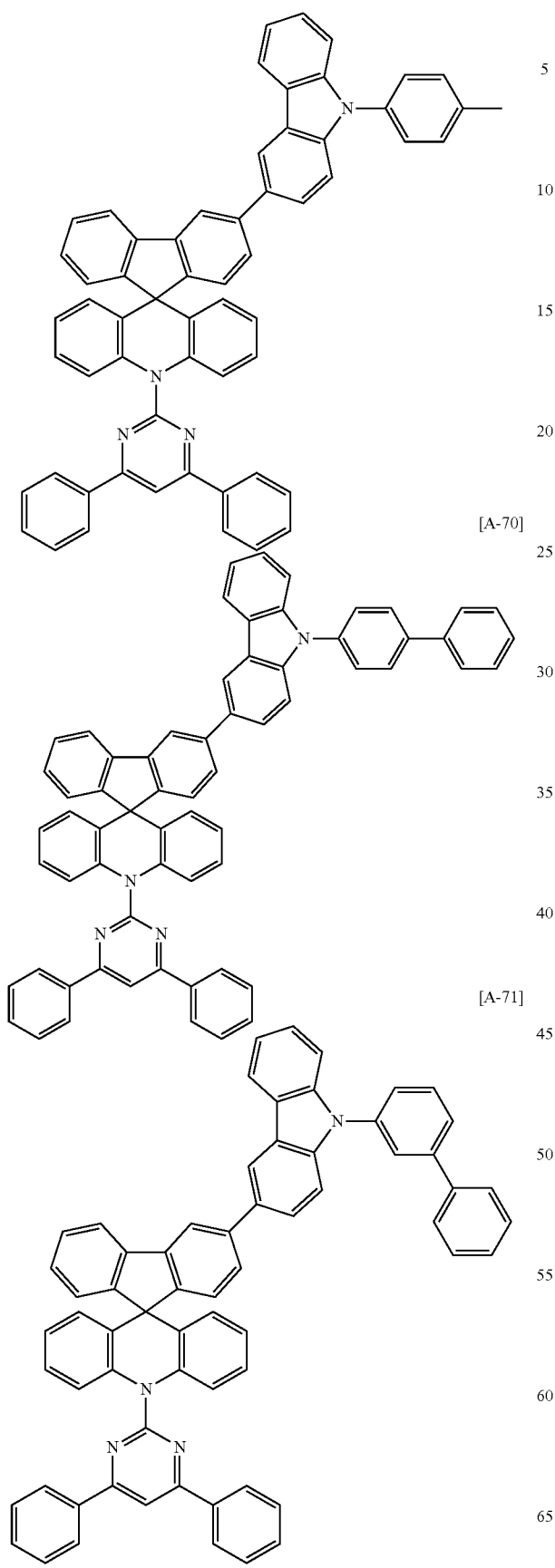
[A-72]
[A-73]
[A-74]
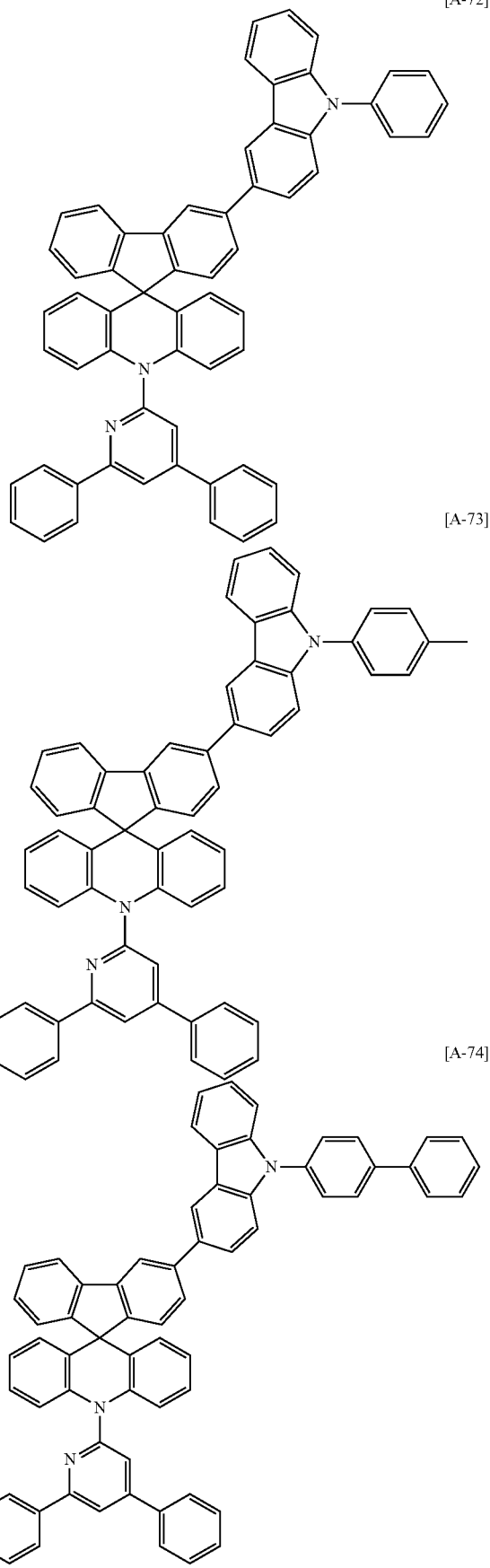

[A-75]
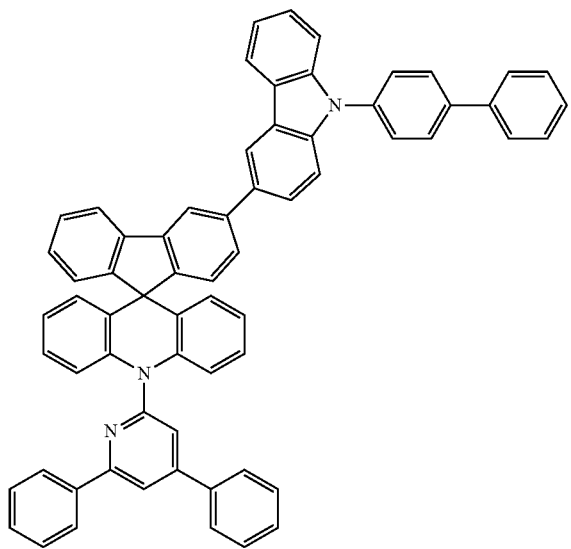
[A-76]
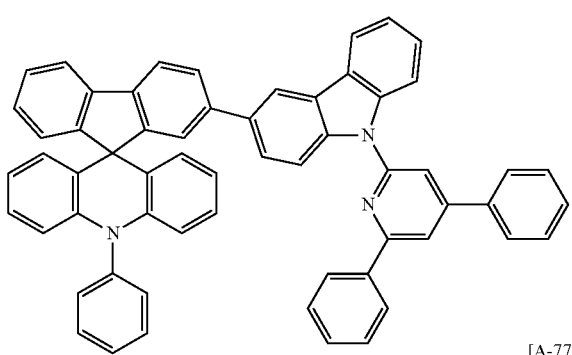
[A-77]
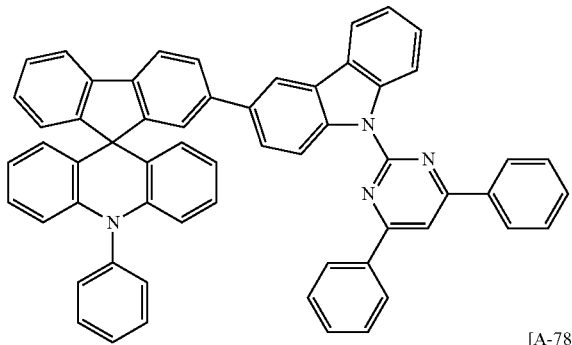
[A-78]
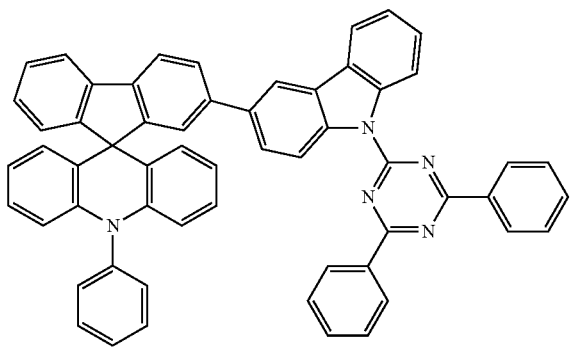
[A-79]
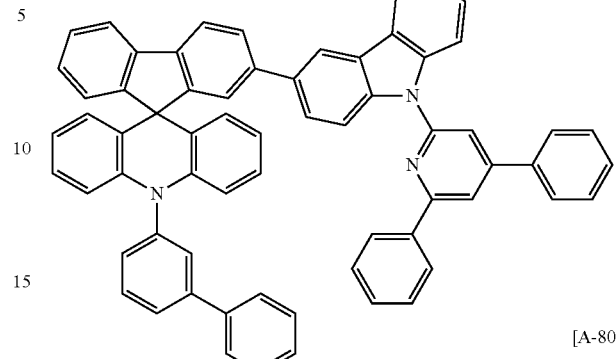
[A-80]
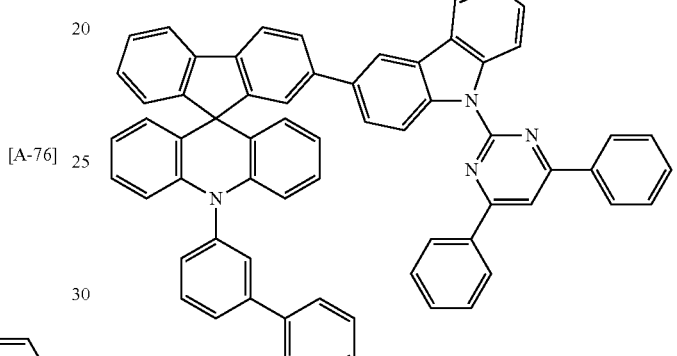
[A-81]
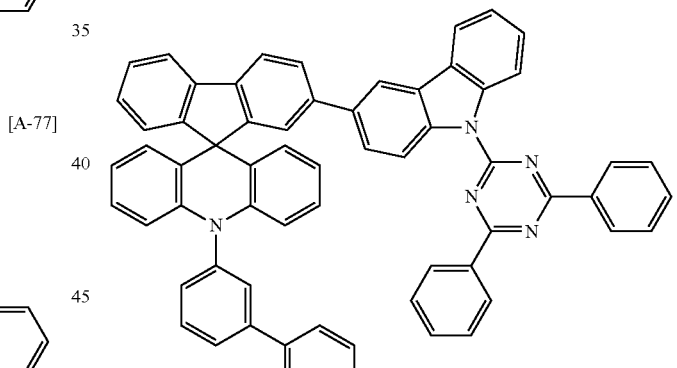
[A-82]
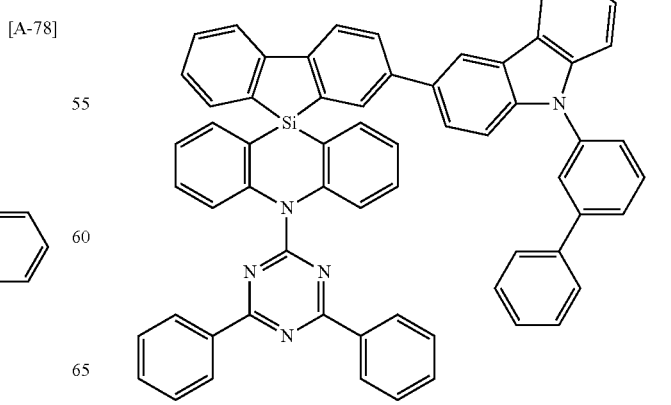

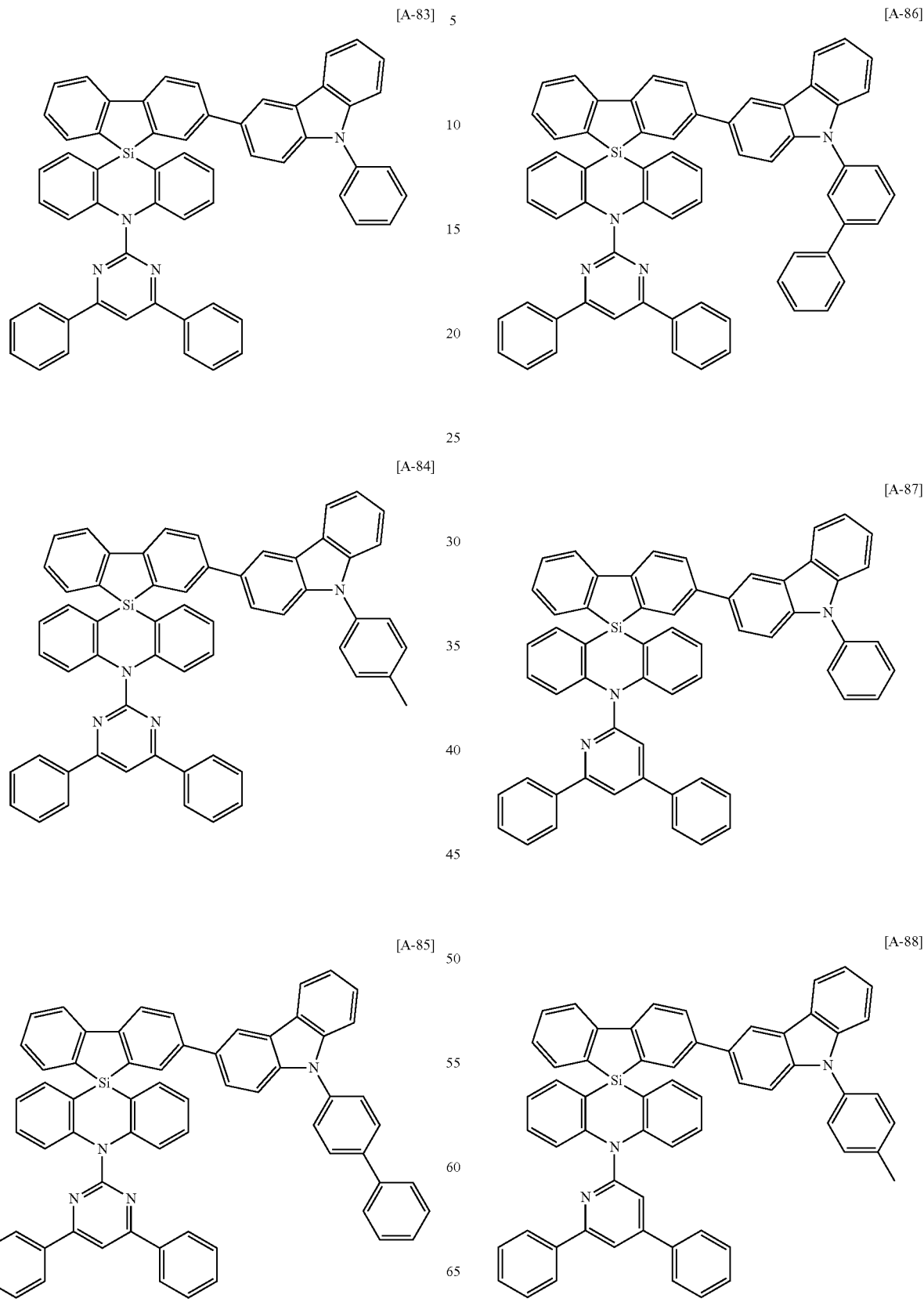

[A-89]
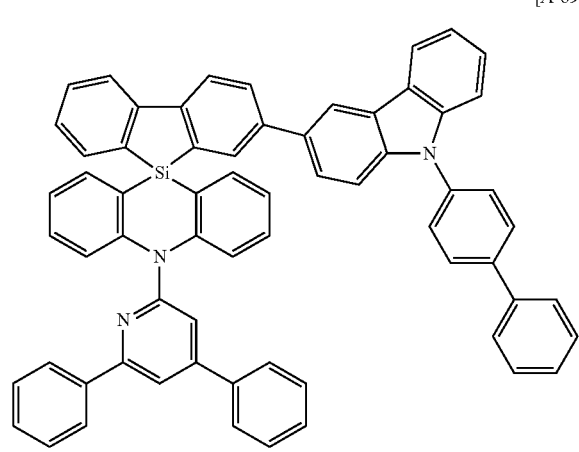
[A-92]
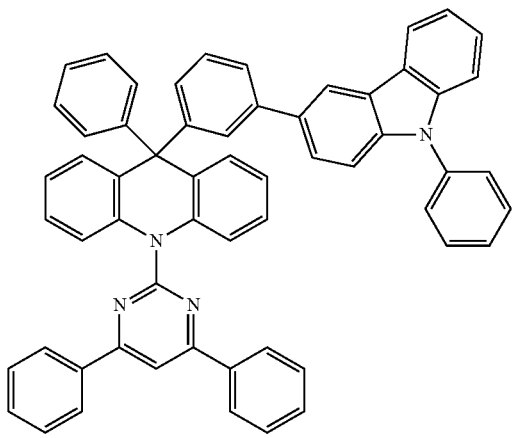
[A-90]
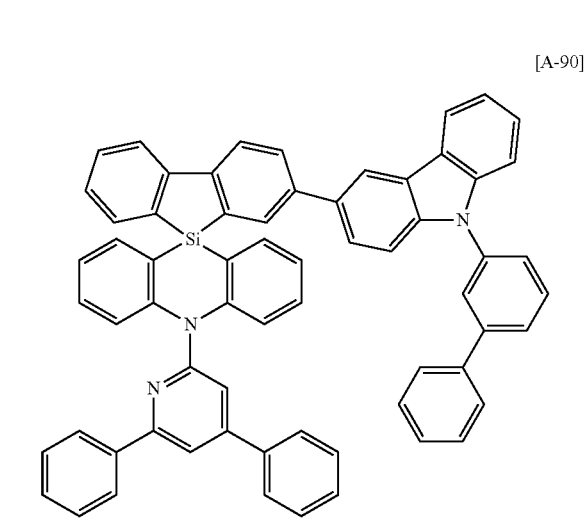
[A-93]
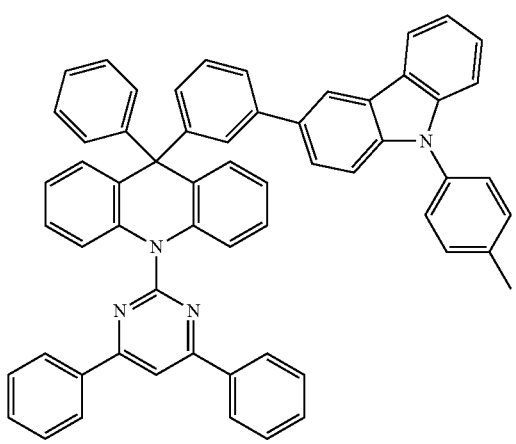
[A-91]
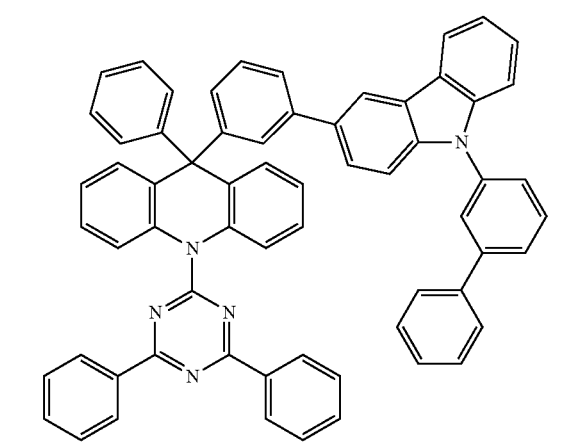
[A-94]
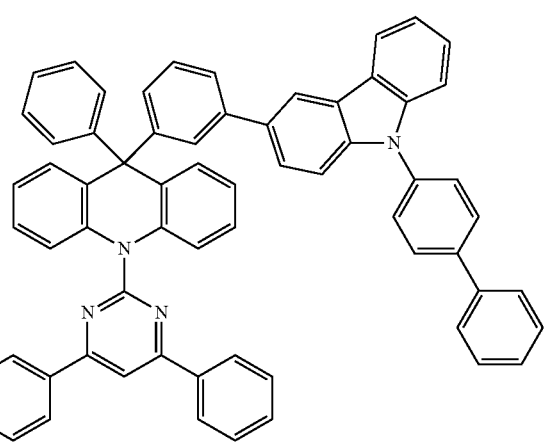

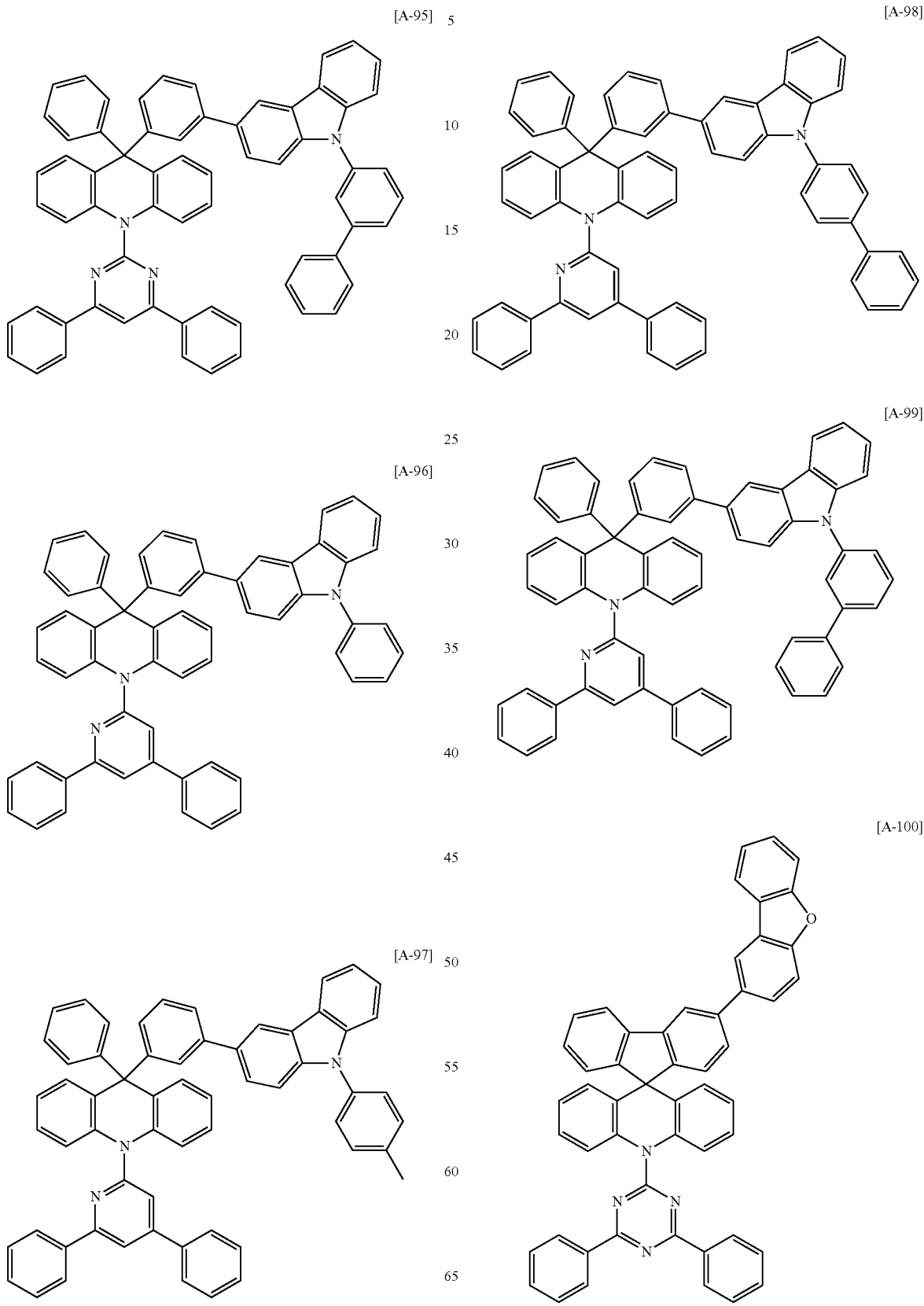

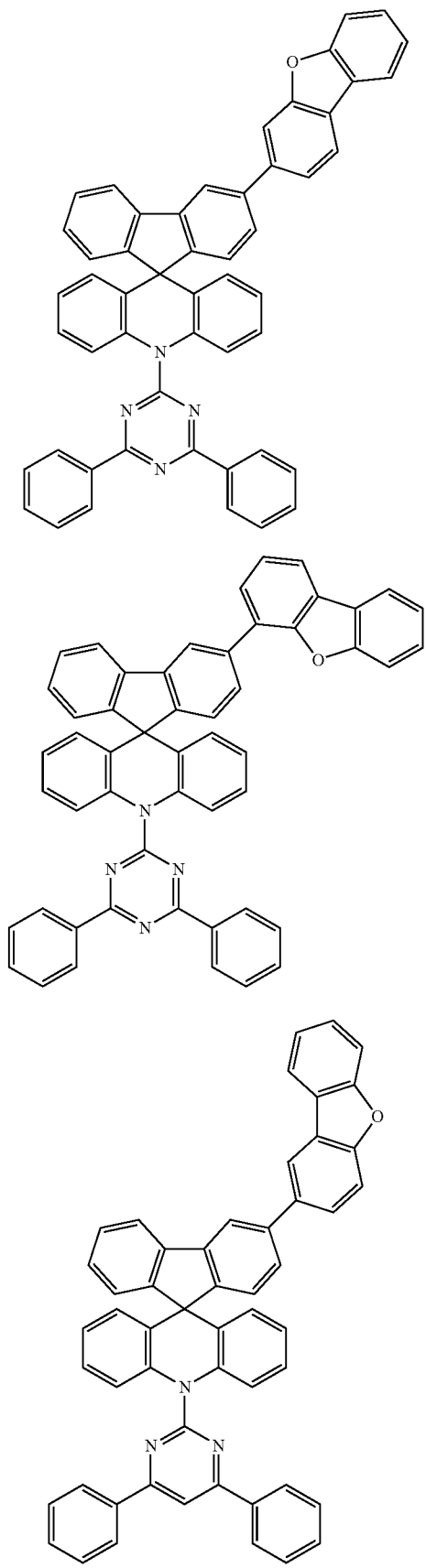
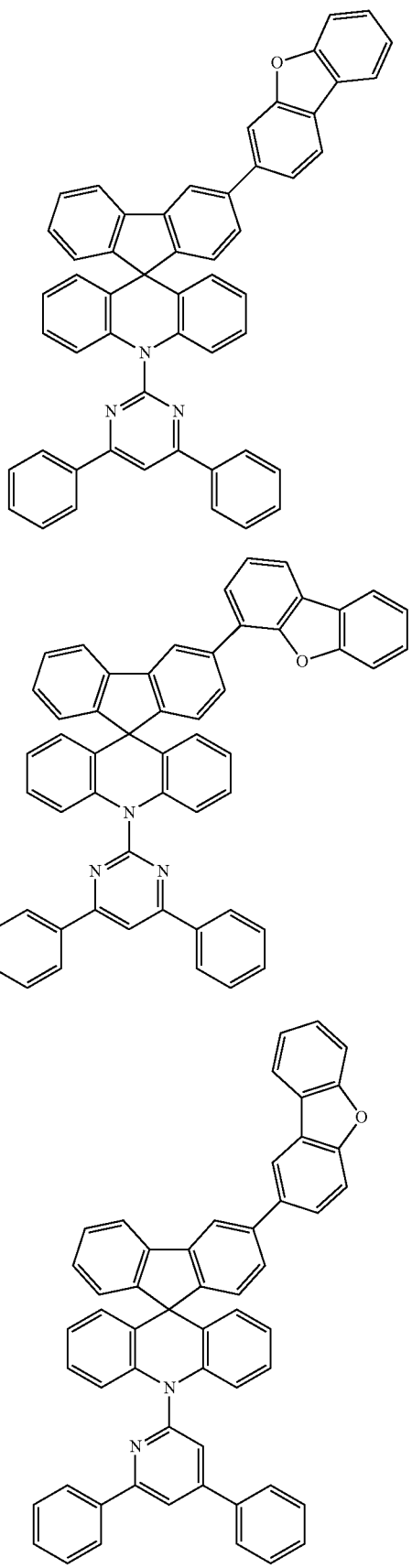

[A-107]
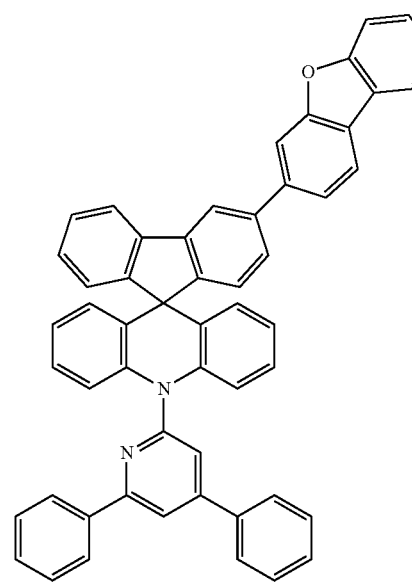
[A-110]
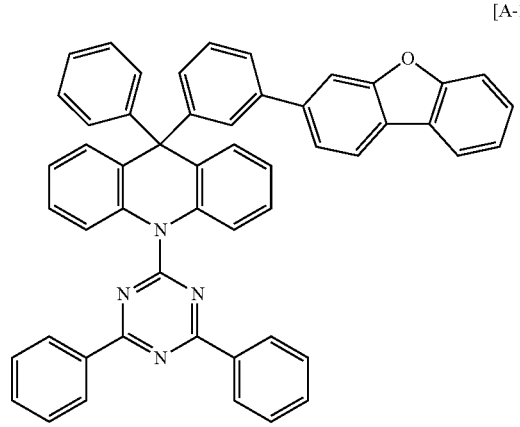
[A-108]
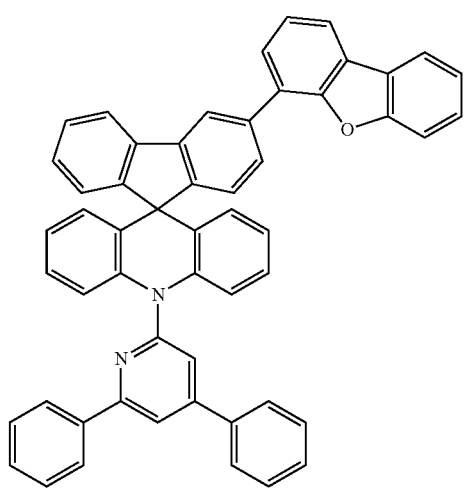
[A-111]
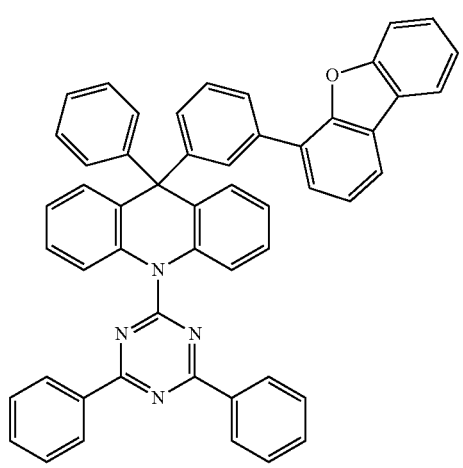
[A-109]
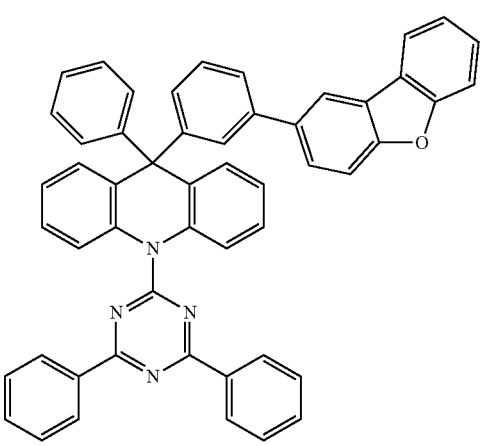
[A-112]
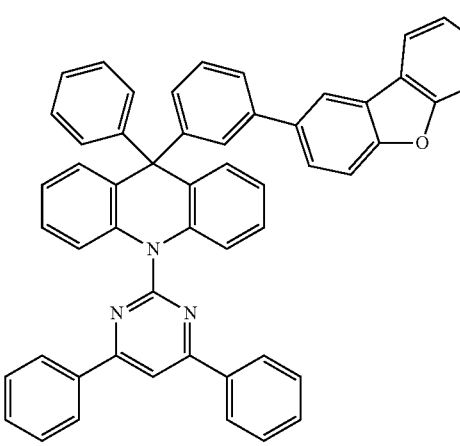

[A-113]
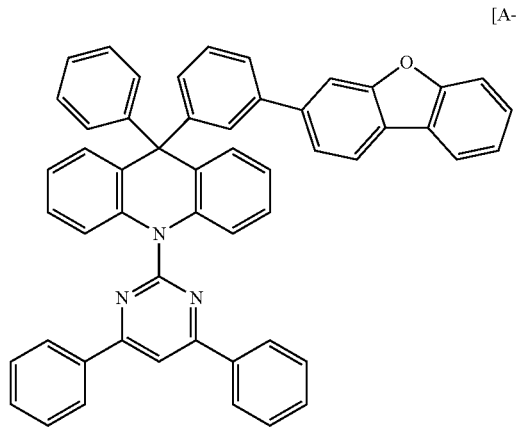
[A-114]
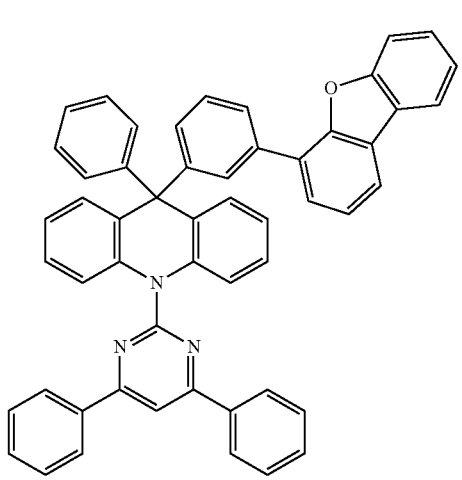
[A-115]
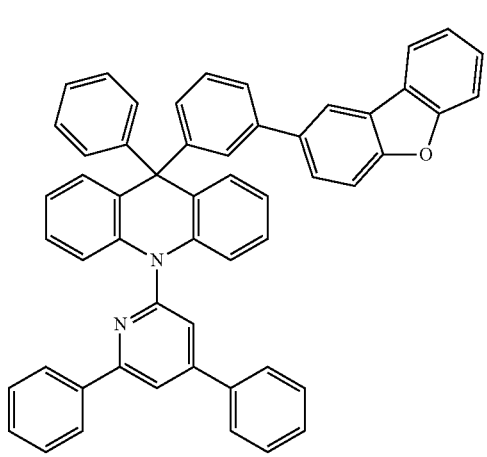
[A-116]
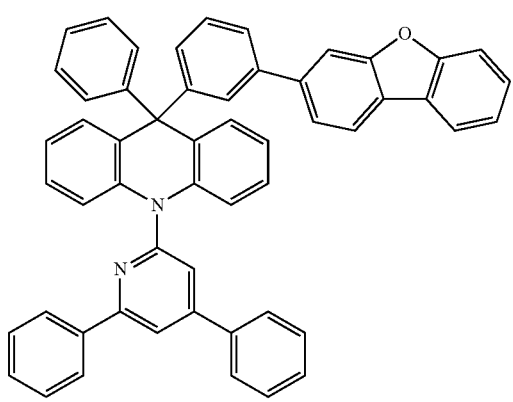
[A-117]
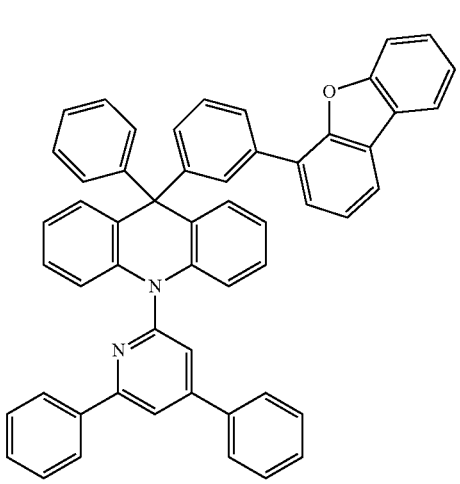
[B-1]
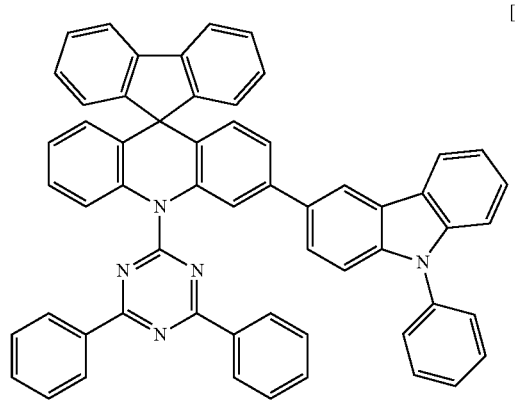

[B-2]
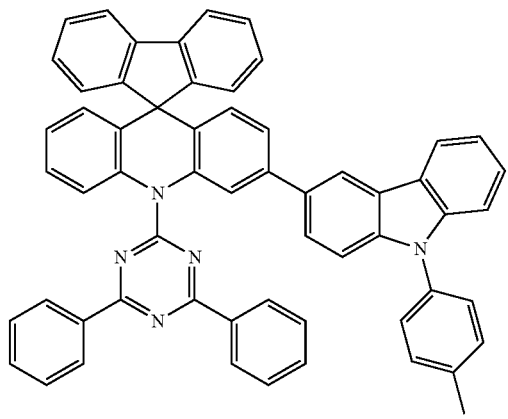
[B-3]
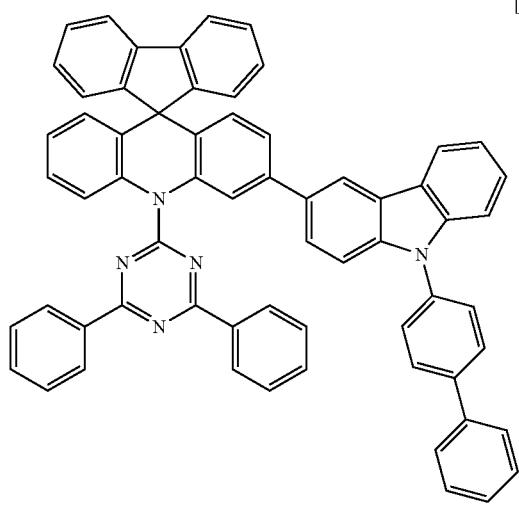
[B-4]
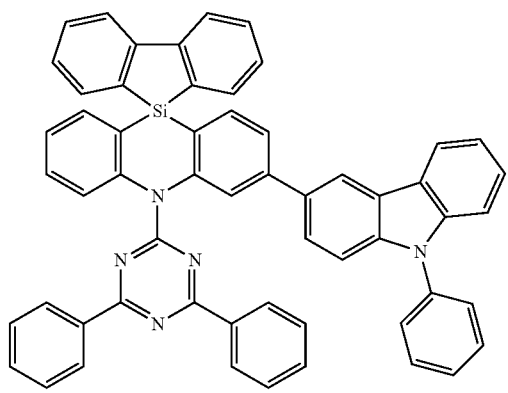
[B-5]
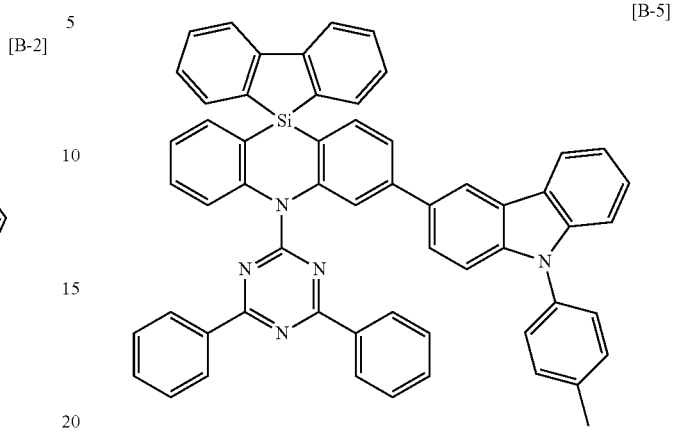
[B-6]
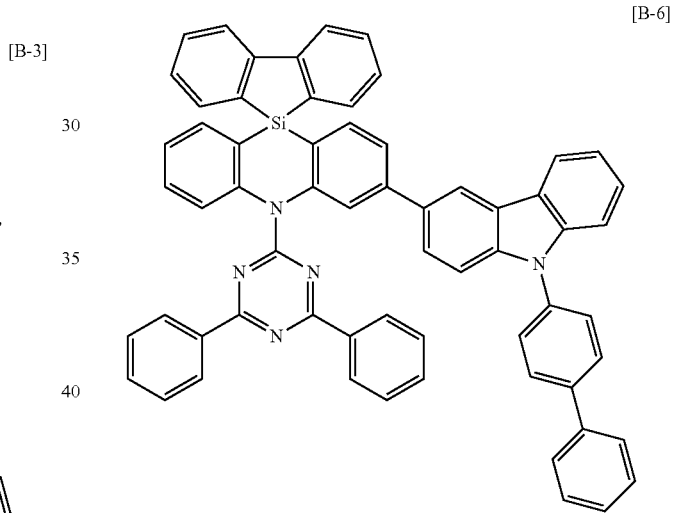
[B-7]
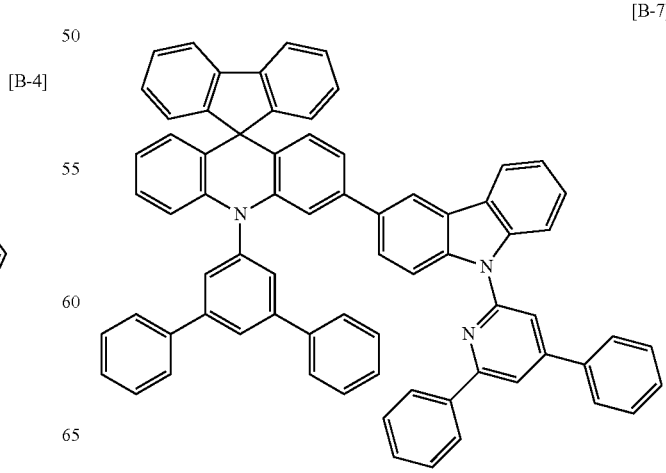

-continued
[B-8] 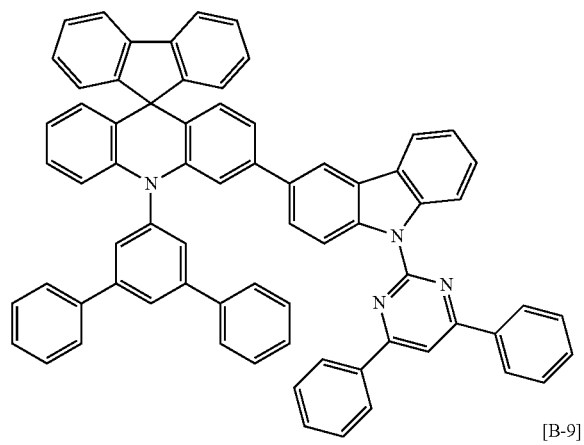
[B-9] 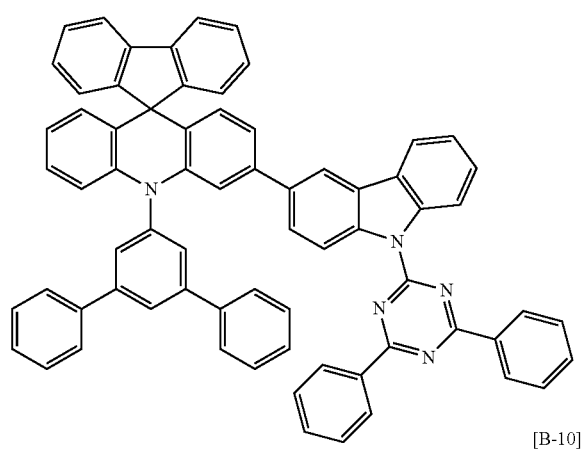
[B-10] 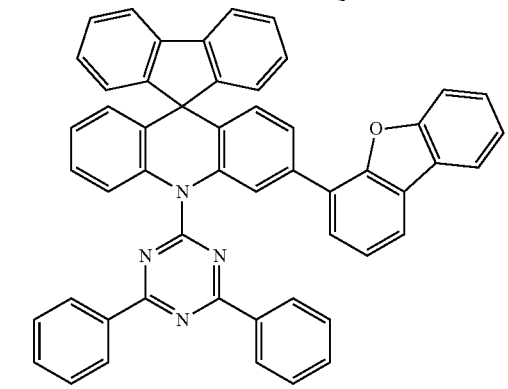
[B-11] 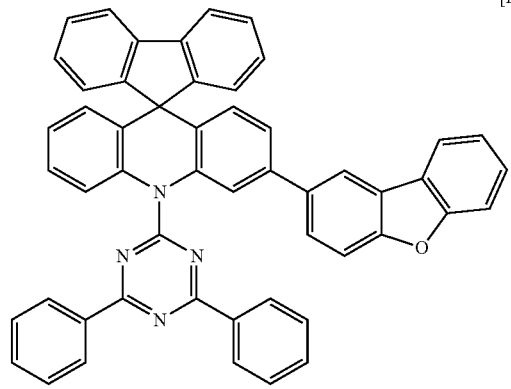
-continued
[B-12] 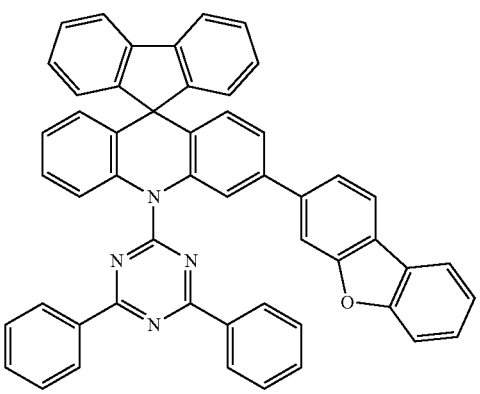
[B-13] 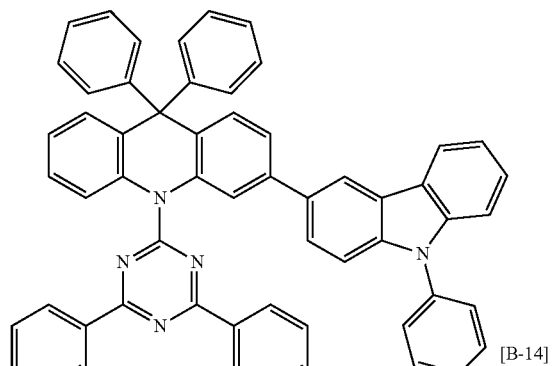
[B-14] 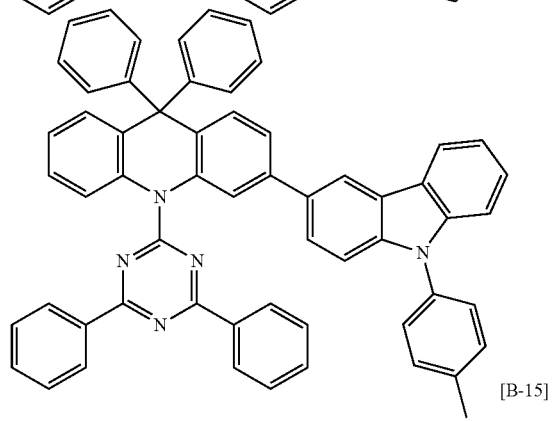
[B-15] 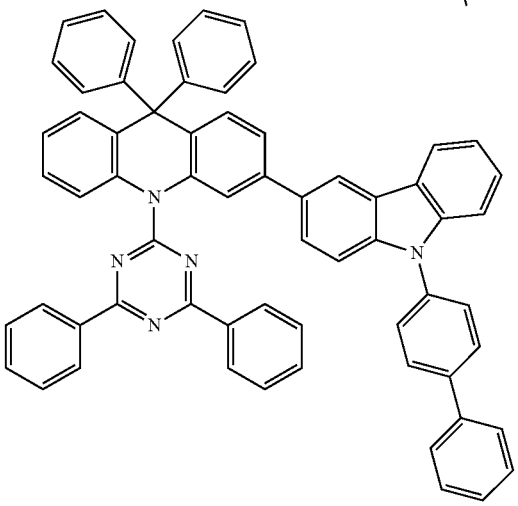

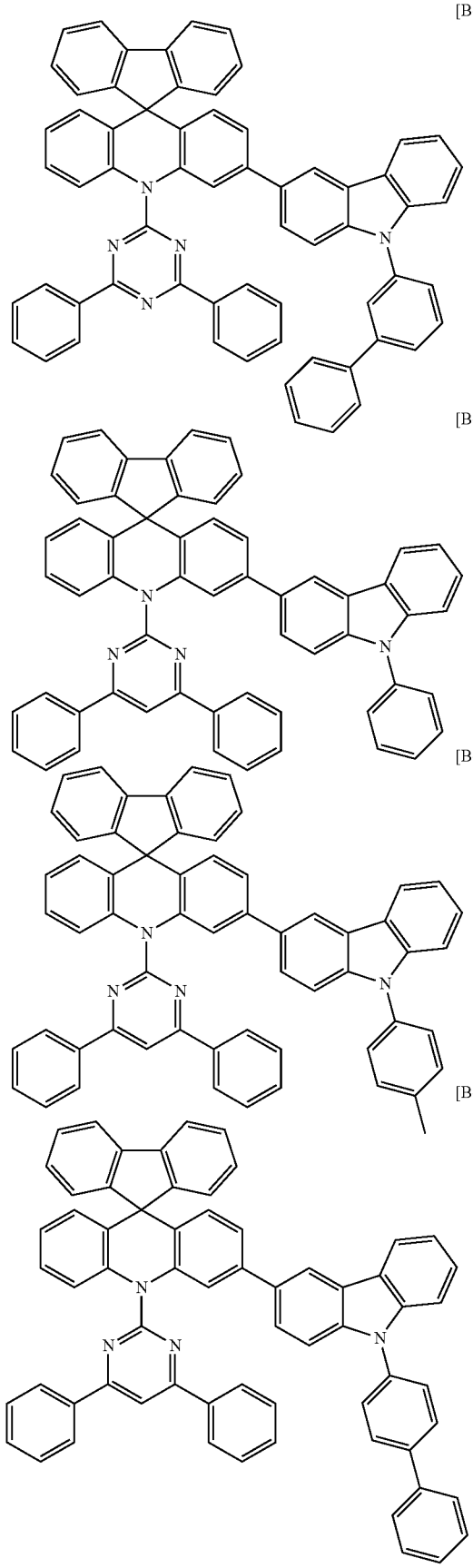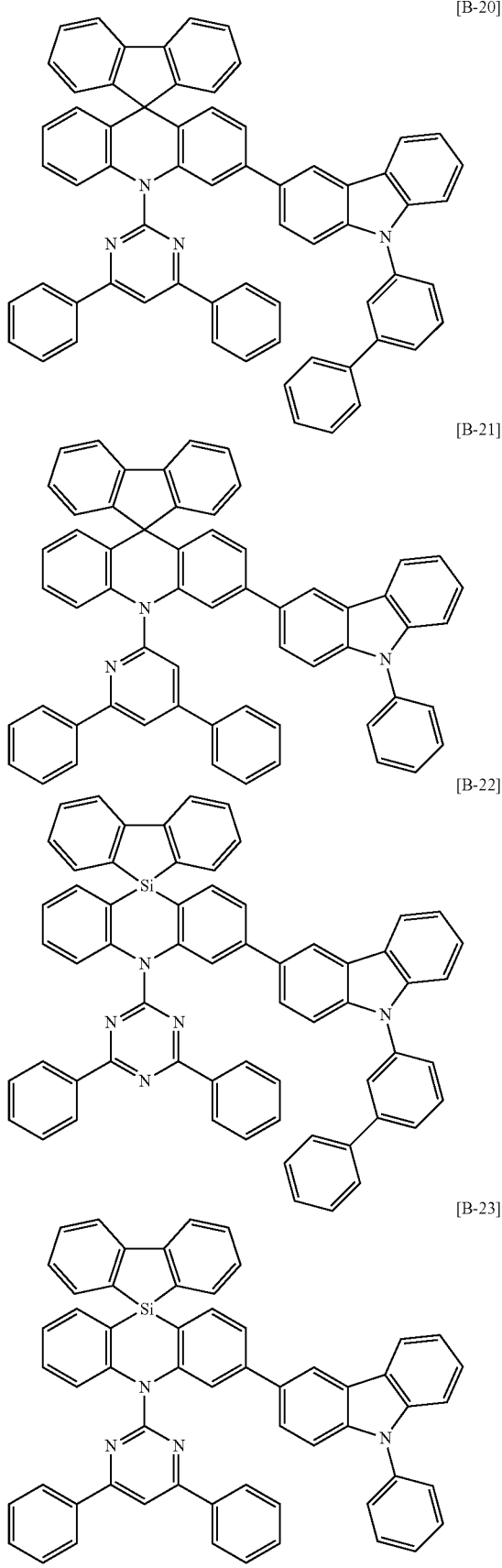

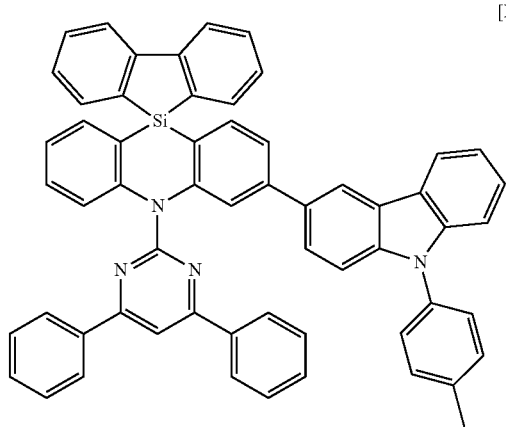
[B-24]
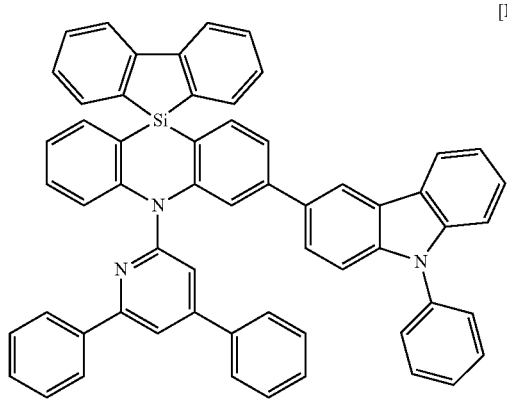
[B-27]
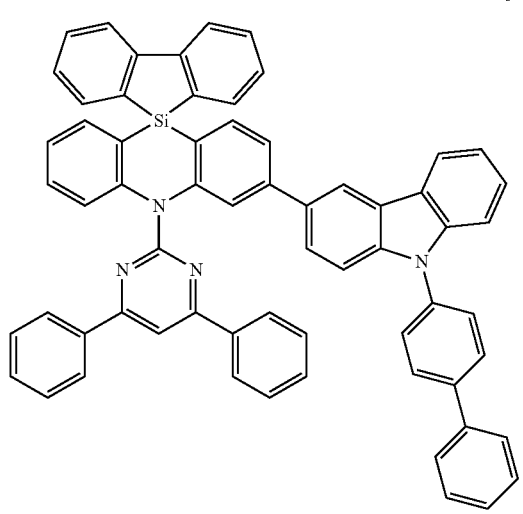
[B-25]
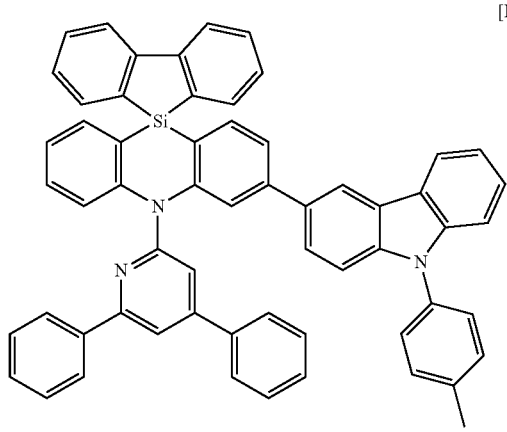
[B-28]
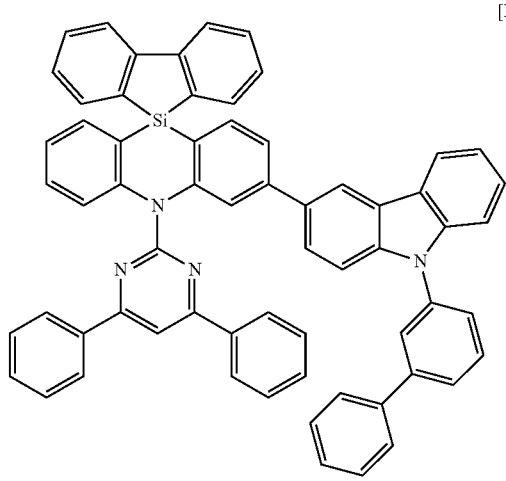
[B-26]
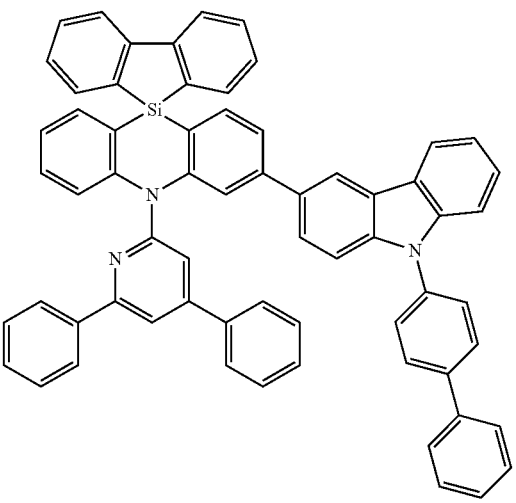
[B-29]

[B-30]
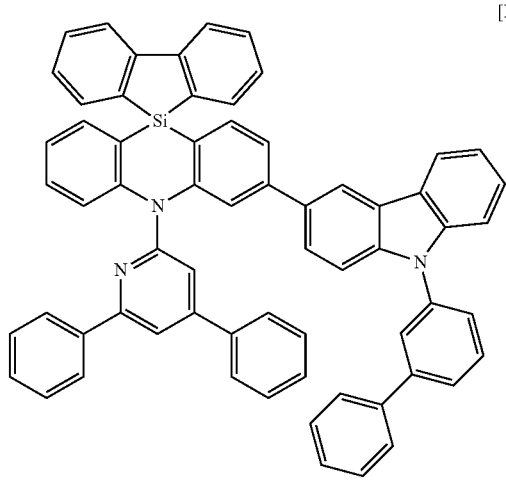
[B-31]
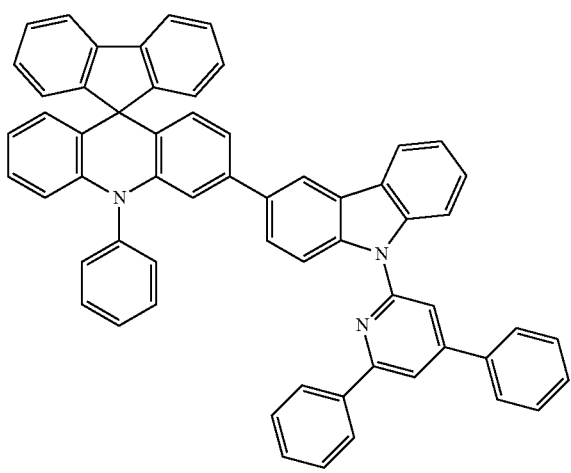
[B-32]
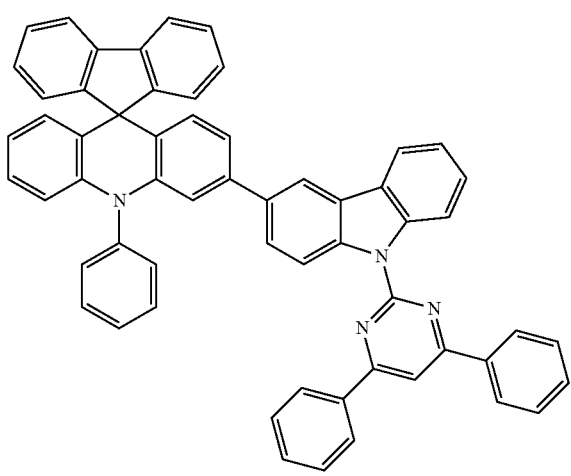
[B-33]
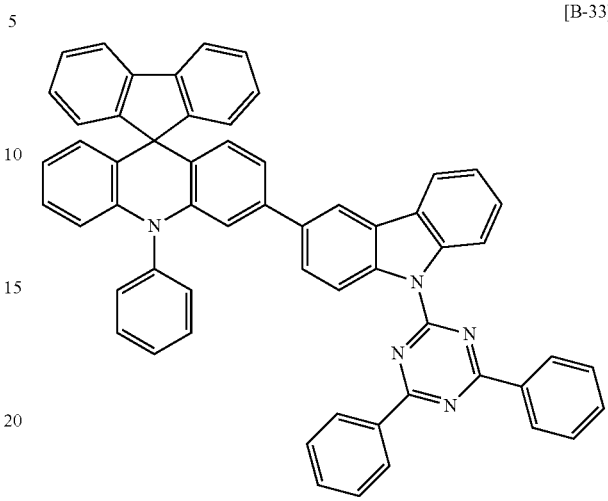
[B-34]
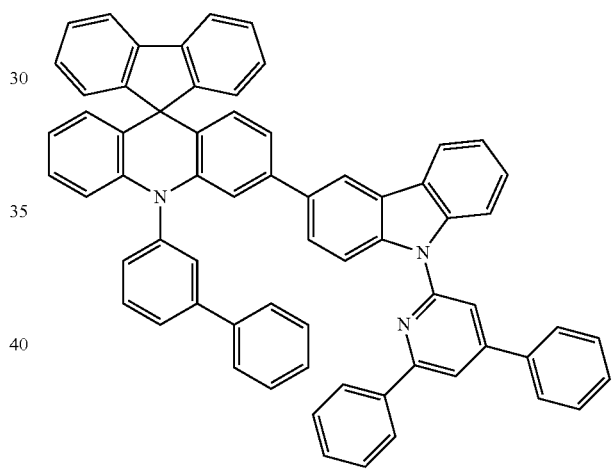
[B-35]
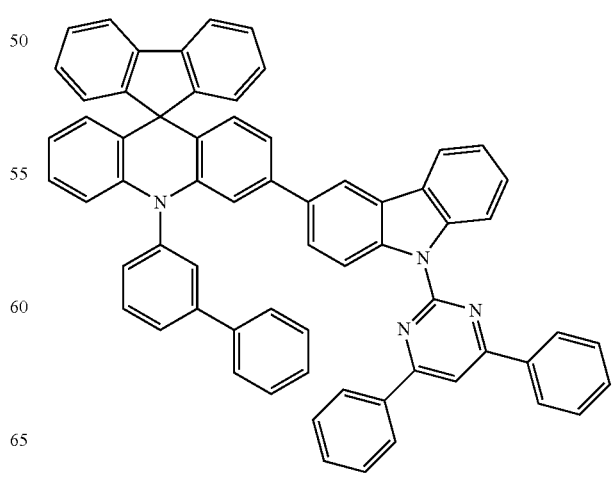

[B-36]
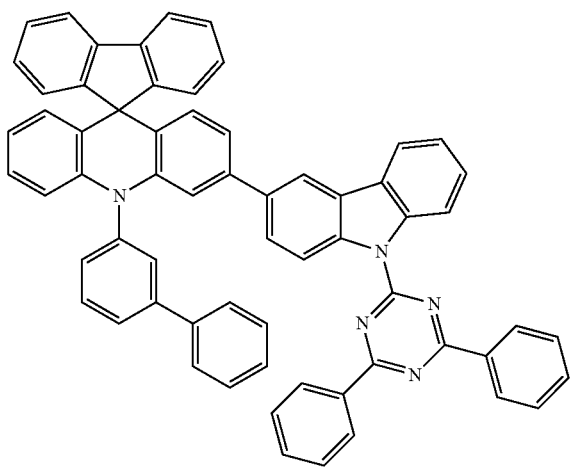
[B-37]
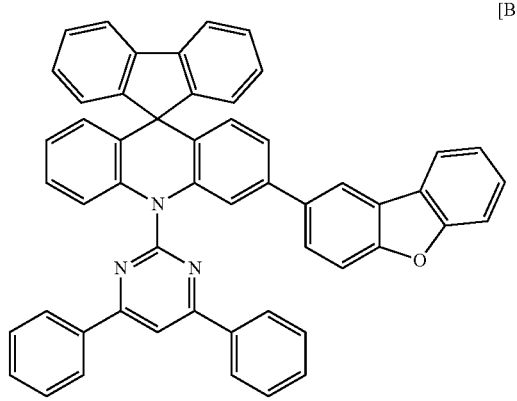
[B-38]
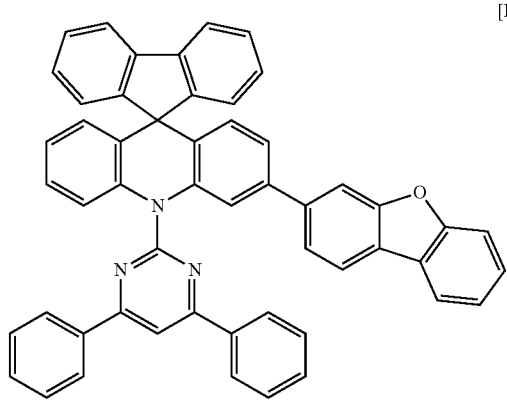
[B-39]
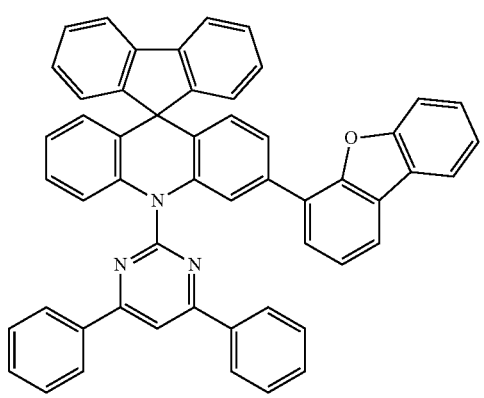
[B-40]
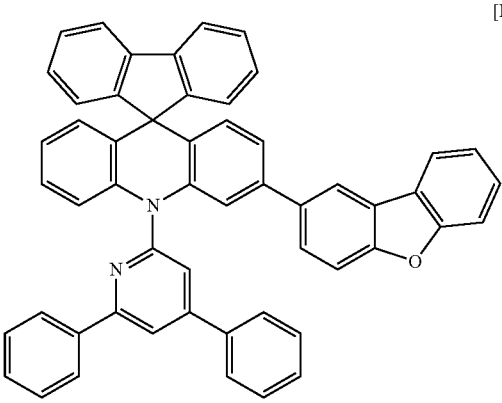
[B-41]
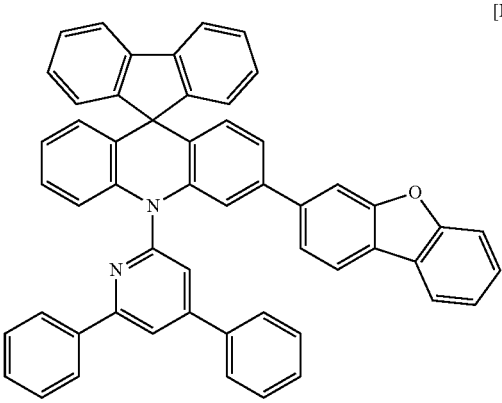
[B-42]
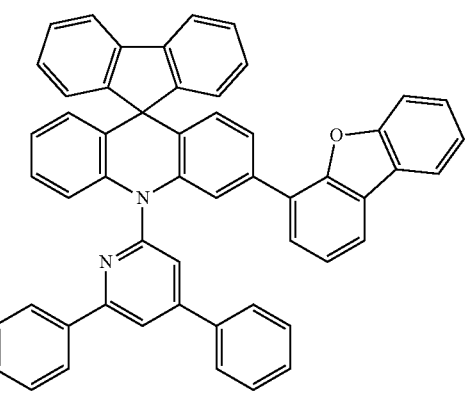
[B-43]
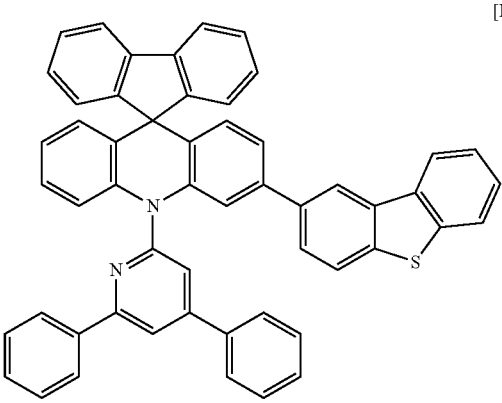

[B-44]
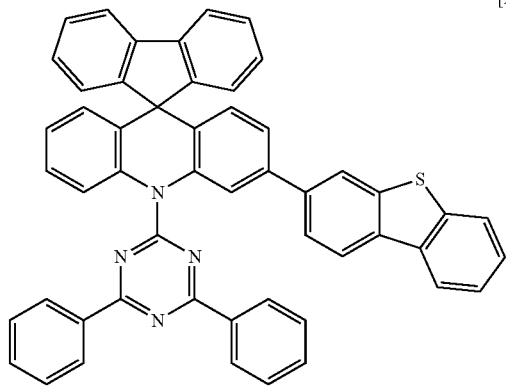
[B-45]
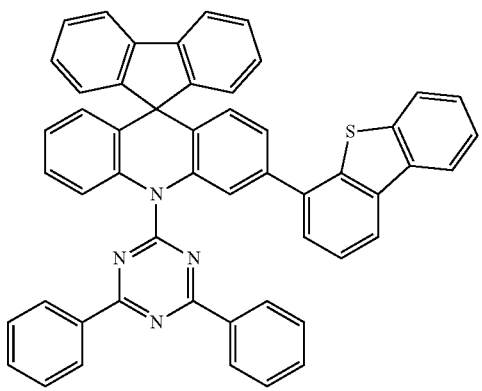
[B-46]
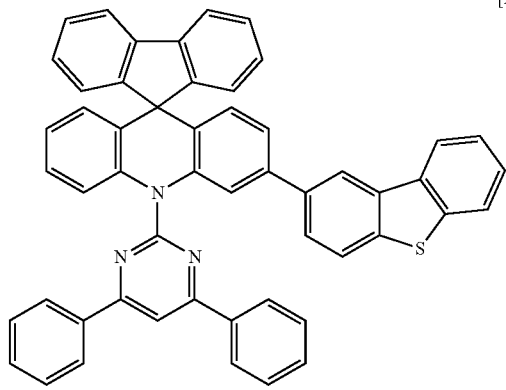
[B-47]
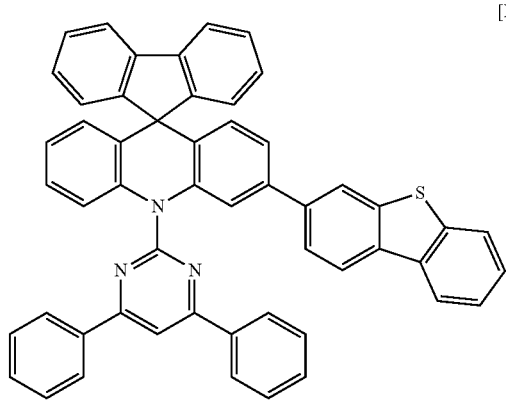
[B-48]
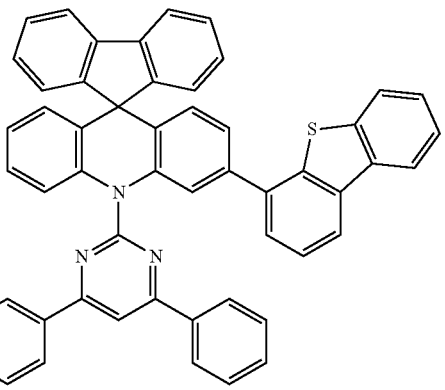
[B-49]
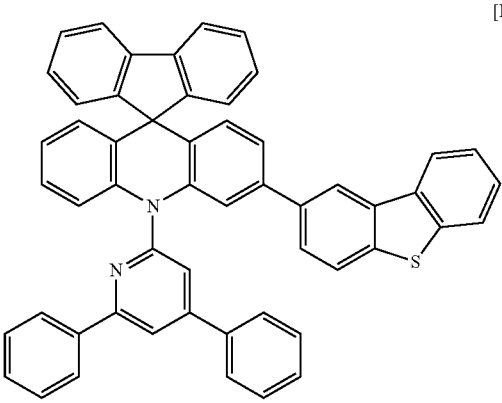
[B-50]
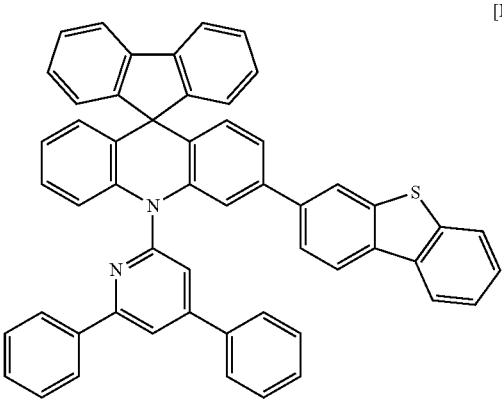
[B-51]
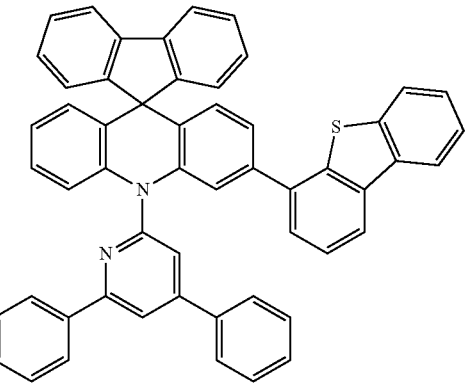

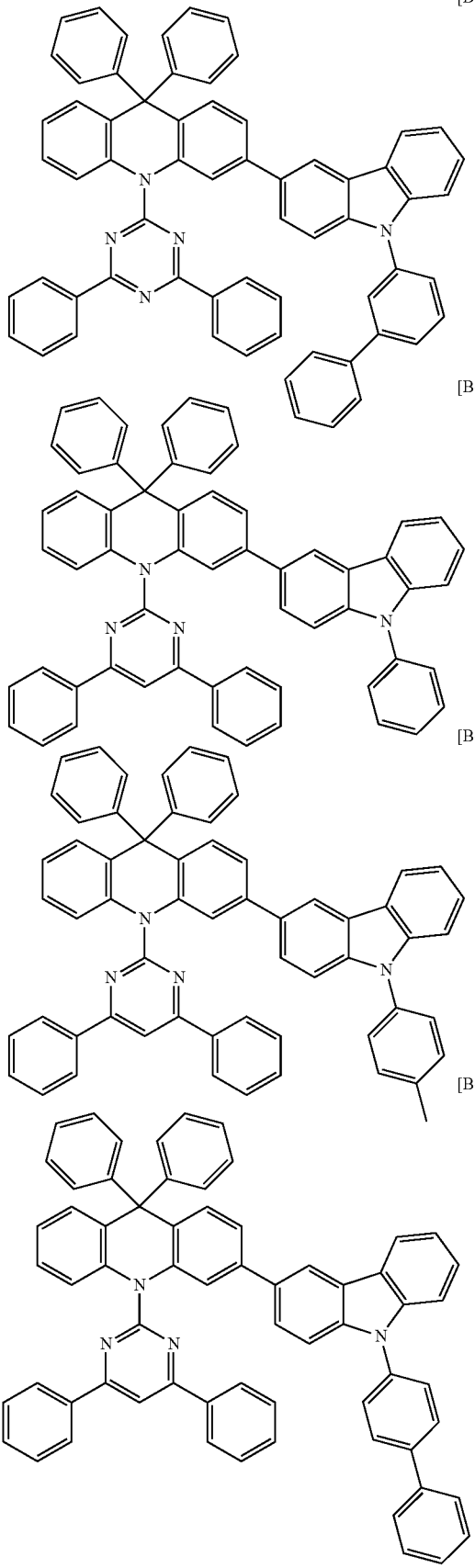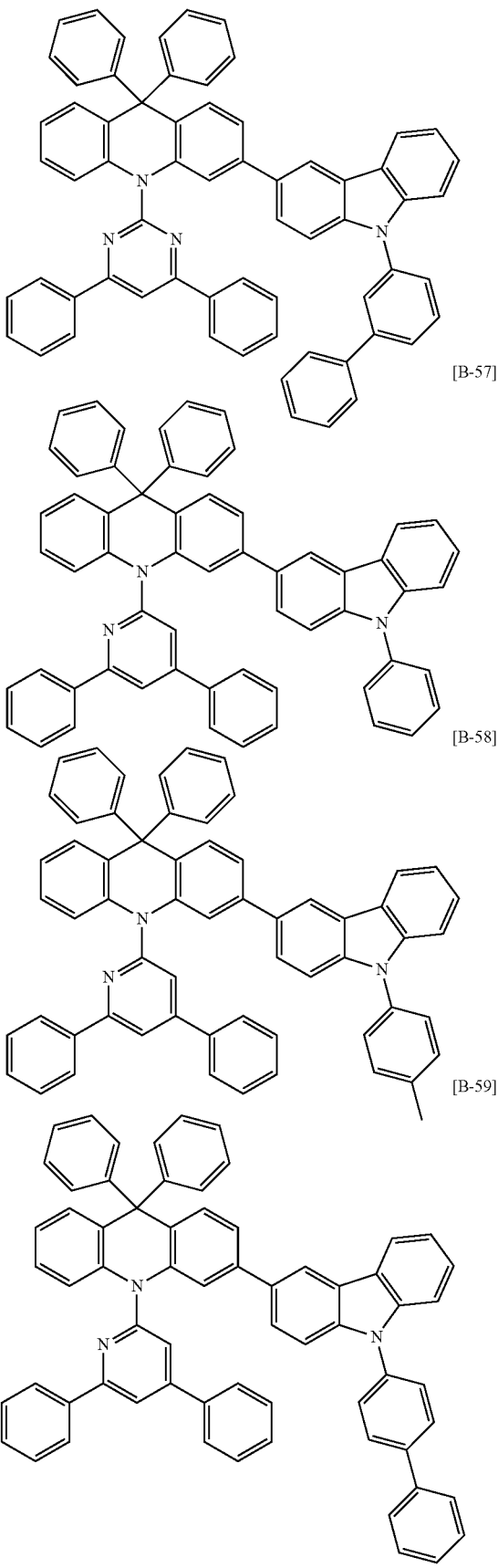

-continued

[B-60]

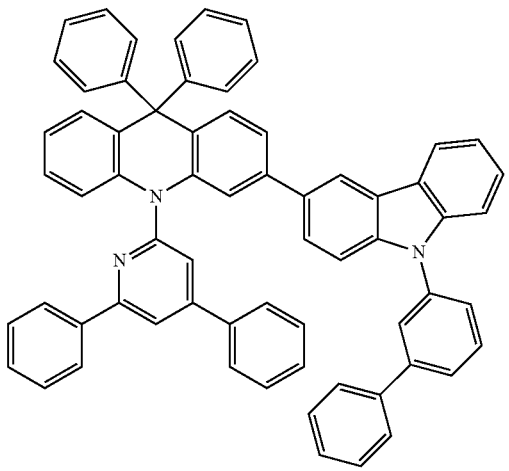

11. An organic light emitting diode, comprising:
an anode;
a cathode; and
at least one organic thin layer between the anode and cathode,
wherein the at least one organic thin layer includes the compound for an organic optoelectronic device as claimed in claim 1.

12. The organic light emitting diode as claimed in claim 11, wherein the at least one organic thin layer includes an emission layer, a hole transport layer (HTL), a hole injection layer (HIL), an electron transport layer (ETL), an electron injection layer (EIL), a hole blocking layer, or a combination thereof.

13. The organic light emitting diode as claimed in claim 11, wherein:
the at least one organic thin layer includes an emission layer, and
the compound is included in the emission layer.

14. A display device comprising the organic light emitting diode as claimed in claim 11.

* * * * *